(12) United States Patent
Mok et al.

(10) Patent No.: US 12,701,876 B2
(45) Date of Patent: Aug. 4, 2026

(54) DISPLAY DEVICE

(71) Applicant: Samsung Display Co., Ltd., Yongin-Si (KR)

(72) Inventors: Seon Kyoon Mok, Yongin-si (KR); Sung Chan Hwang, Yongin-si (KR); Chul Kyu Kang, Yongin-si (KR); Dong Hyun Kim, Yongin-si (KR); Su Jin Kim, Yongin-si (KR); Seon I Jeong, Yongin-si (KR); Chae Han Hyun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 387 days.

(21) Appl. No.: 18/238,529

(22) Filed: Aug. 28, 2023

(65) Prior Publication Data

US 2024/0224642 A1 Jul. 4, 2024

(30) Foreign Application Priority Data

Dec. 29, 2022 (KR) ........................ 10-2022-0188135

(51) Int. Cl.
H10K 59/131 (2023.01)
(52) U.S. Cl.
CPC .................................. H10K 59/131 (2023.02)
(58) Field of Classification Search
CPC .................................................... H10K 59/131
See application file for complete search history.

(56) References Cited

U.S. PATENT DOCUMENTS

| | | |
|---|---|---|
| 9,147,723 B1 | 9/2015 | Lee et al. |
| 10,038,049 B2 | 7/2018 | Gang et al. |
| 10,162,228 B2 | 12/2018 | Lim et al. |
| 11,094,768 B2 | 8/2021 | Shim et al. |
| 11,764,228 B2 | 9/2023 | Lee |
| 2022/0158139 A1* | 5/2022 | Kim ...................... G09F 9/3026 |
| 2024/0057383 A1 | 2/2024 | Min et al. |

FOREIGN PATENT DOCUMENTS

| | | |
|---|---|---|
| KR | 10-2012-0048588 A | 5/2012 |
| KR | 10-2018-0014381 A | 2/2018 |
| KR | 10-2019-0131254 A | 11/2019 |
| KR | 10-2102155 B1 | 5/2020 |
| KR | 10-2183494 B1 | 11/2020 |
| KR | 10-2021-0016108 A | 2/2021 |
| KR | 10-2022-0100771 A | 7/2022 |
| KR | 10-2022-0105210 A | 7/2022 |
| KR | 10-2024-0021365 A | 2/2024 |

OTHER PUBLICATIONS

PCT/KR2023/021127, PCT—Search-Report dated on Apr. 2, 2024, 4 pages.

* cited by examiner

*Primary Examiner* — Robert J Michaud
(74) *Attorney, Agent, or Firm* — Innovation Counsel LLP

(57) ABSTRACT

The present disclosure relates to a display device. According to an embodiment of the disclosure, a display device including a first pixel which includes a first gate node including a first vertical portion and a first horizontal portion, and a first pixel electrode, and a second pixel which includes a second gate node including a second vertical portion and a second horizontal portion, and a second pixel electrode, wherein at least a part of each of the first horizontal portion and the second horizontal portion is disposed between facing surfaces of the first pixel electrode and the second pixel electrode so as not to overlap the first and second pixel electrodes.

42 Claims, 60 Drawing Sheets

UPX1     PX11  PE11  PX13  PE13     PX21  PE21  PX23  PE23  UPX2

HP12
R
HP13
HP21  R  HP22
HP23

HP11
B
PE23
PX23

GN11

VP11
VP12
B
VP22
B
PX23

G
VP13
VP21  G
VP23

PE12
PX12

PE22
PX22

PX31
PE31

PX41
PE41

HP32
R
HP33
HP41  R  HP42
HP43

HP31
B
B

VP31
VP32
B
VP42
B
PX43
PE43

G
VP33
VP41  G
VP43

UPX3     PX32  PE32  PX33  PE33     PX42  PE42  PX41  PE41  UPX4

DR2
↑
⊙—→ DR1
DR3

GN12: HP12, VP12     GN32: HP32, VP32
GN13: HP13, VP13     GN33: HP33, VP33
GN21: HP21, VP21     GN41: HP41, VP41
GN22: HP22, VP23     GN42: HP42, VP42
GN23: HP23, VP23     GN43: HP43, VP43
GN31: HP31, VP31

HP22

UPX2

VRLa
GRL

VP21
HP21
VP22
VP21

GWL
VP23
HP23
C1a

VP22

VP23

GIL
EML
VIL1a
VIL2a

UPX4

VDLa
VRLa
GRL

GWL
VP42
VP41
HP41

VP43
HP43
HP42

VP41

VP43

VP42

GIL
EML
VIL1a
VIL2a
VDLa

DR2
DR3  DR1

VDLb          DL5  DL6        VSL
VIL2b

VDLb HP12 VRLb HP13 DL4 VDLb VILb
DL1 VP12 DL2 DL3 VSL VP13 DL5 DL6 VSL

PCE
VP11
HP11
VP11
VP12
C2b
VP13
GCEb

C2b

PCE

C2b
GCE3

GCE2

GCE1

GCE4
GCE5

ACT2   CT44        VP42 HP42

PE41

EA
T413
GE3
GE2
T412
CT41
VP41
HP41
ACT1
C1a
VP41 CT42
C1b,C2a
GCE1
CT43
VII
T411 VP41
GE1
Gb
EA
PE42
C2b
GE4
T414
GE5
T415

VI
VIII
X

VI'
VIII'
XI
VII'
IX
IX'
XI'

VIL1a
VIL2a
VDLa
VRLa
GRL
EA
CT47
GWL
VP43
HP43
PE43
CT48
VP43
CT49
VP42

GIL
EML
VIL1a
VIL2a
VDLa

DL4        CT50 VDLb  CT45        DL5 VILb DL6              VSL
                        CT46

| 11G | Comparative Object Invention | Present Disclosure | |
| --- | --- | --- | --- |
| | | First Embodiment | Second Embodiment |
| WHITE | 100 % | 100 % | 100 % |
| RED | 50 % | 70 % | 70 % |
| GREEN | 47 % | 53 % | 71 % |
| BLUE | 83 % | 88 % | 88 % |

DISPLAY DEVICE

CROSS-REFERENCE TO RELATED APPLICATION

This application claims priority to Korean Patent Application No. 10-2022-0188135 filed on Dec. 29, 2022, in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device, and more particularly, to a display device capable of improving image quality by reducing a parasitic capacitance between adjacent unit pixels.

2. Description of the Related Art

An organic light emitting display device includes a display element of which luminance is changed by current, for example, an organic light emitting diode.

Such an organic light emitting display device includes a plurality of pixels providing light of different colors.

Meanwhile, in accordance with a conventional organic light emitting display device, due to a parasitic capacitance between a specific node of one unit pixel and a pixel electrode of another unit pixel adjacent thereto, when only one of the pixels included in one unit pixel emits light (or is turned on), the luminance of the pixel is considerably reduced compared to white light (that is, light obtained when all pixels of one unit pixel emit light). Accordingly, image quality deterioration such as gray crushing and panel stains may occur.

SUMMARY

Aspects of the present disclosure provide a display device capable of improving image quality by reducing a parasitic capacitance between adjacent unit pixels.

The objects of the present disclosure are not limited to those mentioned above and additional objects of the present disclosure, which are not mentioned herein, will be clearly understood by those skilled in the art from the following description of the present disclosure.

According to an embodiment of the disclosure, a display device comprising: first and second data lines extending along a first direction; a first gate node connected to the first data line and comprising a first vertical portion comprising a first gate electrode of a first driving transistor and a first horizontal portion connected to the first vertical portion; a first pixel electrode connected to the first driving transistor; a second pixel electrode disposed adjacent to the first pixel electrode in the first direction; and a second gate node connected to the second data line and comprising a second vertical portion comprising a second gate electrode of a second driving transistor and a second horizontal portion connected to the second vertical portion, wherein the first horizontal portion and the second horizontal portion each extend in a second direction crossing the first direction, and at least a part of the first horizontal portion and at least a part of the second horizontal portion are disposed between the first pixel electrode and the second pixel electrode (not to overlap the first pixel electrode and the second pixel electrode In an embodiment, the first horizontal portion and the second horizontal portion are disposed to be spaced apart from the first pixel electrode and the second pixel electrode.

In an embodiment, a first light emitting element comprising the first pixel electrode and a second light emitting element comprising the second pixel electrode provide lights of the same wavelength.

In an embodiment, a first pixel comprising the first pixel electrode and a second pixel comprising the second pixel electrode are connected to the first data line.

In an embodiment, further comprising: a third data line extending in the first direction; a third gate node connected to the third data line and comprising a third vertical portion comprising a third gate electrode of a third driving transistor and a third horizontal portion connected to the third vertical portion; a third pixel electrode connected to the third driving transistor; and a fourth pixel electrode disposed adjacent to the third pixel electrode in the first direction, wherein the third horizontal portion extends in the second direction.

In an embodiment, at least a part of the third horizontal portion is disposed between the third pixel electrode and the fourth pixel electrode not to overlap the third pixel electrode and the fourth pixel electrode.

In an embodiment, the third horizontal portion is disposed to be spaced apart from the third pixel electrode and the fourth pixel electrode.

In an embodiment, at least a part of the second vertical portion is disposed between the first pixel electrode and the third pixel electrode.

In an embodiment, the first pixel electrode disposed adjacent to the second vertical portion has a recessed portion having a width along the second direction less than that of another portion which is not recessed.

In an embodiment, the second vertical portion is disposed between the third pixel electrode and the first pixel electrode in an area corresponding to the recessed portion.

In an embodiment, the recessed portion has a round corner.

In an embodiment, the first pixel electrode and the third pixel electrode are included in a first unit pixel and the second pixel electrode and the fourth pixel electrode are included in a second unit pixel.

In an embodiment, a distance between a first pixel electrode and a second pixel electrode in a first column is different from a distance between a first pixel electrode and a second pixel electrode in a second column.

In an embodiment, an overlapping area between the first pixel electrode and the second pixel electrode in the first column and the first gate node in the first column is different from an overlapping area between the first pixel electrode and the second pixel electrode in the second column and the first gate node in the second column.

In an embodiment, a distance between a first pixel electrode and a second pixel electrode in a first column is equal to a distance between the first pixel electrode and the second pixel electrode in a second column.

In an embodiment, an overlapping area between the first pixel electrode and the second pixel electrode in the first column and the first gate node in the first column is equal to an overlapping area between the first pixel electrode and the second pixel electrode in the second column and the first gate node in the second column.

In an embodiment, an overlapping area between the second pixel electrode and the second gate node in the first column is equal to an overlapping area between the second pixel electrode and the second gate node in the second column.

In an embodiment, further comprising a bank having a first emission area exposing at least a part of the first pixel electrode and a second emission area exposing at least a part of the first pixel electrode.

In an embodiment, the first emission area and the second emission area are separated from each other.

In an embodiment, the first pixel electrode comprises a slit disposed between the first emission area and the second emission area.

In an embodiment, further comprising a first transistor connected between the first gate node and the first data line.

In an embodiment, the first horizontal portion of the first gate node comprises a second electrode positioned opposite to a first electrode of the first transistor connected to the first data line.

In an embodiment, the first gate node further comprises a third vertical portion extending upward in the first direction from the first horizontal portion.

In an embodiment, the third vertical portion of the first gate node comprises a fourth electrode positioned opposite to a third electrode of a second transistor connected to a reference voltage line.

In an embodiment, a first vertical portion of the first gate node further comprises a first gate connection electrode connecting the first gate electrode to a second electrode of the first transistor.

In an embodiment, one side of the first gate connection electrode is connected to the first horizontal portion through a first contact hole of an insulating layer, and the other side of the first gate connection electrode is connected to the first gate electrode through a second contact hole of the insulating layer.

In an embodiment, the first horizontal portion is formed of a semiconductor layer.

According to an embodiment of the disclosure, a display device comprising: first and second data lines extending along a first direction; a first gate node connected to the first data line, and comprising a first vertical portion comprising a first gate electrode of a first driving transistor and a first horizontal portion extending from the first vertical portion; a first pixel electrode connected to the first driving transistor; a second gate node connected to the second data line, and comprising a second vertical portion comprising a second gate electrode of a second driving transistor and a second horizontal portion extending from the second vertical portion; and a second pixel electrode connected to the second driving transistor and disposed adjacent to the first pixel electrode in the first direction, the first horizontal portion and the second horizontal portion each extend in a second direction crossing the first direction and at least a part of the first horizontal portion and at least a part of the second horizontal portion are disposed between the first pixel electrode and the second pixel electrode not to overlap the first pixel electrode and the second pixel electrode.

In an embodiment, the first horizontal portion and the second horizontal portion are disposed to be spaced apart from the first pixel electrode and the second pixel electrode.

In an embodiment, a first light emitting element comprising the first pixel electrode and a second light emitting element comprising the second pixel electrode provide lights of different wavelengths.

In an embodiment, further comprising: a third data line extending in the first direction; a third gate node connected to the third data line, and comprising a third vertical portion comprising a third gate electrode of the third driving transistor and a third horizontal portion extending from the third vertical portion; and a third pixel electrode connected to the third driving transistor (T431), wherein the third horizontal portion extends in the second direction.

In an embodiment, the entire third gate node overlaps the third pixel electrode.

In an embodiment, at least a part of a first vertical portion of the first gate node is disposed between the second pixel electrode and a third pixel electrode of another unit pixel adjacent to the second pixel electrode in the second direction.

In an embodiment, a first side of the first pixel electrode and a first side of the second pixel electrode face each other, and each of the first side of the first pixel electrode and the first side of the second pixel electrode have a plurality of stepped sides.

In an embodiment, a plurality of stepped sides in the first pixel electrode have widths along the first direction gradually decreasing as approaching the third pixel electrode, and a plurality of stepped sides in the second pixel electrode have width along the first direction gradually increasing as approaching the third pixel electrode.

In an embodiment, at least a part of the first horizontal portion and at least a part of the second horizontal portion are disposed between the stepped sides of the first pixel electrode and the stepped sides of the second pixel electrode.

In an embodiment, further comprising: a fourth pixel electrode disposed adjacent to the third pixel electrode in the first direction; and a bank having a first emission area exposing at least a part of the third pixel electrode and a second emission area exposing at least a part of the fourth pixel electrode, wherein a distance between a first emission area and a second emission area in a first column is different from a distance between a first emission area and a second emission area in a second column.

In an embodiment, further comprising a first transistor connected between the first gate node and the first data line.

In an embodiment, the first gate node further comprises: a second electrode positioned opposite to the first electrode of the first transistor connected to the first data line; and a first gate connection electrode connecting the second electrode to the first gate electrode.

In an embodiment, the first gate connection electrode of the first gate node comprises a part of the first vertical portion and the first horizontal portion.

In an embodiment, one side of the first gate connection electrode is connected to the second electrode through a first contact hole formed through an insulating layer, and the other side of the first gate connection electrode is connected to the first gate electrode through a second contact hole of the insulating layer.

According to an embodiment of the disclosure, a display device comprising: a first gate node connected to a first driving transistor and including a first horizontal portion extending along a first direction; a second gate node connected to a second driving transistor and including a second horizontal portion extending along the first direction; a data line extending along a second direction crossing the first direction; and a first pixel electrode and a second pixel electrode disposed adjacent to each other in the second direction, wherein the horizontal portion of the first gate node and the horizontal portion of the second gate node are disposed between the first pixel electrode and the second pixel electrode.

The display device according to the present disclosure may improve image quality by reducing a parasitic capacitance between adjacent unit pixels.

The effects of the present disclosure are not limited to the above-described effects and other effects which are not described herein will become apparent to those skilled in the art from the following description.

BRIEF DESCRIPTION OF THE DRAWINGS

The above and other aspects and features of the present disclosure will become more apparent by describing in detail exemplary embodiments thereof with reference to the attached drawings, in which:

FIG. 12 is a detailed plan view of the third unit pixel and the fourth unit pixel of FIG. 4;

FIG. 38 is a detailed plan view of the third unit pixel and the fourth unit pixel of FIG. 30;

FIG. 50 is a diagram illustrating the effect of the present disclosure.

DETAILED DESCRIPTION OF THE EMBODIMENTS

Figure 1:
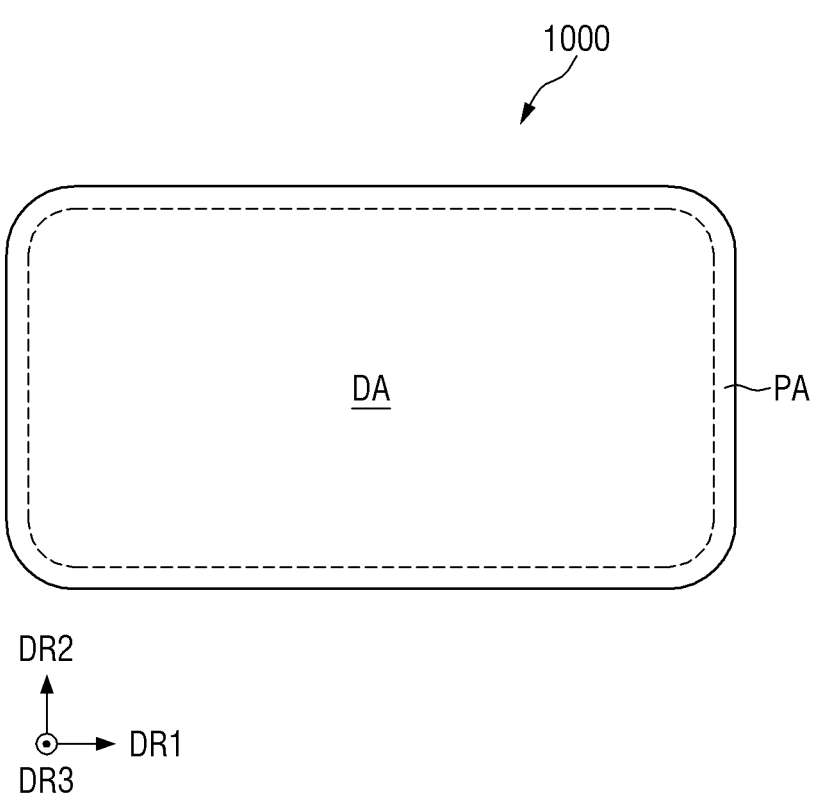
FIG. 1 is a plan view schematically illustrating a part of a display device according to one embodiment of the present disclosure.

Advantages and features of the present disclosure and methods of accomplishing the same may be understood more readily by reference to the following detailed description of preferred embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present disclosure will only be defined by the appended claims.

The present inventive concept will now be described more fully hereinafter with reference to the accompanying drawings, in which preferred embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will also be understood that when a layer is referred to as being "on" another layer or substrate, it can be directly on the other layer or substrate, or intervening layers may also be present. The same reference numbers indicate the same components throughout the specification.

Each of the features of the various embodiments of the present disclosure may be combined or combined with each other, in part or in whole, and technically various interlocking and driving are possible. Each embodiment may be implemented independently of each other or may be implemented together in an association.

In the drawings, thicknesses of layers and areas are illustrated as being exaggerated for clarity. It is to be understood that the same reference numerals may indicate like elements throughout the specification.

It will be understood that, although the terms "first," "second," "third," etc. may be used herein to describe various elements, these elements should not be limited by these terms. These terms are used to distinguish one element from another element. For example, "a first element," could be termed "a second element" or "a third element" without departing from the teachings herein. Similarly, "the second element" or "the third element" may be alternately termed.

It will be understood that when an element is referred to as being "connected" or "coupled" to another element, it can be directly connected or coupled to the element or intervening elements may be present. In contrast, when an element is referred to as being "directly connected" or "directly coupled" to another element, there are no intervening elements present.

The terms used herein are for the purpose of describing particular embodiments only and are not intended to limit the present disclosure. As used herein, the singular expression includes the plural expression unless it clearly indicates otherwise in the context. It will be understood that the terms "includes" or "have", when used in this specification, specify the presence of stated feature, number, step, operation, element, component, or their combination but do not preclude the presence or addition of one or more other features, numbers, steps, operations, elements, components or their combinations.

Unless otherwise defined, all terms (including technical and scientific terms) used herein have the same meaning as commonly understood by those having ordinary skill in the art to which the present disclosure belongs. It will be understood that terms, such as those defined in commonly used dictionaries, will not be interpreted in an idealized or overly formal sense unless expressly so defined herein.

The terms used herein are for the purpose of describing embodiments only and are not intended to limit the present disclosure. As used herein, the singular forms are intended to include the plural forms unless it clearly indicates otherwise in the context. The terms "and/or" indicates each of elements that are listed or their various combinations.

The terms such as "units," " . . . ors(ers)," "blocks," and "modules", which are used throughout the present disclosure, may mean a unit for processing at least one function or operation. For example, the terms may mean hardware components such as software, FPGA or ASIC, but are not limited to software or hardware. The terms such as "units," " . . . ors(ers)," "blocks," and "modules" may be configured to be in an addressable storage medium, or may be configured to reproduce one or more processors.

Therefore, as an example, "units," " . . . ors(ers)," "blocks," and "modules" include components such as software components, object-oriented software components, class components, and task components, processes, functions, attributes, procedures, subroutines, segments of program code, drivers, firmware, microcode, circuitry, data, databases, data structures, tables, arrays, and parameters. The functions provided in the components and "units," " . . . ors(ers)," "blocks," and "modules" may be combined into a smaller number of components, "units," " . . . ors(ers)," "blocks," and "modules" or divided into additional components and "units," " . . . ors(ers)," "blocks," and "modules".

Hereinafter, embodiments will be described in detail with reference to the accompanying drawings.

FIG. 1 is a plan view schematically illustrating a part of a display device according to one embodiment of the present disclosure.

The display device according to one embodiment of the present disclosure may include a display panel 1000 as illustrated in FIG. 1. Any display device including the display panel 1000 may be used as the display device. For example, the display device may be various products such as a smart phone, a tablet, a laptop, a television, or a billboard.

The display panel 1000 may include a display area DA and a peripheral area PA (or non-display area) outside the display area DA.

The display area DA may be a portion for displaying an image, and a plurality of pixels may be disposed in the display area DA. When viewed in a direction (e.g., a third direction DR3) substantially perpendicular to the display panel 1000, the display area DA may have various shapes, such as an elliptical shape, a polygonal shape, or a shape of a specific figure. FIG. 1 illustrates that the display area DA has a substantially rectangular shape with rounded corners. The display panel 1000 included in the display device according to the present embodiment has the display area DA with a shape in which the length in a first direction DR1 that is a horizontal direction is longer than the length in a second direction DR2 that is a vertical direction. The fact that the display panel 1000 has the display area DA of such a shape may be understood as the substrate included in the display panel 1000 having the display area DA of such a shape. Various driving circuits may be positioned in the peripheral area PA of the display panel 1000.

Figure 2:
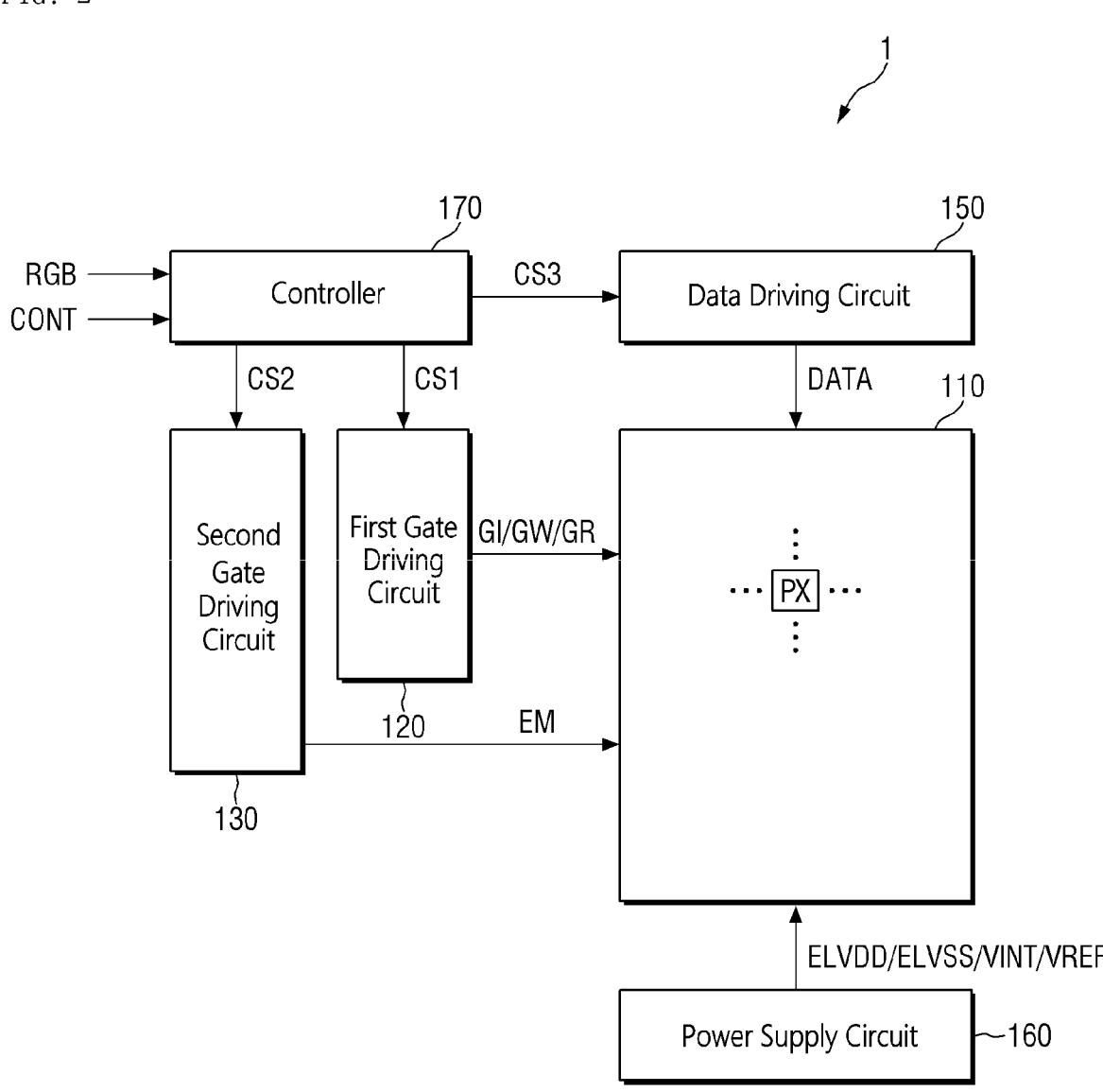
FIG. 2 is a schematic diagram of a display device according to one embodiment of the present disclosure.

FIG. 2 is a schematic diagram of a display device according to one embodiment of the present disclosure.

Referring to FIG. 2, a display device 1 according to one embodiment may include a pixel unit 110, a first gate driving circuit 120, a second gate driving circuit 130, a data driving circuit 150, and a power supply circuit 160, and a controller 170.

The pixel unit 110 of the display device 1 may be provided in the display area DA (see FIG. 1). The first gate driving circuit 120, the second gate driving circuit 130, the data driving circuit 150, the power supply circuit 160, and the controller 170 may be provided in the peripheral area PA (see FIG. 1) of the display device 1.

A plurality of pixels PX may be disposed in the pixel unit 110. The plurality of pixels PX may be disposed in various shapes such as a stripe arrangement, a pentile arrangement, and a mosaic arrangement to implement an image. The pixel unit 110 may be disposed in the display area of the substrate. Each of the pixels PX may include a light emitting element LEL as a display element, and an organic light emitting diode (OLED) may be used as an example of the light emitting element. The light emitting element LEL may be connected to the pixel circuit. Each of the pixels PX may emit, for example, light of a red, green, blue, or white color through the light emitting element LEL.

In the pixel unit 110, a plurality of first scan lines, second scan lines, third scan lines, and a plurality of emission control lines may be arranged in rows at regular intervals. Each of the first scan lines, second scan lines, third scan lines, and emission control lines may extend in the first direction DR1 (e.g., a row direction) and be connected to the pixels PX located in the same row. Each of the first scan lines GWL may transmit a first scan signal GW to the pixels PX in the same row. Each of the second scan lines may transmit a second scan signal GI to the pixels PX in the same row. Each of the third scan lines may transmit a third scan signal GR to the pixels PX in the same row. Each of the emission control lines EML may transmit an emission control signal EM to the pixels PX in the same row. In the pixel unit 110, a plurality of data lines may be arranged in columns to be spaced apart from each other at regular intervals. Each of the data lines may extend in the second direction DR2 (e.g., a column direction) to be connected to pixels PX positioned in the same column. Each of the data lines may transmit a data signal DATA to the pixels PX in the same column.

The display device 1 may support a variable refresh rate (VRR). The display device 1 may operate by changing a driving frequency within a range of a maximum driving frequency and a minimum driving frequency. Hereinafter, a mode in which the display device 1 operates at the maximum driving frequency is referred to as a normal mode (first driving mode), and a mode in which the display device 1 operates at a driving frequency lower than the maximum driving frequency (first driving frequency) is referred to as a low-speed driving mode (second driving mode). The display device 1 may operate in a low-speed driving mode to reduce power consumption. Each of the pixels PX may be driven in the first driving mode or the second driving mode.

The first gate driving circuit 120 may be connected to the first scan lines GWL, the second scan lines GIL, and the third scan lines GRL of the pixel unit 110, and may apply the first scan signal GW, the second scan signal GI, and the third scan signal GR to the first scan lines GWL, the second scan lines GIL, and the third scan lines GRL, respectively, according to a first control signal CS1. When the first scan signal GW, the second scan signal GI, and the third scan signal GR have on-voltages, the transistor of the pixel PX connected to the corresponding scan line is turned on. In the second driving mode, the first gate driving circuit 120 may supply the first scan signal GW and the third scan signal GR to the pixel unit 110 according to the first driving frequency, and may supply the second scan signal GI to the pixel unit 110 according to the maximum driving frequency.

The second gate driving circuit 130 may be connected to the plurality of emission control lines EML of the pixel unit 110, and may apply the emission control signal EM to the emission control lines EML according to a second control signal CS2. In the second driving mode, the second gate driving circuit 130 may supply the emission control signal EM to the pixel unit 110 according to the maximum driving frequency.

The data driving circuit 150 may be connected to a plurality of data lines of the pixel unit 110, and may apply the data signal DATA indicating a gray scale to the data lines according to a third control signal CS3. The data driving circuit 150 may convert input image data having a gray scale input from the controller 170 into a data signal in the form of voltage or current.

The power supply circuit 160 may generate voltages necessary for driving the pixel PX. For example, the power supply circuit 160 may generate a first driving voltage ELVDD, a second driving voltage ELVSS, a reference voltage VREF, and an initialization voltage VINT. The power supply circuit 160 may apply the first driving voltage ELVDD, the second driving voltage ELVSS, the reference voltage VREF, and the initialization voltage VINT to the pixels PX of the pixel unit 110.

A level of the first driving voltage ELVDD may be higher than a level of the second driving voltage ELVSS. The level of the reference voltage VREF may be lower than the level of the first driving voltage ELVDD. The initialization voltage VINT may be a voltage at which the light emitting element LEL (e.g., an organic light emitting diode) may be turned off. In one embodiment, the level of the initialization voltage VINT may be less than or equal to the level of the second driving voltage ELVSS. In another embodiment, the level of the initialization voltage VINT may be higher than the level of the second driving voltage ELVSS, and the level difference between the initialization voltage VINT and the second driving voltage ELVSS may be smaller than the threshold voltage required for the display element of the pixel PX to emit light.

The controller 170 may control the pixel unit 110 by controlling operation timings of the first gate driving circuit 120, the second gate driving circuit 130, and the data driving circuit 150. The controller 170 may receive image data RGB and a control signal CONT for controlling the display of the image data RGB from an external graphic controller (not illustrated). The control signal CONT may include, for example, at least one of a vertical synchronization signal Vsync, a horizontal synchronization signal Hsync, a data enable signal DE, or a clock signal CLK. The controller 170 may generate the first to third control signals CS1, CS2, and CS3 which are respectively transmitted to the first gate driving circuit 120, the second gate driving circuit 130, and the data driving circuit 150 according to the control signal CONT. The image data RGB includes luminance information of the pixels PX. The luminance may have a predetermined number of gray scales, for example, 1024 ($=2^{10}$), 256 ($=2^8$), or 64 ($=2^6$).

Although the first gate driving circuit 120 and the second gate driving circuit 130 are illustrated separately in FIG. 1, in another embodiment, the first gate driving circuit 120 and the second gate driving circuit 130 may be implemented as one gate driving circuit to output the first scan signal GW, the second scan signal GI, the third scan signal GR, and the emission control signal EM.

The first gate driving circuit 120, the second gate driving circuit 130, the data driving circuit 150, the power supply circuit 160, and the controller 170 may be implemented as separate integrated circuit chips or one integrated circuit chip, and may be directly mounted on a substrate on which the pixel unit 110 is formed, be mounted on a flexible printed circuit film, be attached to a substrate in the form of a tape carrier package (TCP), or be directly formed on a substrate.

Figure 3:
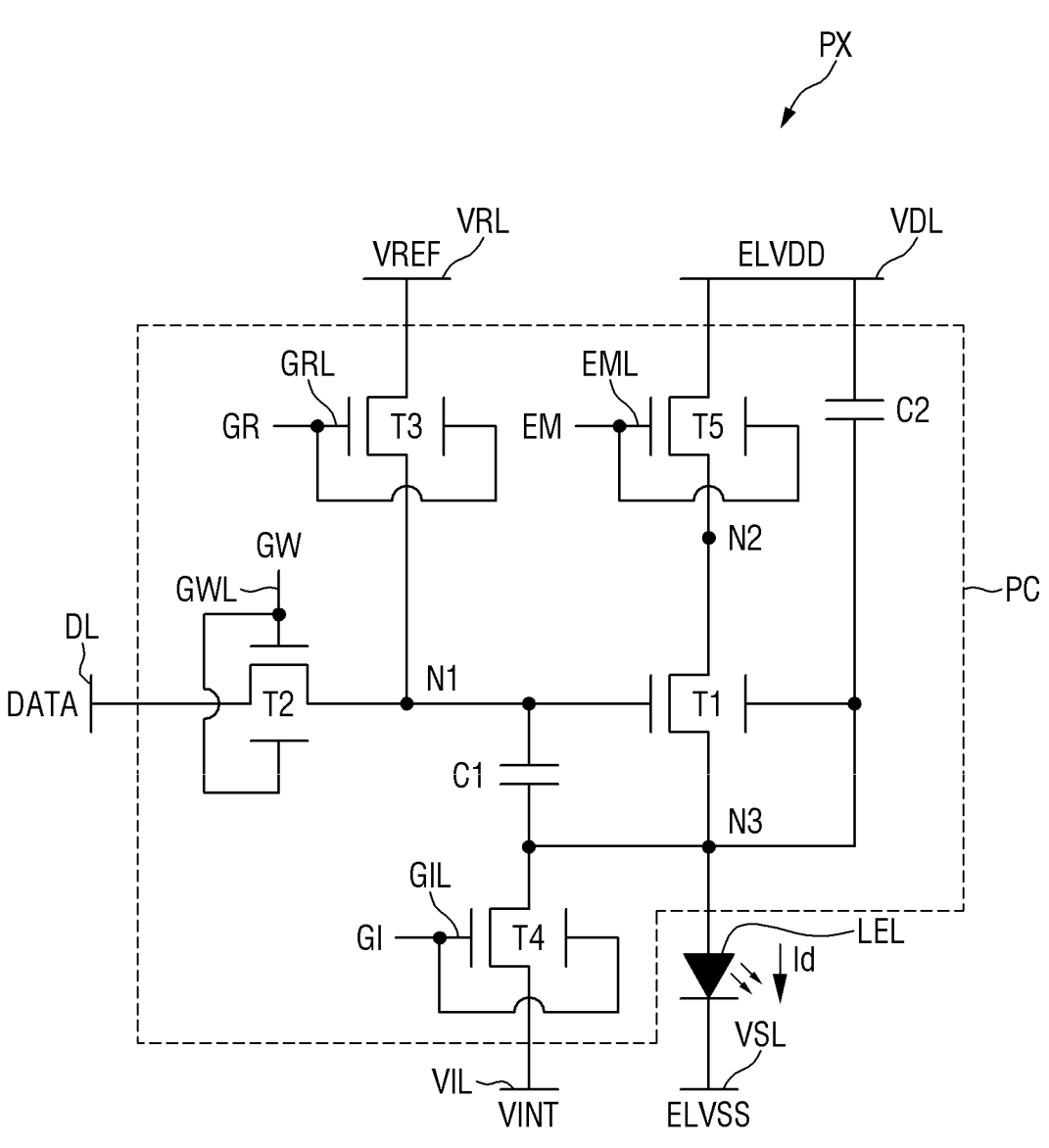
FIG. 3 is a diagram illustrating a pixel circuit and a light emitting element of a pixel according to one embodiment of the present disclosure.

FIG. 3 is a diagram illustrating a pixel circuit and a light emitting element of a pixel according to one embodiment of the present disclosure.

Referring to FIG. 3, the pixel PX may include the light emitting element LEL (e.g., an organic light emitting diode) as a display element and a pixel circuit PC connected to the light emitting element LEL. The pixel circuit PC may include first to fifth transistors T1 to T5 and first and second capacitors C1 and C2. The first transistor T1 may be a driving transistor in which a source-drain current is determined according to a gate-source voltage, and the second to fifth transistors T2 to T5 may be a switching transistor that is turned on/off according to the gate-source voltage, substantially a gate voltage. The first to fifth transistors T1 to T5 may be implemented as thin film transistors. According to a type (p-type or n-type) and/or the operating condition of the transistor, the first electrode of each of the first to fifth transistors T1 to T5 may be a source electrode or a drain electrode, and the second electrode may be an electrode different from the first electrode. For example, when the first electrode is the source electrode, the second electrode may be the drain electrode.

The pixel PX may be connected to the first scan line GWL that transmits the first scan signal GW, the second scan line GIL that transmits the second scan signal GI, the third scan line GRL that transmits the third scan signal GR, the emission control line EML that transmits the emission control signal EM, and a data line DL that transmits the data signal DATA. The first driving voltage line VDL may transmit the first driving voltage ELVDD to the first transistor T1. The initialization voltage line VIL may transmit the initialization voltage VINT to the light emitting element LEL (e.g., an organic light emitting diode). The reference voltage line VRL may transmit the reference voltage VREF to the gate electrode of the first transistor T1.

A plurality of first to fifth transistors T1 to T5 may include an oxide semiconductor material. Since the oxide semiconductor has high carrier mobility and low leakage current, the voltage drop is not large although the driving time is long. That is, in the case of an oxide semiconductor, since a color change of an image due to a voltage drop is not large even during low-frequency driving, low-frequency driving is possible. Accordingly, a display device preventing the generation of leakage current and having reduced power consumption may be implemented by the plurality of first to fifth transistors T1 to T5 including an oxide semiconductor material. In addition, in the case of using an oxide semiconductor transistor, a crystallization process by excimer laser annealing (ELA) is not required to form a low-temperature polycrystalline silicon (LTPS) semiconductor transistor, and thus the manufacturing cost of the display panel 1000 may be reduced, so that it is advantageous for implementation of a large-area display device.

The oxide semiconductor is sensitive to light, so that a fluctuation in current amount and the like may occur due to light from the outside. Accordingly, it may be considered to absorb or reflect light from the outside by positioning a metal layer under the oxide semiconductor. The metal layer positioned below the oxide semiconductor of each of the first to fifth transistors T1 to T5 may function as an opposite gate electrode (e.g., a counter gate electrode). That is, the first to fifth transistors T1 to T5 may be double gate transistors having two gate electrodes (e.g., a first gate electrode and a second gate electrode, or a gate electrode and a counter gate electrode). The first gate electrode and the second gate electrode may be disposed to face each other on different layers. For example, each of the first to fifth transistors T1 to T5 may be an N-channel oxide semiconductor transistor, and the first gate electrode and the second gate electrode of each of the first to fifth transistors T1 to T5 may be positioned to face each other with an oxide semiconductor interposed therebetween.

The first transistor T1 includes the first gate electrode connected to a first node N1 (or gate node), the second gate electrode connected to a third node N3, a first electrode connected to a second node N2, and a second electrode connected to the third node N3. The second gate electrode of the first transistor T1 may be connected to the second electrode of the first transistor T1 to be controlled by a voltage applied to the second electrode of the first transistor T1, and may improve the output saturation characteristics of the first transistor T1. The first electrode of the first transistor T1 may be connected to the first driving voltage line VDL via the fifth transistor T5, and the second electrode may be connected to the pixel electrode of the light emitting element LEL. The first transistor T1 may serve as a driving transistor, and may control the magnitude (e.g., current amount) of a driving current Id flowing to the light emitting element LEL by receiving the data signal DATA according to the switching operation of the second transistor T2.

The second transistor T2 (e.g., data writing transistor) includes the first gate electrode and the second gate electrode connected to the first scan line GWL, a first electrode connected to the data line DL, and a second electrode connected to the first node N1 (or the gate electrode of the first transistor T1). The second transistor T2 may be turned on in response to the first scan signal GW transmitted to the first scan line GWL to electrically connect the data line DL to the first node N1, and may transmit the data signal DATA supplied from the data line DL to the first node N1.

The third transistor T3 (e.g., a first initialization transistor) includes the first gate electrode and the second gate electrode connected to the third scan line GRL, a first electrode connected to the reference voltage line VRL, and a second electrode connected to the first node N1 (or the gate electrode of the first transistor T1). The third transistor T3 may be turned on in response to the third scan signal GR supplied from the third scan line GRL and transmit the reference voltage VREF supplied from the reference voltage line VRL to the first node N1.

The fourth transistor T4 (e.g., the second initialization transistor) includes the first gate electrode and the second gate electrode connected to the second scan line GIL, a first electrode connected to the third node N3 (or the second electrode of the first transistor T1), and a second electrode connected to the initialization voltage line VIL. The fourth transistor T4 may be turned on in response to the second scan signal GI supplied from the second scan line GIL and transmit the initialization voltage VINT supplied from the initialization voltage line VIL to the third node N3.

The fifth transistor T5 (e.g., an emission control transistor) includes the first gate electrode and the second gate electrode connected to the emission control line EML, a first electrode connected to the first driving voltage line VDL, and a second electrode connected to the second node (or the first electrode of the first transistor T1). The fifth transistor T5 may be turned on or off in response to the emission control signal EM supplied from the emission control line EML.

The first capacitor C1 may be connected between the first node N1 and the third node N3. The first electrode of the first capacitor C1 may be connected to the gate electrode of the first transistor T1, and the second terminal thereof may be connected to the second gate electrode and the second electrode of the first transistor T1, the first electrode of the fourth transistor T4, and the pixel electrode (e.g., anode electrode) of the light emitting element LEL. The first capacitor C1 may be a storage capacitor and may store a voltage corresponding to a threshold voltage and a data signal of the first transistor T1.

The second capacitor C2 may be connected between the third node N3 and the first driving voltage line VDL. The first electrode of the second capacitor C2 may be connected to the first driving voltage line VDL, and the second electrode thereof may be connected to the second gate electrode and the second electrode of the first transistor T1, the second electrode of the first capacitor C1, the first electrode of the fourth transistor T4, and the pixel electrode of the light emitting element LEL. The capacitance of the first capacitor C1 may be greater than the capacitance of the second capacitor C2.

The light emitting element LEL may include a pixel electrode (e.g., an anode electrode) and a counter electrode (e.g., a cathode electrode) facing the pixel electrode, and the counter electrode may be applied with the second driving voltage ELVSS. The counter electrode may be connected to a second driving voltage line VSL transmitting a second driving voltage. The counter electrode may be a common electrode commonly shared by the plurality of pixels PX.

Figure 4:
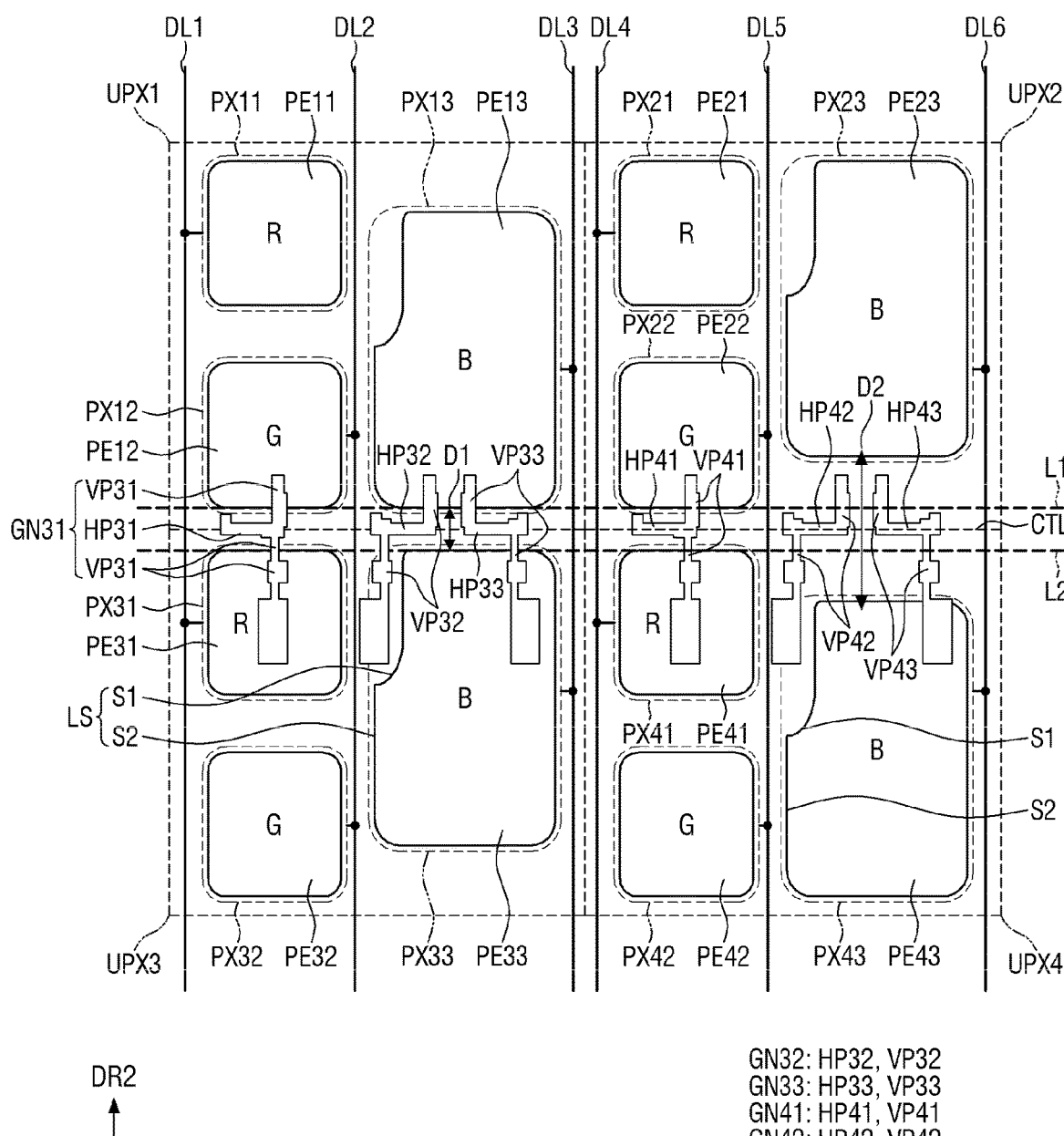
FIG. 4 is a diagram schematically illustrating four adjacent unit pixels of a display device according to one embodiment of the present disclosure.

FIG. 4 is a diagram schematically illustrating four adjacent unit pixels of a display device according to one embodiment of the present disclosure.

As in the example shown in FIG. 4, a plurality of unit pixels, for example, UPX1, UPX2, UPX3, and UPX4, may be disposed in the display area DA of the display device 1. For example, the plurality of unit pixels may include the first unit pixel UPX1, the second unit pixel UPX2, the third unit pixel UPX3, and the fourth unit pixel UPX4.

Each unit pixel may include a plurality of sub-pixels (hereinafter, referred to as pixels). For example, the first unit pixel UPX1 may include a first-first sub-pixel (hereinafter, referred to as a first-first pixel PX11), a first-second sub-pixel (hereinafter, referred to as a first-second pixel PX12), and a first-third sub-pixel (hereinafter, referred to as a first-third pixel PX13), the second unit pixel UPX2 may include a second-first sub-pixel (hereinafter, referred to as a second-first pixel PX21), a second-second sub-pixel (hereinafter, referred to as a second-second pixel PX22), and a second-third sub-pixel (hereinafter, referred to as a second-third pixel PX23), the third unit pixel UPX3 may include a third-first sub-pixel (hereinafter, referred to as a third-first pixel PX31), a third-second sub-pixel (hereinafter, referred to as a third-second pixel PX32), and a third-third sub-pixel (hereinafter, referred to as a third-third pixel PX33), and the fourth unit pixel UPX4 may include a fourth-first sub-pixel (hereinafter, referred to as a fourth-first pixel PX41), a fourth-second sub-pixel (hereinafter, referred to as a fourth-second pixel PX42), and a fourth-third sub-pixel (hereinafter, referred to as a fourth-third pixel PX43).

Each pixel may include a light emitting element and a pixel circuit connected to the light emitting element (for example, the anode electrode of the light emitting element corresponding to the pixel electrode). For example, the first-first pixel PX11 may include a first-first pixel electrode PE11 and a first-first pixel circuit connected to the first-first pixel electrode PE11, the first-second pixel PX12 may include a first-second pixel electrode PE12 and a first-second pixel circuit connected to the first-second pixel electrode PE12, and the first-third pixel PX13 may include a first-third pixel electrode PE13 and a first-third pixel circuit connected to the first-third pixel electrode PE13. Further, the second-first pixel PX21 may include a second-first pixel electrode PE21 and a second-first pixel circuit connected to the second-first pixel electrode PE21, the second-second pixel PX22 may include a second-second pixel electrode PE22 and a second-second pixel circuit connected to the second-second pixel electrode PE22, and the second-third pixel PX23 may include a second-third pixel electrode PE23 and a second-third pixel circuit connected to the second-third pixel electrode PE23. Further, the third-first pixel PX31 may include a third-first pixel electrode PE31 and a third-first pixel circuit connected to the third-first pixel electrode PE31, the third-second pixel PX32 may include a third-second pixel electrode PE32 and a third-second pixel circuit connected to the third-second pixel electrode PE32, and the third-third pixel PX33 may include a third-third pixel electrode PE33 and a third-third pixel circuit connected to the third-third pixel electrode PE33. Further, the fourth-first pixel PX41 may include a fourth-first pixel electrode PE41 and a fourth-first pixel circuit connected to the fourth-first pixel electrode PE41, the fourth-second pixel PX42 may include a fourth-second pixel electrode PE42 and a fourth-second pixel circuit connected to the fourth-second pixel electrode PE42, and the fourth-third pixel PX43 may include a fourth-third pixel electrode PE43 and a fourth-third pixel circuit connected to the fourth-third pixel electrode PE43.

In FIG. 4, the unit pixels UPX1 to UPX4 may be distinguished with respect to the above-described pixel electrodes, for example. For example, the first unit pixel UPX1 may be a unit pixel including the first-first pixel electrode PE11 of the first-first pixel PX11, the first-second pixel electrode PE12 of the first-second pixel PX12, and the first-third pixel electrode PE13 of the first-third pixel PX13, the second unit pixel UPX2 may be a unit pixel including the second-first pixel electrode PE21 of the second-first pixel PX21, the second-second pixel electrode PE22 of the second-second pixel PX22, the second-third pixel electrode PE23 of the second-third pixel PX23, and the third unit pixel UPX3 may be a unit pixel including the third-first pixel electrode PE31 of the third-first pixel PX31, the third-second pixel electrode PE32 of the third-second pixel PX32, and the third-third pixel electrode PE33 of the third-third pixel PX33.

In the following description, when a certain pixel is referred to as a first pixel, the first pixel refers to at least one of the first-first pixel PX11, the second-first pixel PX21, the third-first pixel PX31, or the fourth-first pixel PX41 of each unit pixel. Similarly, when a certain pixel is referred to as a second pixel, the second pixel refers to at least one of the first-second pixel PX12, the second-second pixel PX22, the third-second pixel PX32, or the fourth-second pixel PX42 of each unit pixel. Similarly, when a certain pixel is referred to as a third pixel, the third pixel refers to at least one of the first-third pixel PX13, the second-third pixel PX23, the third-third pixel PX33, or the fourth-third pixel PX43 of each unit pixel.

Further, in the following description, when a certain pixel electrode is referred to as a first pixel electrode, the first pixel electrode refers to at least one of the first-first pixel electrode PE11, the second-first pixel electrode PE21, the third-first pixel electrode PE31, or the fourth-first pixel electrode PE41 of each unit pixel. Similarly, when a certain pixel electrode is referred to as a second pixel electrode, the second pixel electrode refers to at least one of the first-second pixel electrode PE12, the second-second pixel electrode PE22, the third-second pixel electrode PE32, or the fourth-second pixel electrode PE42 of each unit pixel. Similarly, when a certain pixel electrode is referred to as a third pixel electrode, the third pixel electrode refers to at least one of the first-third pixel electrode PE13, the second-third pixel electrode PE23, the third-third pixel electrode PE33, or the fourth-third pixel electrode PE43 of each unit pixel.

The pixels (for example, three pixels) of each of the unit pixels UPX1 to UPX4 may include light emitting layers providing lights of different wavelengths. For example, each of the first-first pixel PX11 of the first unit pixel UPX1, the second-first pixel PX21 of the second unit pixel UPX2, the third-first pixel PX31 of the third unit pixel UPX3, and the fourth-first pixel PX41 of the fourth unit pixel UPX4 may include a light emitting layer providing light of a first wavelength (for example, light of a red wavelength). Further, each of the first-second pixel PX12 of the first unit pixel UPX1, the second-second pixel PX22 of the second unit pixel UPX2, the third-second pixel PX32 of the third unit pixel UPX3, and the fourth-second pixel PX42 of the fourth unit pixel UPX4 may include a light emitting layer providing light of a second wavelength (for example, light of a green wavelength). Further, each of the first-third pixel PX13 of the first unit pixel UPX1, the second-third pixel PX23 of the second unit pixel UPX2, the third-third pixel PX33 of the third unit pixel UPX3, and the fourth-third pixel PX43 of the fourth unit pixel UPX4 may include a light emitting layer providing light of a third wavelength (for example, light of a blue wavelength).

The light of the first wavelength may correspond to a wavelength of red light, the light of the second wavelength may correspond to a wavelength of green light, and the light of the third wavelength may correspond to a wavelength of blue light. However, the present disclosure is not limited thereto, and, for example, the light of the first wavelength may correspond to the wavelength of green light, the light of the second wavelength may correspond to the wavelength of red light, and the light of the third wavelength may correspond to the wavelength of blue light. For another example, the light of the first wavelength may correspond to the wavelength of green light, the light of the second wavelength may correspond to the wavelength of blue light, and the light of the third wavelength may correspond to the wavelength of red light. For another example, the light of the first wavelength may correspond to the wavelength of blue light, the light of the second wavelength may correspond to the wavelength of red light, and the light of the third wavelength may correspond to the wavelength of green light. For another example, the light of the first wavelength may correspond to the wavelength of blue light, the light of the second wavelength may correspond to the wavelength of green light, and the light of the third wavelength may correspond to the wavelength of red light. For a specific example, in the first unit pixel UPX1, the first-first pixel PX11 may provide light corresponding to any one of the first, second, and third wavelengths, the first-second pixel PX12 may provide light corresponding to a wavelength different from the wavelength of the light of the first-first pixel PX11 among the first, second, and third wavelengths, and the first-third pixel PX13 may provide light corresponding to a wavelength different from the wavelengths of the lights of the first-first and first-second pixels PX11 and PX12 among the first, second, and third wavelengths.

Each of the pixels PX11 to PX43 may be connected to corresponding data lines DL1, DL2, DL3, and DL4. For example, pixels providing light of the same wavelength among pixels arranged in a column along the extension direction (or length direction; for example, the second direction DR2) of the data line may be connected to the same data line. For one example, the first-first pixel PX11 of the first unit pixel UPX1 and the third-first pixel PX31 of the third unit pixel UPX3 may be connected to the first data line DL1, the first-second pixel PX12 of the first unit pixel UPX1 and the third-second pixel PX32 of the third unit pixel UPX3 may be connected to the second data line DL2, the first-third pixel PX13 of the first unit pixel UPX1 and the third-third pixel PX33 of the third unit pixel UPX3 may be connected to the third data line DL3, the second-first pixel PX21 of the second unit pixel UPX2 and the fourth-first pixel PX41 of the fourth unit pixel UPX4 may be connected to the fourth data line DL4, the second-second pixel PX22 of the second unit pixel UPX2 and the fourth-second pixel PX42 of the fourth unit pixel UPX4 may be connected to a fifth data line DL5, and the second-third pixel PX23 of the second unit pixel UPX2 and the fourth-third pixel PX43 of the fourth unit pixel UPX4 may be connected to a sixth data line DL6.

At least two pixels among the pixels included in one unit pixel may include pixel electrodes having different areas. For example, as shown in FIG. 4, among the three pixels provided in the first unit pixel UPX1, the first-third pixel PX13 may include the pixel electrode (for example, the first-third pixel electrode PE13) having the largest area. Meanwhile, the first-first pixel electrode PE11 of the first-first pixel PX11 provided in the first unit pixel UPX1 and the first-second pixel electrode PE12 of the first-second pixel PX12 provided in the first unit pixel UPX1 may have the same area. Other unit pixels may also have the same configuration as that of the first unit pixel UPX1.

Meanwhile, a distance between the third pixel electrodes of the third pixels (for example, the first-third pixel PX13 and the third-third pixel PX33) included in unit pixels adjacent in the second direction DR2 (for example, the extension direction of the data line) in odd columns of the unit pixels UPX may be different from the distance between the third pixel electrodes of the third pixels (for example, the second-third pixel PX23 and the fourth-third pixel PX43) included in unit pixels adjacent in the second direction DR2 in even columns of the unit pixels UPX. For example, when the distance between the first-third pixel electrode PE13 of the first unit pixel UPX1 and the third-third pixel electrode PE33 of the third unit pixel UPX3 may be defined as a first distance D1, and the distance between the second-third pixel electrode PE23 of the second unit pixel UPX2 and the fourth-third pixel electrode PE43 of the fourth unit pixel UPX4 is defined as a second distance D2, the second distance D2 may be longer than the first distance D1. Here, the first unit pixel UPX1 and the second unit pixel UPX2 may be positioned in one same row of the unit pixels UPX, and the third unit pixel UPX3 and the fourth unit pixel UPX4 may be positioned in another same row of the unit pixels UPX.

In other words, the distance between the pixel electrodes having the largest area that are respectively disposed in different unit pixels adjacent to each other in the same odd column of the unit pixels UPX may be different from the distance between the pixel electrodes having the largest area that are respectively disposed in different unit pixels adjacent to each other in the same even column of the unit pixels UPX. Here, the pixel electrode having the largest area may mean a pixel electrode (for example, a third pixel electrode) having the largest area among pixel electrodes in one unit pixel.

Meanwhile, in another embodiment, in FIG. 4, the distance between the first-third pixel electrode PE13 of the first unit pixel UPX1 and the third-third pixel electrode PE33 of the third unit pixel UPX3 may be greater than the distance between the second-third pixel electrode PE23 of the second unit pixel UPX2 and the fourth-third pixel electrode PE43 of the fourth unit pixel UPX4.

The pixel circuit of each of the pixels PX11 to PX43 may include a gate node connected to the gate electrode of the first transistor T1. At least a part of the gate node may be disposed to be spaced apart from the pixel electrodes so as not to overlap the pixel electrodes. For example, in FIG. 4, a horizontal portion HP31 of a third-first gate node GN31, which is a node connected to the gate electrode of the first transistor (for example, T1) included in the third-first pixel PX31 of the third unit pixel UPX3, may be disposed between the first-second pixel electrode PE12 and the third-first pixel electrode PE31 disposed adjacent thereto along the second direction D2. In other words, the third-first gate node GN31 may include the horizontal portion HP31 extending along the first direction DR1 and a vertical portion VP31 extending along the second direction DR2, and the horizontal portion HP31 of the third-first gate node GN31 may be disposed between the first-second pixel electrode PE12 of the first unit pixel UPX1 and the third-first pixel electrode PE31 of the third unit pixel UPX3 not to overlap the third-first pixel electrode PE31 of the pixel including the horizontal portion HP31 of the third-first gate node GN31 and other pixel electrodes in a plan view. Meanwhile, a part of the vertical portion VP31 of the third-first gate node GN31 may overlap the pixel electrodes of adjacent unit pixels in the second direction DR2. For example, a part of the vertical portion VP31 of the third-first gate node GN31 may overlap the third-first pixel electrode PE31 of the third unit pixel UPX3 and the first-second pixel electrode PE12 of the first unit pixel UPX1. Meanwhile, a part of the upper vertical portion VP31 of the third-first gate node GN31 may overlap the pixel electrode (for example, the first-second pixel electrode PE12) of the first unit pixel UPX1 adjacent to the third unit pixel UPX3 in the second direction DR2, and a part of the lower vertical portion VP31 of the third-first gate node GN31 may overlap the pixel electrode (for example, the third-first pixel electrode PE31) of the third unit pixel UPX3.

Further, in FIG. 4, a horizontal portion HP32 of a third-second gate node GN32, which is a node connected to the gate electrode of the first transistor T1 included in the third-second pixel PX32 of the third unit pixel UPX3, may be disposed between the first-third pixel electrode PE13 and the third-third pixel electrode PE33 adjacent thereto along the second direction DR2. In other words, the third-second gate node GN32 may include the horizontal portion HP32 extending along the first direction DR1 and a vertical portion VP32 extending along the second direction DR2, and the horizontal portion HP32 of the third-second gate node GN32 may be disposed between the first-third pixel electrode PE13 of the first unit pixel UPX1 and the third-third pixel electrode PE33 of the third unit pixel UPX3 not to overlap the pixel electrode PE32 of the pixel including the horizontal portion HP32 of the third-second gate node GN32 and other pixel electrode in a plan view. Meanwhile, at least a part of a vertical portion VP32 of the third-second gate node GN32 may not overlap the pixel electrodes in a plan view. For example, at least a part of the vertical portion VP32 of the third-second gate node GN32 may be disposed between the third-first pixel electrode PE31 and the third-third pixel electrode PE33 of the third unit pixel UPX3 not to overlap the third-first pixel electrode PE31 and the third-third pixel electrode PE33 of the third unit pixel UPX3. The third-third pixel electrode PE33 having the largest area among the pixel electrodes of the third unit pixel UPX3 may have a stepped portion on one side thereof (for example, the side of the third-third pixel electrode PE33 adjacent to the vertical portion VP32 of the third-second gate node GN32) to prevent the vertical portion VP32 of the third-second gate node GN32 from overlapping the pixel electrodes. For example, among the above-described sides of the third-third pixel electrode PE33, a left side LS facing the third-first pixel electrode PE31 may include a stepped portion which includes a first side S1 facing the third-first pixel electrode PE31 and a second side S2 facing the third-second pixel electrode PE32 and a space disposed between the third-first pixel electrode PE31 and the third-second pixel electrode PE32. Each of the first side S1 and the second side S2 may have a length shorter than that of the right side (for example, the side opposite to the left side of the third-third pixel electrode PE33) of the third-third pixel electrode PE33. For one example, the first side S1 may have a length shorter than that of the second side S2. Accordingly, the second side S2 of the third-third pixel electrode PE33 may protrude more in a direction opposite to the first direction (hereinafter, referred to as a first reverse direction) of the first direction DR1 than the first side S1. In other words, the first side S1 may be recessed more in the first direction DR1 than the second side S2. A part of the vertical portion VP32 of the third-second gate node GN32 may be disposed adjacent to the first side S1 of the third-third pixel electrode PE33. In other words, a part of the vertical portion VP32 of the third-second gate node GN32 may be disposed between the third-first pixel electrode PE31 and the first side S1 of the third-third pixel electrode PE33. As described above, the lower vertical portion VP32 of the third-second gate node GN32 may not overlap the pixel electrodes, for example, the third-third pixel electrode PE33. This is because the third-third pixel electrode PE33 has the first side S1 recessed more than the second side S22, for example. Meanwhile, at least a part of the first side S1 may have a round shape.

Further, in FIG. 4, a horizontal portion HP33 of a third-third gate node GN33, which is a node connected to the gate electrode of the first transistor T1 included in the third-third pixel PX33 of the third unit pixel UPX3, may be disposed between the first-third pixel electrode PE13 and the third-third pixel electrode PE33 adjacent thereto along the second direction DR2. In other words, the third-third gate node GN33 may include the horizontal portion HP33 extending along the first direction DR1 and a vertical portion VP33 extending along the second direction DR2, and the horizontal portion HP33 of the third-third gate node GN33 may be disposed between the first-third pixel electrode PE13 of the first unit pixel UPX1 and the third-third pixel electrode PE33 of the third unit pixel UPX3 not to overlap the third-third pixel electrode PE33 of the pixel including the horizontal portion HP33 of the third-third gate node GN33 and other pixel electrodes in a plan view. Meanwhile, a part of the vertical portion VP33 of the third-third gate node GN33 may overlap the pixel electrode of the third unit pixel UPX3. For example, a part of the upper vertical portion VP33 of the third-third gate node GN33 may overlap the first-third pixel electrode PE13 of the first unit pixel UPX1, and a part of the lower vertical portion VP33 of the third-third gate node GN33 may overlap the third-third pixel electrode PE33 of the third unit pixel UPX3.

Further, in FIG. 4, a horizontal portion HP41 of a fourth-first gate node GN41, which is a node connected to the gate electrode of the first transistor T1 included in the fourth-first pixel PX41 of the fourth unit pixel UPX4, may be disposed between the second-second pixel electrode PE22 and the fourth-first pixel electrode PE41 disposed adjacent thereto along the second direction DR2. In other words, the fourth-first gate node GN41 may include the horizontal portion HP41 extending along the first direction DR1 and a vertical portion VP41 extending along the second direction DR2, and the horizontal portion HP41 of the fourth-first gate node GN41 may be disposed between the second-second pixel electrode PE22 of the second unit pixel UPX2 and the fourth-first pixel electrode PE41 of the fourth unit pixel UPX4 not to overlap the fourth-first pixel electrode PE41 of the pixel including the horizontal portion HP41 of the fourth-first gate node GN41 and other pixel electrodes in a plan view. Meanwhile, a part of the upper vertical portion VP41 of the fourth-first gate node GN41 may overlap the pixel electrode (for example, the second-second pixel electrode PE22) of the second unit pixel UPX2 adjacent to the fourth unit pixel UPX4 in the second direction DR2, and a part of the lower vertical portion VP41 of the fourth-first gate note GN41 may overlap the pixel electrode (for example, the fourth-first pixel electrode PE41) of the fourth unit pixel UPX4.

Further, in FIG. 4, a horizontal portion HP42 of a fourth-second gate node GN42, which is a node connected to the gate electrode of the first transistor T1 included in the fourth-second pixel PX42 of the fourth unit pixel UPX4, may be disposed between the second-third pixel electrode PE23 and the fourth-third pixel electrode PE43 adjacent thereto along the second direction D2. In other words, the fourth-second gate node GN42 may include the horizontal portion HP42 extending along the first direction DR1 and a vertical portion VP42 extending along the second direction DR2, and the horizontal portion HP42 of the fourth-second gate node GN42 may be disposed between the second-third pixel electrode PE23 of the second unit pixel UPX2 and the fourth-third pixel electrode PE43 of the fourth unit pixel UPX4 not to overlap the fourth-first pixel electrode PE41 of the pixel including the horizontal portion HP42 of the fourth-first gate node GN41) in a plan view. Meanwhile, the entire portion including the horizontal portion HP42 of the fourth-second gate node GN42 may not overlap the pixel electrodes. The fourth-third pixel electrode PE43 having the largest area among the pixel electrodes of the fourth unit pixel UPX4, for example, may have a stepped portion on one side thereof (for example, the side of the fourth-third pixel electrode PE43 adjacent to the lower vertical portion VP42 of the fourth-second gate node GN42 to prevent the lower vertical portion VP42 of the fourth-second gate node GN42 from overlapping the fourth-third pixel electrode PE43. As one example, among the above-described side of the fourth-third pixel electrode PE43, a left side facing the fourth-first pixel electrode PE41 may include a first side S1 facing the fourth-first pixel electrode PE41 and the second side S2 facing the fourth-second pixel electrode PE42 and a space disposed between the fourth-first pixel electrode PE41 and the fourth-second pixel electrode PE42. Each of the first side S1 and the second side S2 may have a length shorter than that of the right side (for example, the side opposite to the left side of the fourth-third pixel electrode PE43) of the fourth-third pixel electrode PE43. For example, the first side S1 may have a length shorter than that of the second side S2. Accordingly, the second side S2 of the fourth-third pixel electrode PE43 may protrude more in the first reverse direction than the first side S1. In other words, the first side S1 may have a more recessed shape in the first direction DR1 than the second side S2. A part of the lower vertical portion VP42 of the fourth-second gate node GN42 may be disposed adjacent to the first side S1 of the fourth-third pixel electrode PE43. In other words, a part of the lower vertical portion VP42 of the fourth-second gate node GN42 may be disposed between the fourth-first pixel electrode PE41 and the first side S1 of the fourth-third pixel electrode PE43. As described above, the lower vertical portion VP42 of the fourth-second gate node GN42 may not overlap the fourth-third pixel electrode PE43 in a plan view. This is because, for example, the second-third pixel electrode PE23 of the second unit pixel UPX2 and the fourth-third pixel electrode PE43 of the fourth unit pixel UPX4 adjacent in the second direction DR2 are spaced apart from each other by the long distance D2, and the fourth-third pixel electrode PE43 has the first side S1 recessed more than the second side S2 along the first direction DR1. Meanwhile, at least a part of the first side S1 may have a round shape.

Further, in FIG. 4, a horizontal portion HP43 of a fourth-third gate node GN43, which is a node connected to the gate electrode of the first transistor T1 included in the fourth-third pixel PX43 of the fourth unit pixel UPX4, may be disposed between the second-third pixel electrode PE23 and the fourth-third pixel electrode PE43 adjacent thereto along the second direction DR2. In other words, the fourth-third gate node GN43 may include the horizontal portion HP43 extending along the first direction DR1 and a vertical portion VP43 extending along the second direction DR2, and the horizontal portion HP43 of the fourth-third gate node GN43 may be disposed between the second-third pixel electrode PE23 of the second unit pixel UPX2 and the fourth-third pixel electrode PE43 of the fourth unit pixel UPX4 not to overlap the fourth-third pixel electrode PE43 of the pixel including the horizontal portion HP43 of the fourth-third gate node GN43 and other pixel electrodes in a plan view. Meanwhile, a part of the lower vertical portion VP43 of the fourth-third gate node GN43 may overlap the fourth-third pixel electrode PE43 in the fourth unit pixel UPX4.

As described above, the horizontal portions HP31 to HP43 of the gate nodes GN31 to GN43 may be disposed in the region between the pixel electrodes (for example, the pixel electrodes of different unit pixels; e.g., the first-third pixel electrode PE13 and the third-third pixel electrode PE33) arranged at a minimum distance D1 along the second direction DR2 (for example, the extension direction of the data line or the length direction of the data line). For example, when an imaginary line extending along the lower side of the first-third pixel electrode PE13 defining one point of the distance D1 is defined as a first extension line L1, and an imaginary line extending along the upper side of the third-third pixel electrode PE33 defining the other point of the distance D1 is defined as a second extension line L2, the above-described horizontal portions HP31 to HP43 may be disposed in the region between the first extension line L1 and the second extension line L2.

Meanwhile, the overlapping area between the first-second pixel electrode PE12 and the third-first pixel electrode PE31 adjacent to the third-first gate node GN31 in the second direction DR2 and in a direction opposite to the second direction (hereinafter, referred to as a second reverse direction) may be the same as the overlapping area between the second-second pixel electrode PE22 and the fourth-first pixel electrode PE41 adjacent to the fourth-first gate node GN41 in the second direction DR2 and in the second reverse direction.

In accordance with the present disclosure, the horizontal portion of the gate node belonging to any one unit pixel (or pixel) does not overlap the pixel electrode belonging to another unit pixel (for example, an adjacent unit pixel or an adjacent pixel), so that the overlapping area between the gate node included in the any one unit pixel (or pixel) and the pixel electrodes of another adjacent unit pixel (or adjacent pixel) may be minimized. Accordingly, the capacitance variation between the pixel electrodes for each unit pixel (or pixel) and the gate nodes may be minimized.

Meanwhile, the gate nodes GN31 to GN43 may be arranged in a row along the first direction DR1. Further, the horizontal portions HP31 to HP43 of the gate nodes GN31 to GN43 may be arranged in a row along the first direction DR1. The horizontal portions HP31 to HP43 of the gate nodes GN31 to GN43 may be disposed at an imaginary center line CTL disposed between sides of the pixel electrodes adjacent to and facing each other in the second direction DR2. For example, the horizontal portion HP31 of the third-first gate node GN31 may be disposed at the imaginary center line CTL between sides of the first-second pixel electrode PE12 and the third-first pixel electrode PE31 adjacent to and facing each other in the second direction DR2, the horizontal portion HP32 of the third-second gate node GN32 may be disposed at the imaginary center line CTL disposed between sides of the first-third pixel electrode PE13 and the third-third pixel electrode PE33 adjacent to and facing each other in the second direction DR2, the horizontal portion HP33 of the third-third gate node GN33 may be disposed at the imaginary center line CTL disposed between the sides of the first-third pixel electrode PE13 and the third-third pixel electrode PE33 adjacent to and facing each other in the second direction DR2, the horizontal portion HP41 of the fourth-first gate node GN41 may be disposed at the imaginary center line CTL disposed between sides of the second-second pixel electrode PE22 and the fourth-first pixel electrode PE41 adjacent to and facing each other in the second direction DR2, the horizontal portion HP42 of the fourth-second gate node GN42 may be disposed at the imaginary center line CTL disposed between sides of the second-third pixel electrode PE23 and the fourth-third pixel electrode PE43 adjacent to and facing each other in the second direction DR2, and the horizontal portion HP43 of the fourth-third gate node GN43 may be disposed at the imaginary center line CTL disposed between sides of the second-third pixel electrode PE23 and the fourth-third pixel electrode PE43 adjacent to and facing each other in the second direction DR2. Accordingly, the horizontal portions HP31 to HP43 of the gate nodes GN31 to GN43 may be arranged in a row along the imaginary center line CTL parallel to the first direction DR1. Here, the imaginary center line CTL may be disposed at the center with respect to the distance (for example, D1) between the pixel electrodes (for example, the first-third pixel electrode PE13 and the third-third pixel electrode PE33) adjacent to and facing each other in the second direction DR2 (for example, the extension direction of the data line).

Meanwhile, the distance D1 may be the same as the distance between the pixel electrodes (for example, the first-second pixel electrode PE12 of the first unit pixel UPX1 and the third-first pixel electrode PE31 of the third unit pixel UPX3, or the second-second pixel electrode PE22 of the second unit pixel UPX2 and the fourth-first pixel electrode PE41 of the fourth unit pixel UPX4) disposed in different unit pixels and adjacent in the second direction DR2. Further, the distance D1 may be smaller than the distance between the pixel electrodes disposed in the same unit pixel and adjacent in the second direction DR2, for example, a distance between the first-first pixel electrode PE11 of the first unit pixel UPX1 and the first-second pixel electrode PE12 of the first unit pixel UPX1, or a distance between the second-first pixel electrode PE21 of the second unit pixel UPX2 and the second-second pixel electrode PE22 of the second unit pixel UPX2.

Meanwhile, the distance D2 may be greater than the distance between the pixel electrodes disposed in different unit pixels and adjacent in the second direction DR2, for example, a distance between the second-second pixel electrode PE22 of the second unit pixel UPX2 and the fourth-first pixel electrode PE41 of the fourth unit pixel UPX4. Further, the distance D2 may be greater than the distance between the pixel electrodes disposed in the same unit pixel and adjacent in the second direction DR2, for example, a distance between the third-first pixel electrode PE31 of the third unit pixel UPX3 and the third-second pixel electrode PE32 of the third unit pixel UPX3.

Figure 5A:
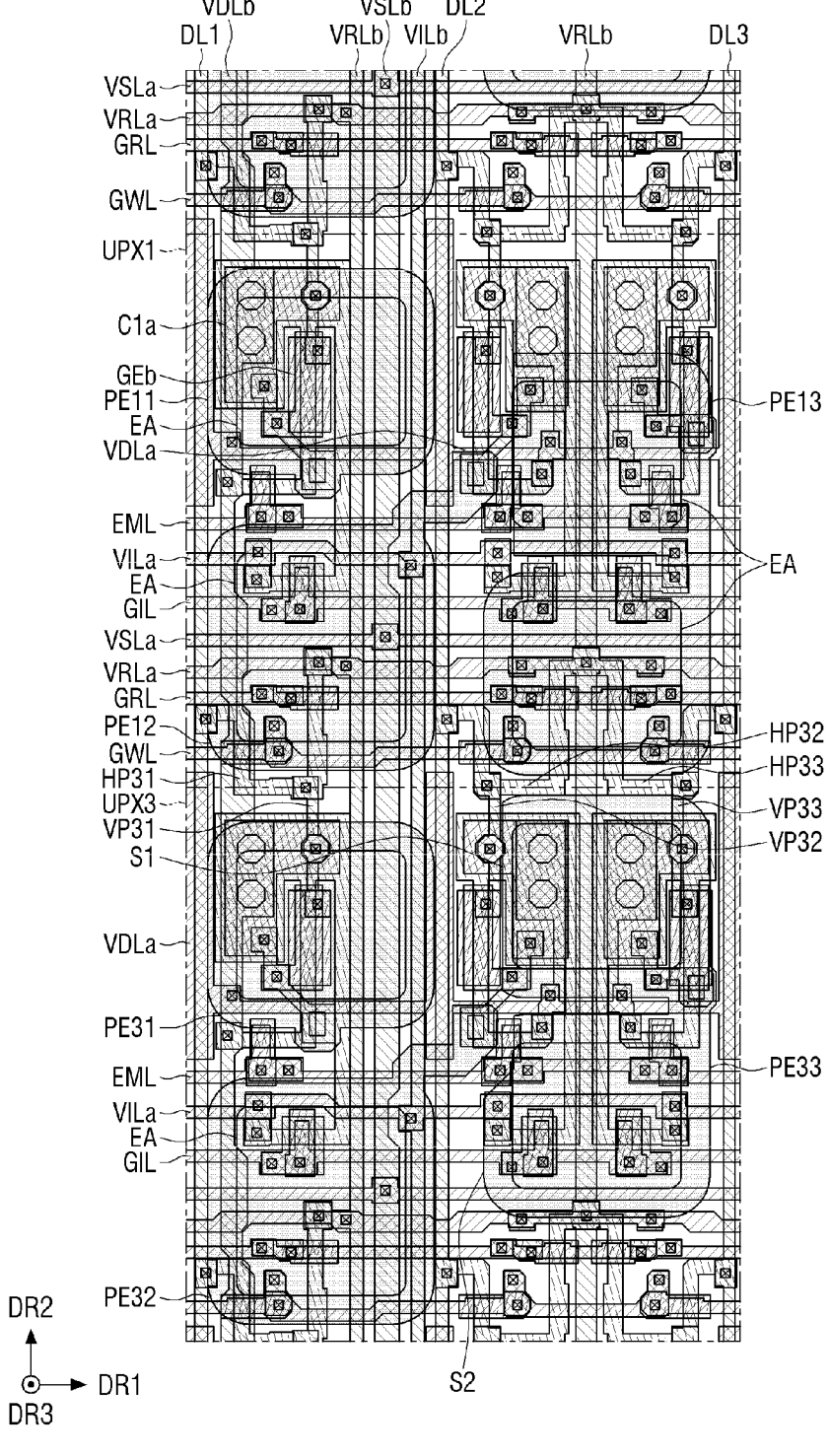
FIG. 5A is a detailed plan view of the first unit pixel and the third unit pixel of FIG. 4.
Figure 5B:
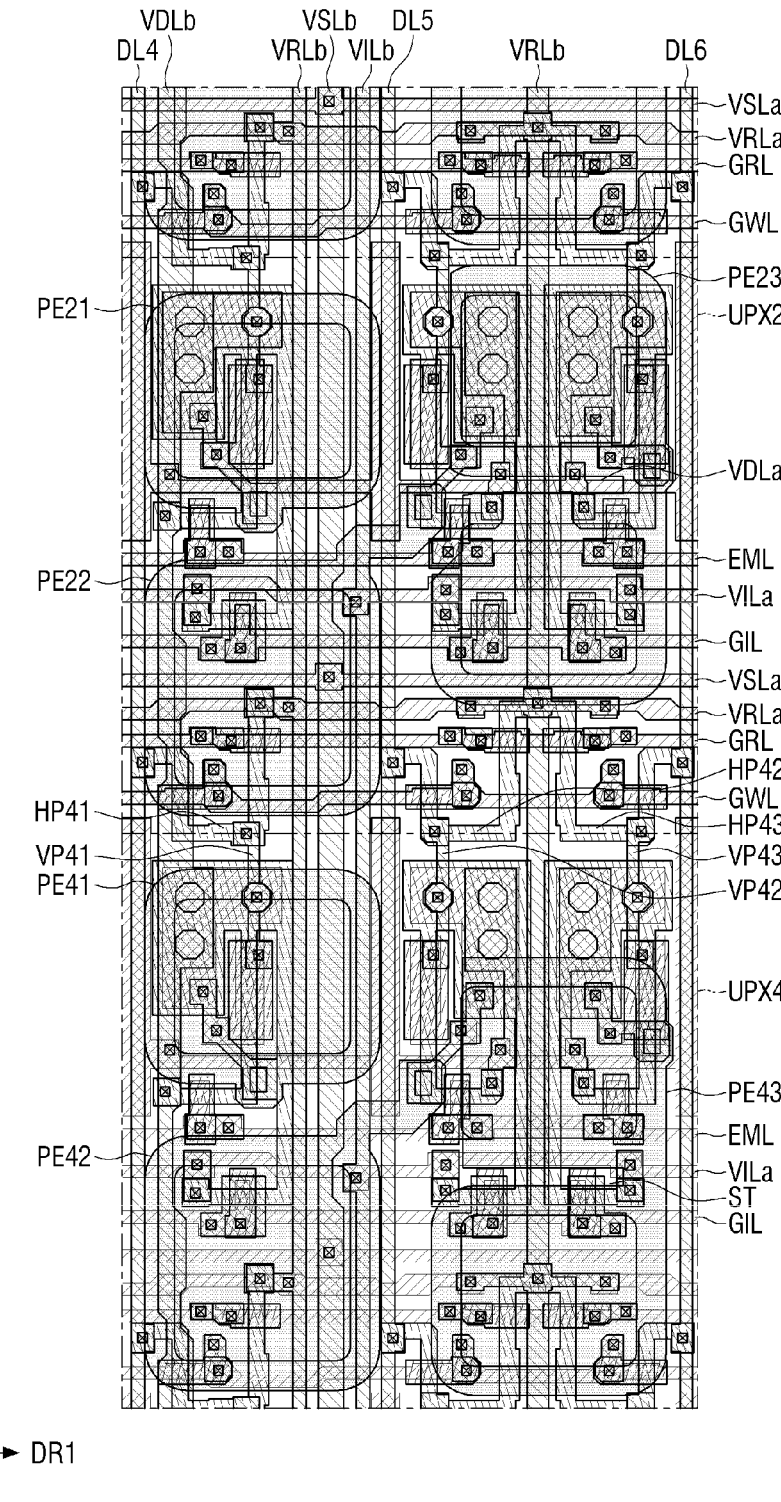
FIG. 5B is a detailed plan view of the second unit pixel and the fourth unit pixel of FIG. 4.
Figure 5C:
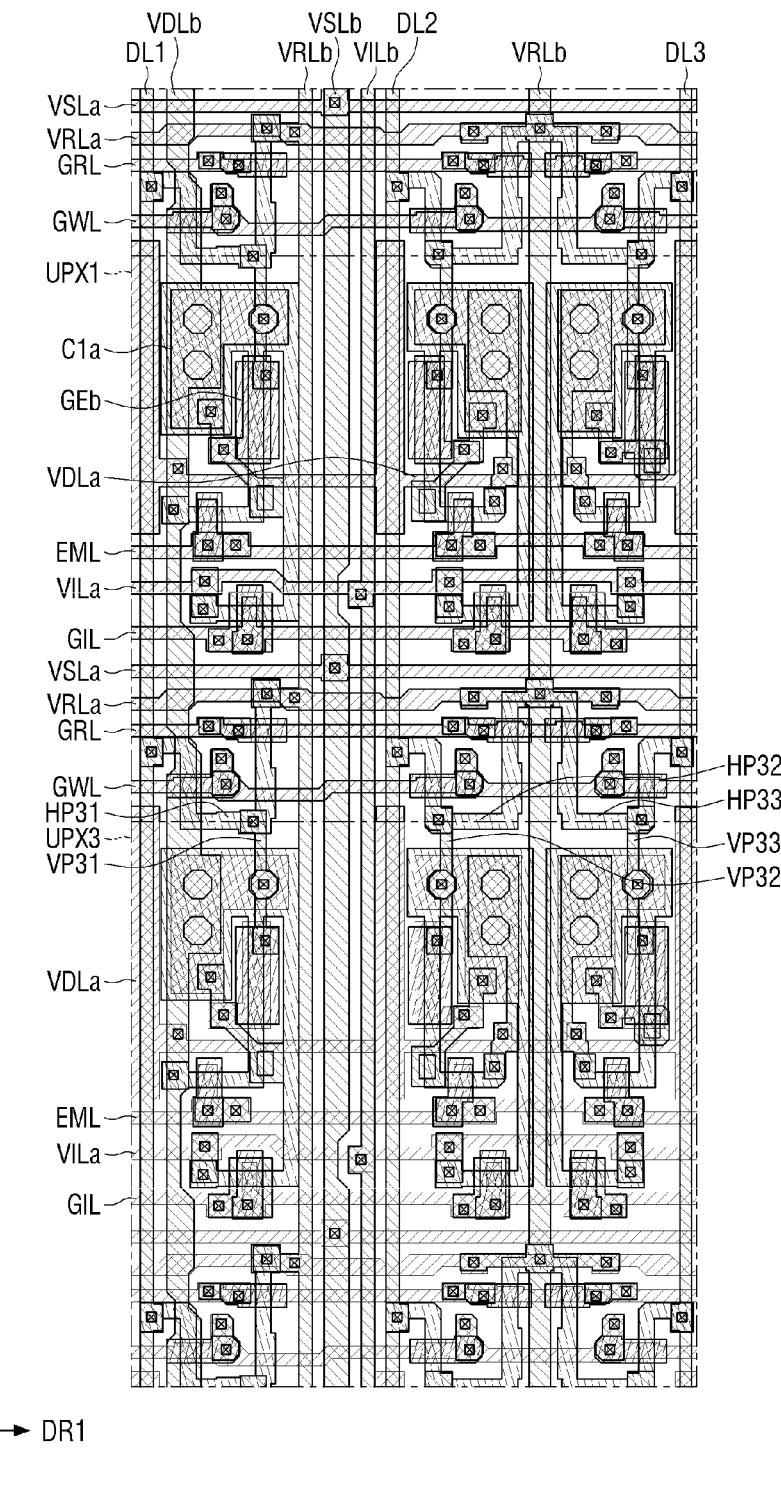
FIG. 5C is a plan view excluding pixel electrodes in FIG. 5A.
Figure 5D:
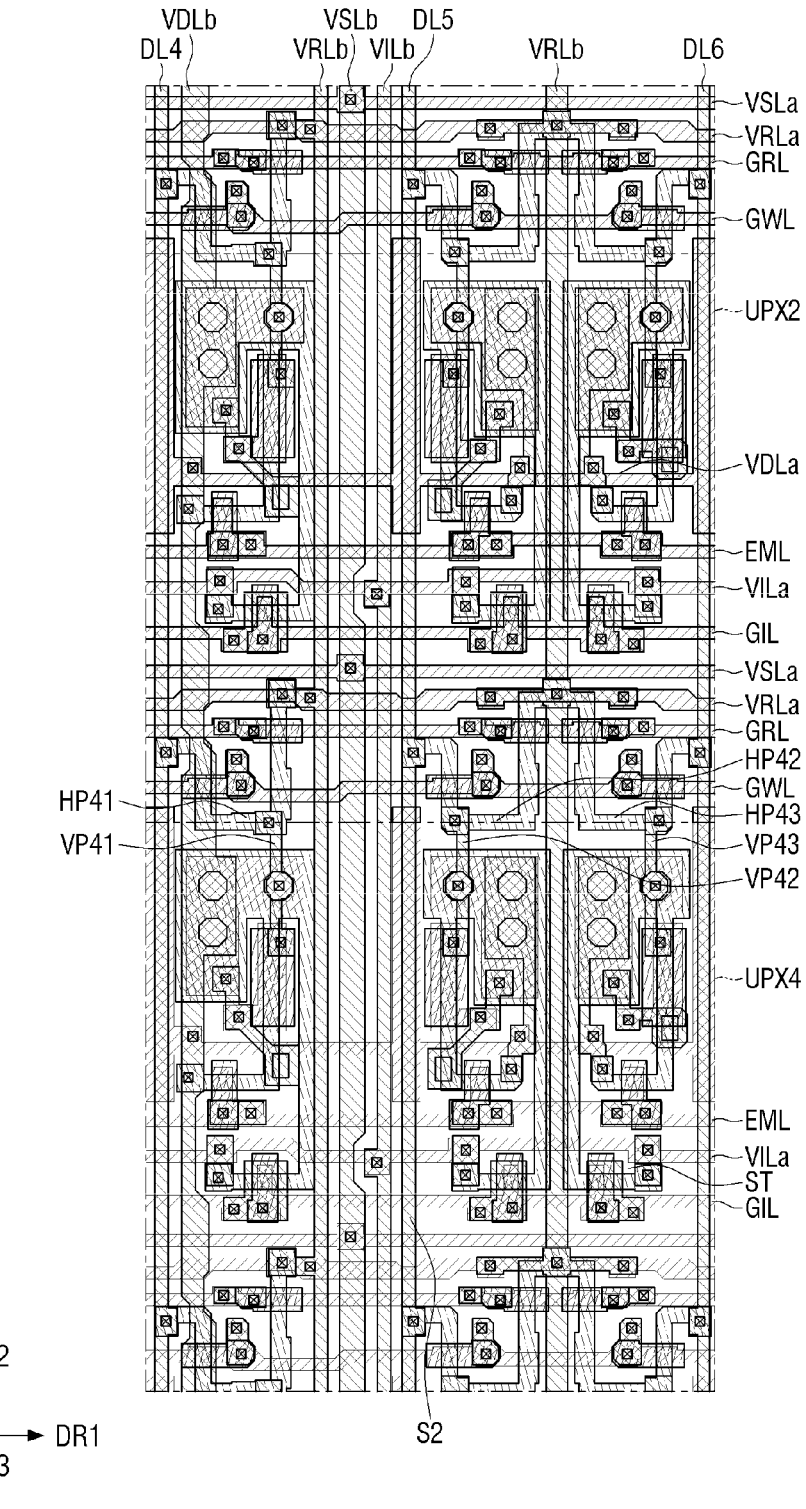
FIG. 5D is a plan view excluding pixel electrodes in FIG. 5B.
Figure 5E:
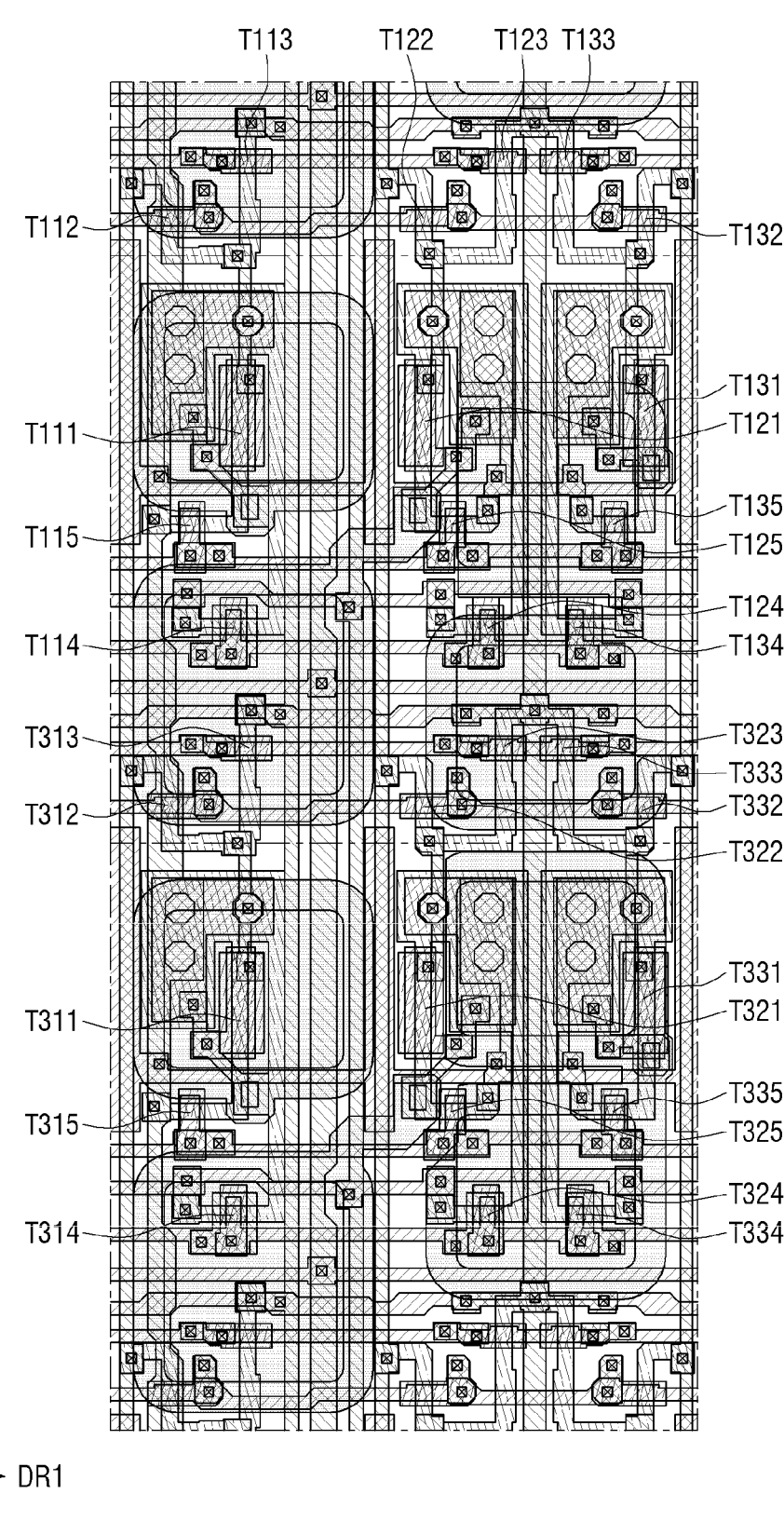
FIG. 5E is a plan view in which reference numerals of transistors in FIG. 5A are displayed.
Figure 5F:
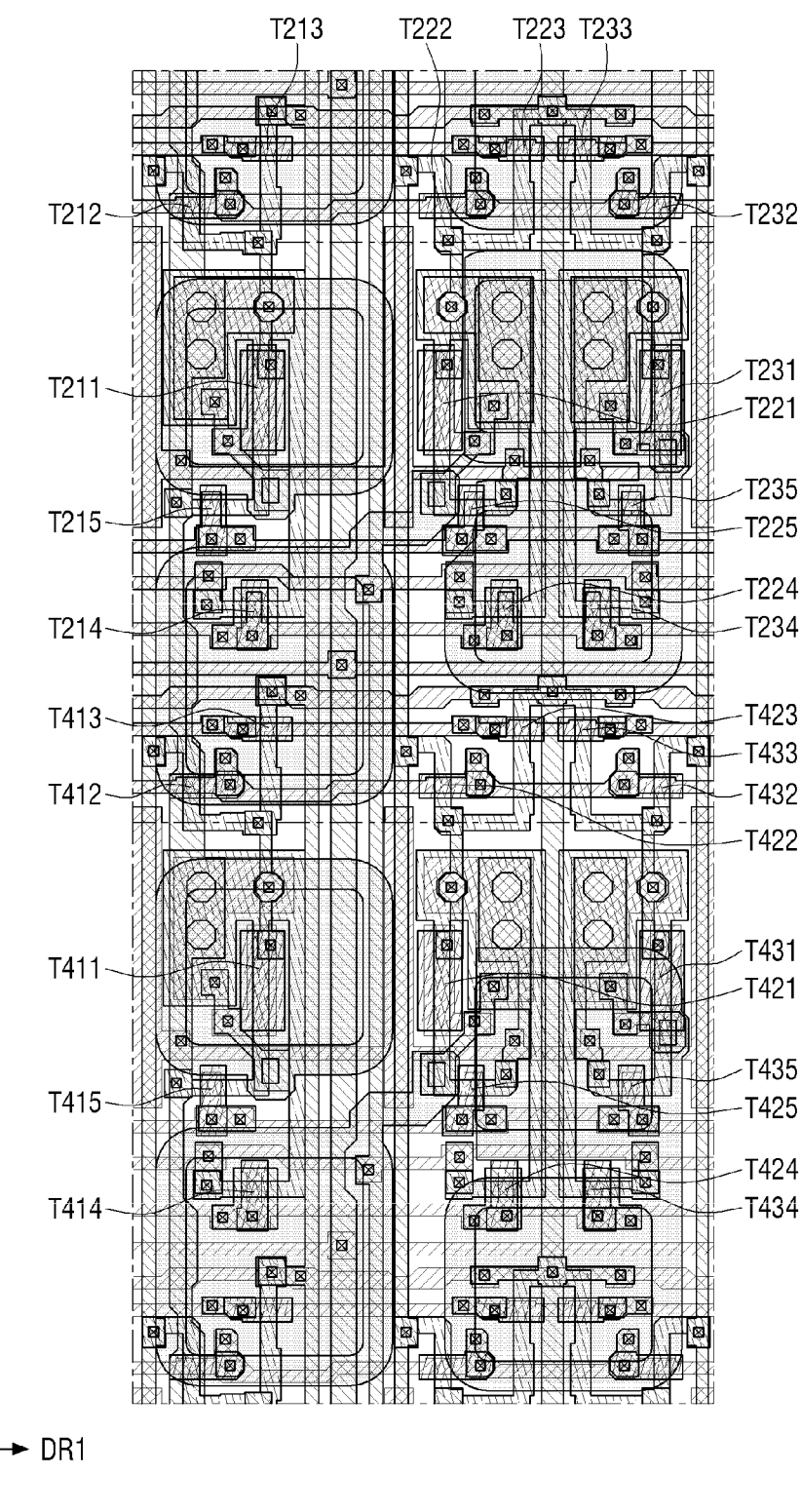
FIG. 5F is a plan view in which reference numerals of transistors in FIG. 5B are displayed.
Figure 6:
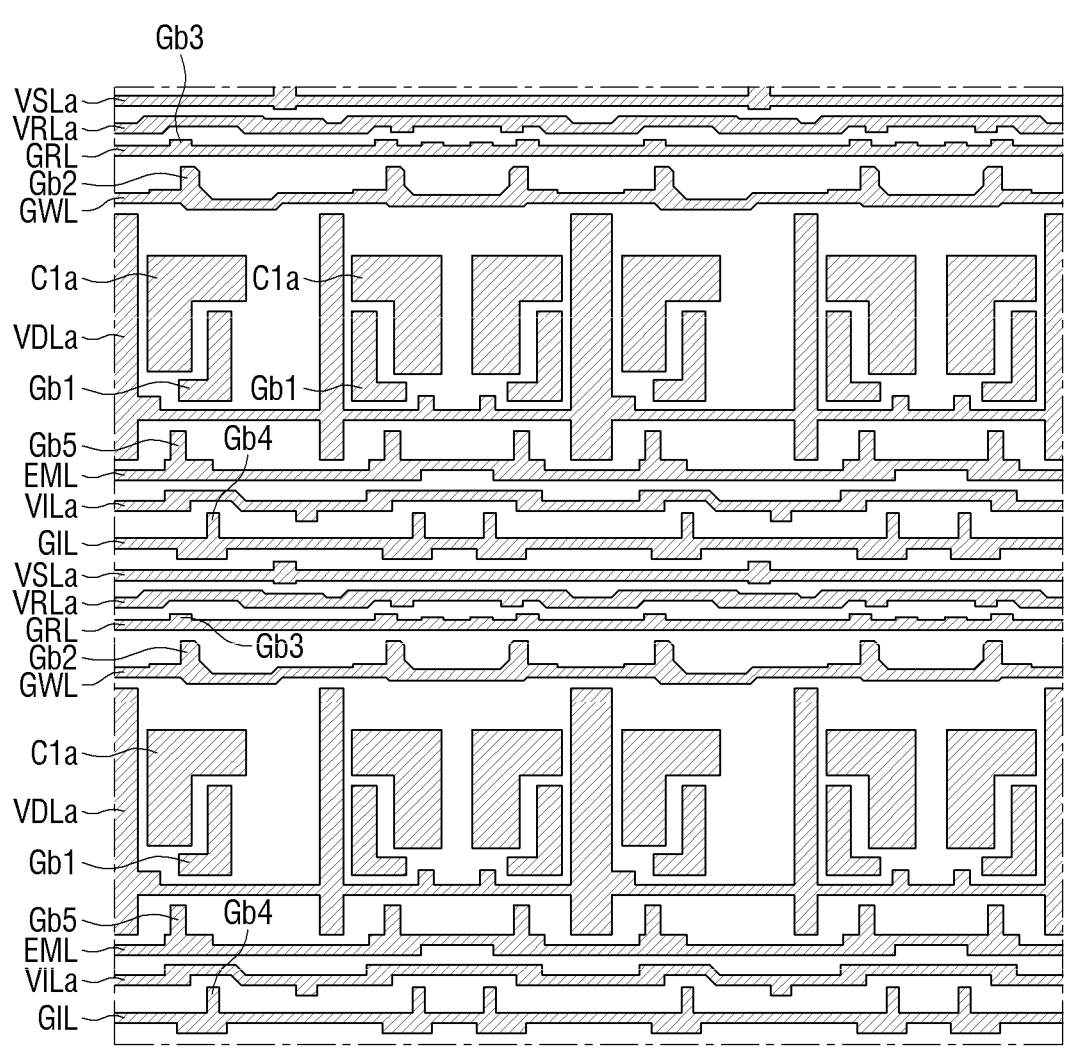
FIG. 6 is a plan view selectively showing only a first conductive layer among the components of FIGS. 5A and 5B.
Figure 6:
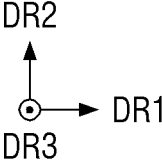
Figure 7:
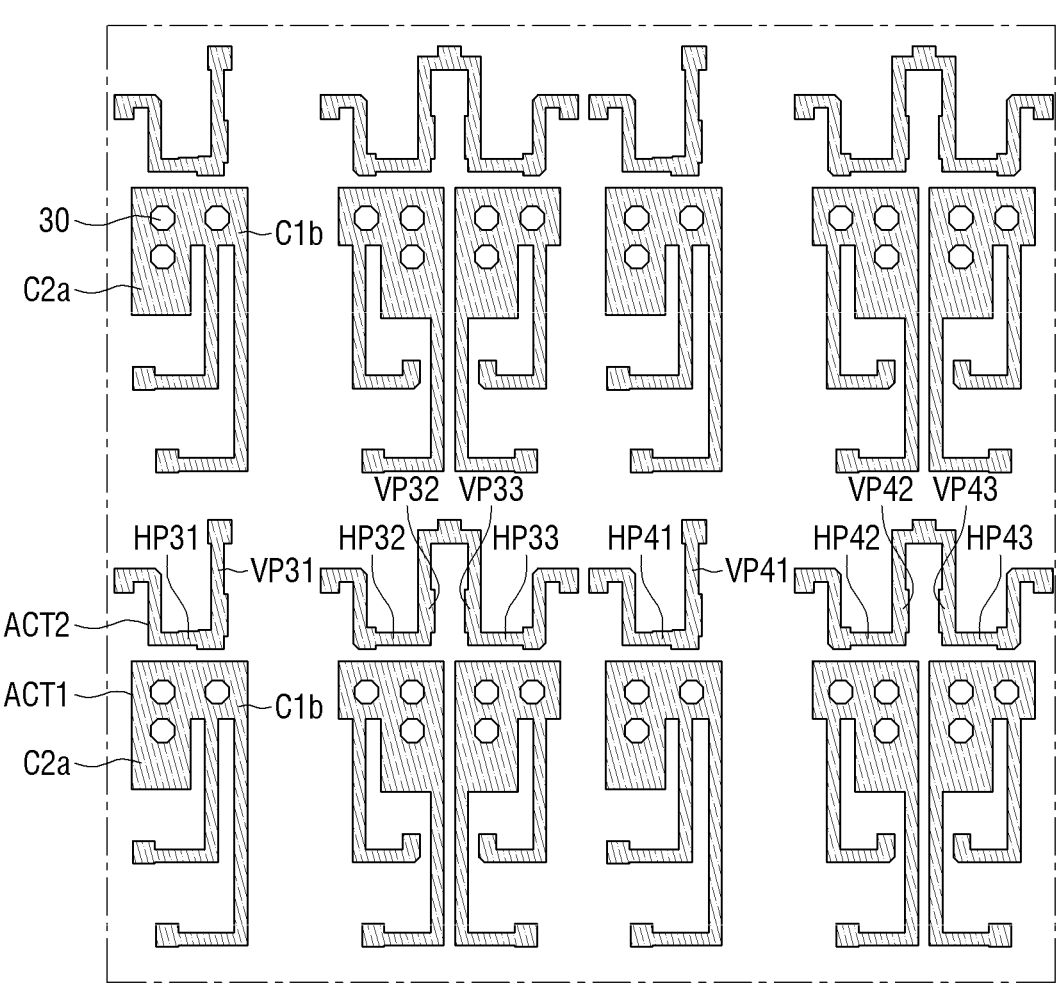
FIG. 7 is a plan view selectively showing only a second conductive layer among the components of FIGS. 5A and 5B.
Figure 7:
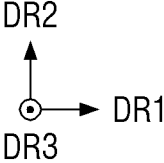
Figure 8:
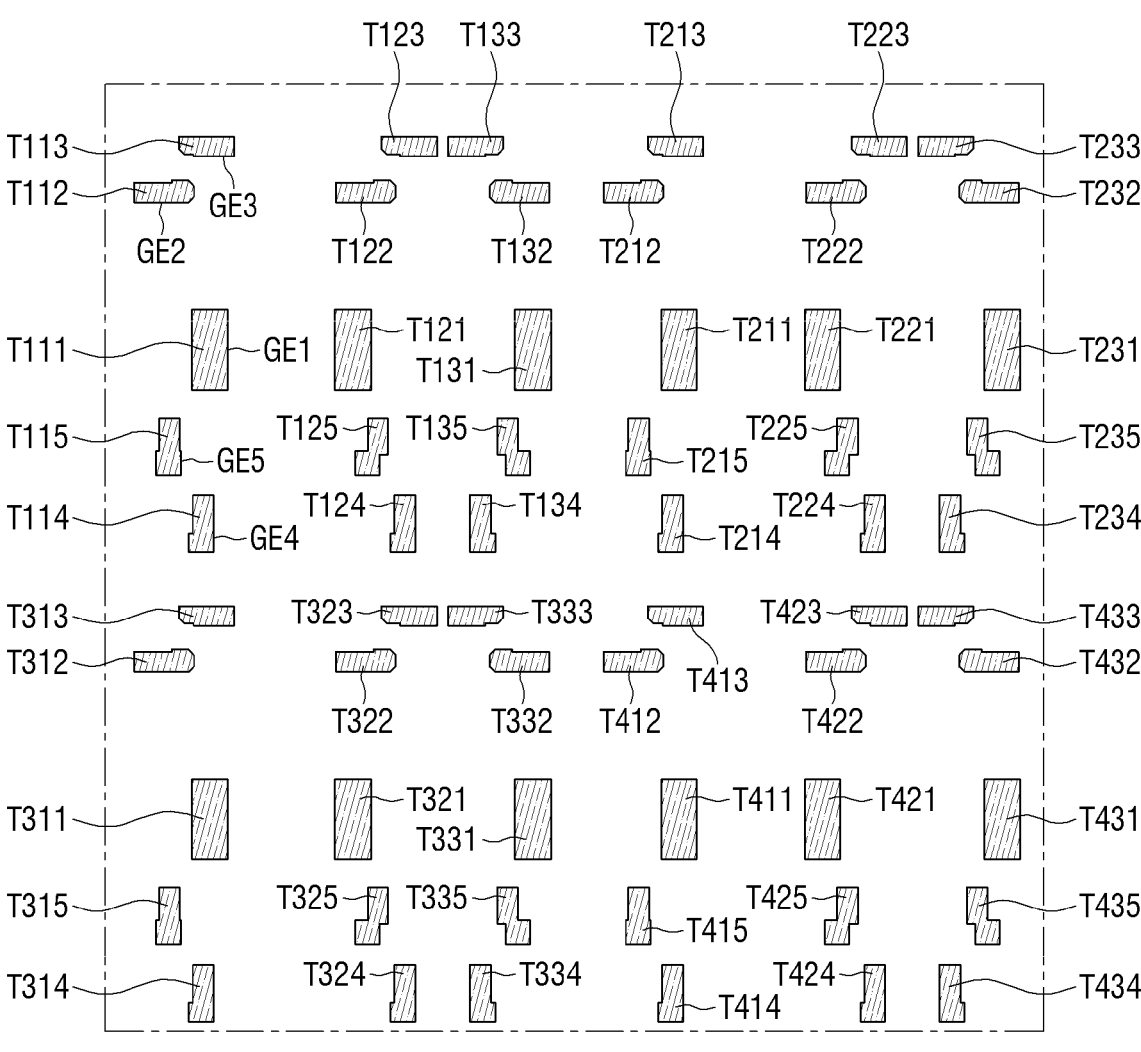
FIG. 8 is a plan view selectively showing only a third conductive layer among the components of FIGS. 5A and 5B.
Figure 8:
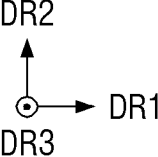
Figure 9:
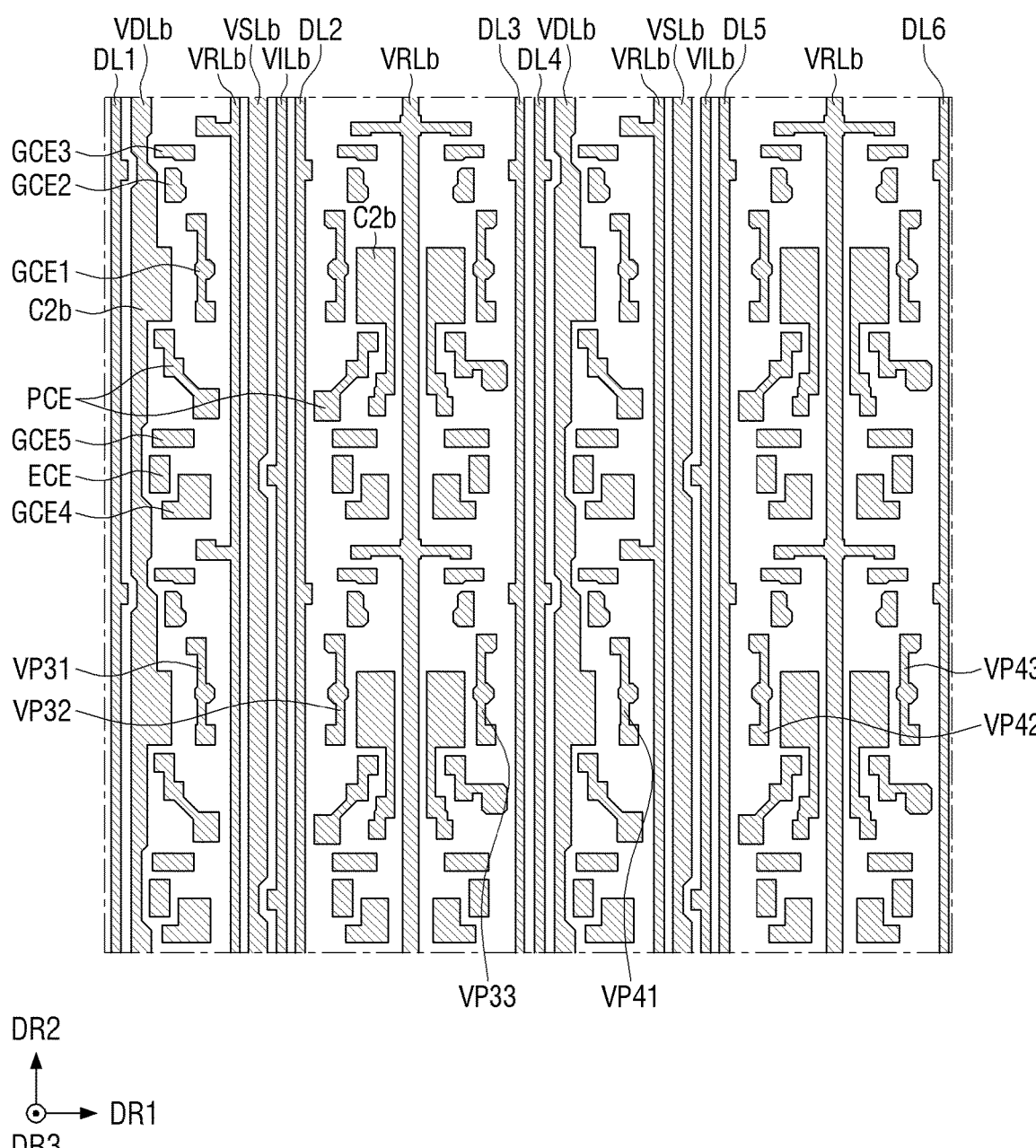
FIG. 9 is a plan view selectively showing only a fourth conductive layer among the components of FIGS. 5A and 5B.
Figure 10:
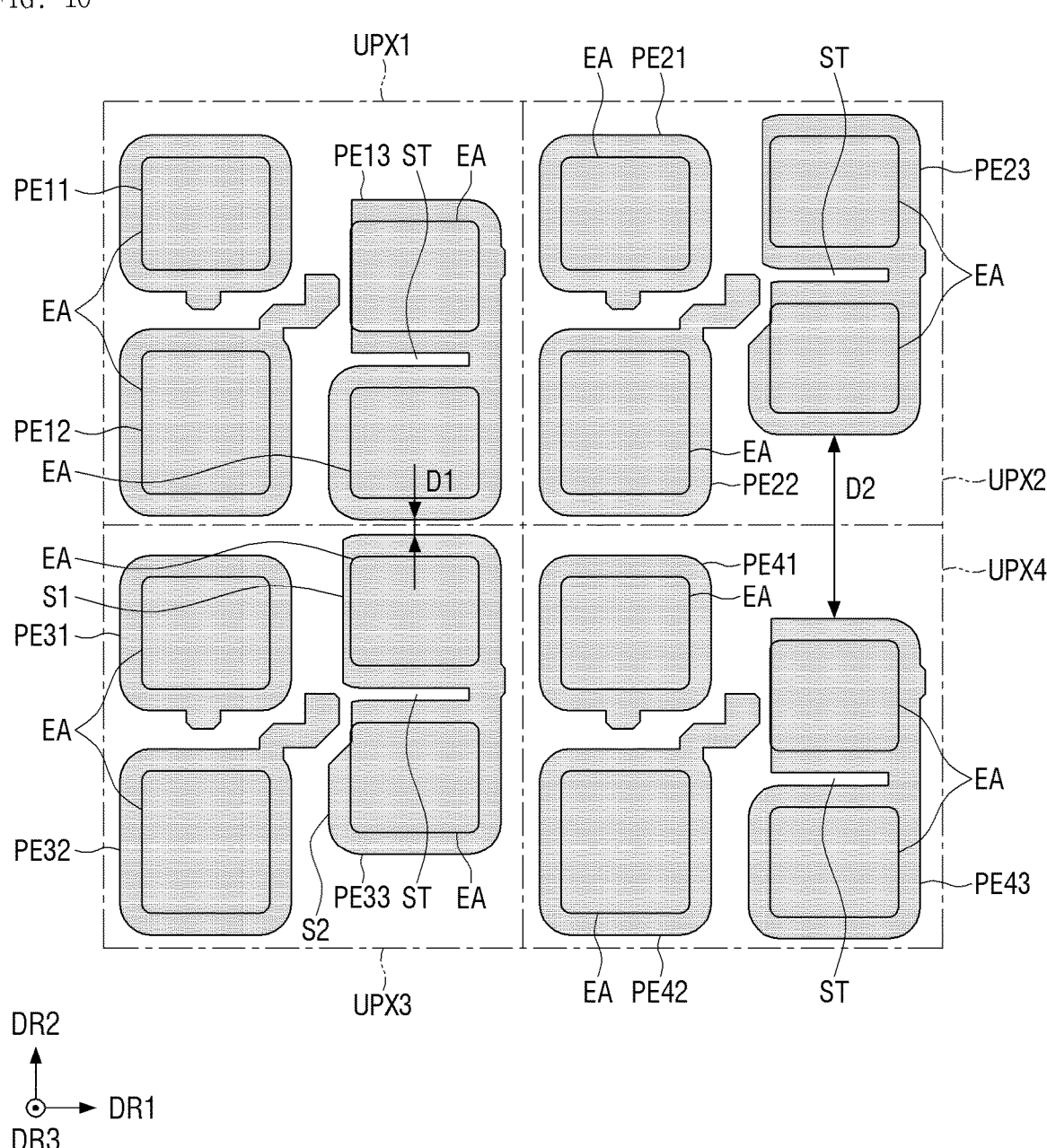
FIG. 10 is a plan view selectively showing only a fifth conductive layer among the components of FIGS. 5A and 5B.

FIG. 5A is a detailed plan view of the first unit pixel and the third unit pixel of FIG. 4, FIG. 5B is a detailed plan view of the second unit pixel and the fourth unit pixel of FIG. 4, FIG. 5C is a plan view excluding pixel electrodes in FIG. 5A, FIG. 5D is a plan view excluding pixel electrodes in FIG. 5B, FIG. 5E is a plan view showing reference numerals of transistors in FIG. 5A, FIG. 5F is a plan view showing reference numerals of transistors in FIG. 5B, FIG. 6 is a plan view selectively showing only a first conductive layer among the components of FIGS. 5A and 5B, FIG. 7 is a plan view selectively showing only a second conductive layer among the components of FIGS. 5A and 5B, FIG. 8 is a plan view selectively showing only a third conductive layer among the components of FIGS. 5A and 5B, FIG. 9 is a plan view selectively showing only a fourth conductive layer among the components of FIGS. 5A and 5B, and FIG. 10 is a plan view selectively showing only a fifth conductive layer among the components of FIGS. 5A and 5B.

The first conductive layer shown in FIGS. 5A to 5F and FIG. 6 may be disposed on a substrate SUB along the third direction DR3. The first conductive layer may serve as a voltage line for transmitting various voltages, a first lower capacitor electrode C1a, a counter gate electrode of each transistor, and a blocking layer for preventing light from entering the channel region of each transistor.

As shown in FIGS. 5A to 5F and 6, the first conductive layer may include a second lower driving voltage line VSLa, a lower reference voltage line VRLa, a third scan line GRL, a third counter gate electrode Gb3, a first scan line GWL, a second counter gate electrode Gb2, a first lower capacitor electrode C1a, a first counter gate electrode Gb1, a first lower driving voltage line VDLa, an emission control line EML, a fifth counter gate electrode Gb5, a lower initialization voltage line VILa, a second scan line GIL, and a fourth counter gate electrode Gb4.

The second lower driving voltage line VSLa, the lower reference voltage line VRLa, the third scan line GRL, the first scan line GWL, the first lower driving voltage line VDLa, the emission control line EML, the lower initialization voltage line VILa, and the second scan line GIL that are described above may extend along the first direction. Meanwhile, a part of the first lower driving voltage line VDLa may extend along the second direction.

The second lower driving voltage line VSLa and a second upper driving voltage line VSLb to be described later may be connected to each other through the contact hole formed through an insulating layer, thereby constituting the above-described second driving voltage line VSL. In other words, the second driving voltage line VSL may include the plurality of second lower driving voltage lines VSLa extending along the first direction DR1 and arranged along the second direction DR2, and the plurality of second upper driving voltage lines VSLb extending along the second direction DR2 intersecting the second lower driving voltage lines VSLa and arranged along the first direction DR1. The second driving voltage line VSL may have a mesh shape.

The lower reference voltage line VRLa and an upper reference voltage line VRLb to be described later may be connected to each other through the contact hole formed through the insulating layer, thereby constituting the above-described reference voltage line VRL. In other words, the lower reference voltage line VRLa may include the plurality of lower reference voltage lines VRLa extending along the first direction DR1 and arranged along the second direction DR2, and the plurality of upper reference voltage lines VRLb extending along the second direction DR2 intersecting the lower reference voltage lines VRLa and arranged along the first direction DR1. The reference voltage line VRL may have a mesh shape.

The first lower capacitor electrode C1a may constitute first capacitor C1 together with a first semiconductor layer ACT1 to be described later.

The first counter gate electrode Gb1 may function as the counter gate electrode of the first transistor (T111, T121, T131, T211, T221, T231, T311, T321, T331, T411, T421, or T431), the second counter gate electrode Gb2 may function as the counter gate electrode of the second transistor (T112, T122, T132, T212, T222, T232, T312, T322, T332, T412, T422, or T432), the third counter gate electrode Gb3 may function as the counter gate electrode of the third transistor (T113, T123, T133, T213, T223, T233, T313, T323, T333, T413, T423, or T433), the fourth counter gate electrode Gb4 may function as the counter gate electrode of the fourth transistor (T114, T124, T134, T214, T224, T234, T314, T324, T334, T414, T424, or T434), and the fifth counter gate electrode Gb5 may serve as the counter gate electrode of the fifth transistor (T115, T125, T135, T215, T225, T235, T315, T325, T335, T415, T425, or T435). As described above, the first to fifth transistors may be double gate transistors.

The second counter gate electrode Gb2 may be integrally formed with the first scan line GWL, the third counter gate electrode Gb3 may be integrally formed with the third scan line GRL, the fourth counter gate electrode Gb4 may be integrally formed with the second scan line GIL, and the fifth counter gate electrode Gb5 may be integrally formed with the emission control line EML. Meanwhile, the first counter gate electrode Gb1 may be connected to the pixel electrode and the first semiconductor layer ACT1 through the contact hole formed in the insulating layer and a pixel connection electrode PCE.

The first lower driving voltage line VDLa and a first upper driving voltage line VDLb to be described later may be connected to each other through the contact hole formed in the insulating layer, thereby constituting the above-described first driving voltage line VDL. In other words, the first driving voltage line VDL may include a horizontal portion extending along the first direction DR1 and a vertical portion extending from the horizontal portion in the second direction DR2 and in the second reverse direction. The first driving voltage line VDL configured as described above may have a mesh shape.

The first conductive layer may be formed as a single layer or multiple layers made of at least one of, for example, molybdenum (Mo), aluminum (Al), chromium (Cr), gold (Au), titanium (Ti), nickel (Ni), neodymium (Nd) and copper (Cu) or an alloy thereof. For another example, the light blocking layer BML may be an organic layer including a black pigment.

The second conductive layer shown in FIGS. 5A to 5F and FIG. 7 may be disposed on the first conductive layer along the third direction DR3, and an insulating layer may be disposed between the first conductive layer and the second conductive layer.

The second conductive layer may include the first semiconductor layer ACT1 and a second semiconductor layer ACT2 separated from each other.

The first semiconductor layer ACT1 may constitute the first transistors T111 to T431, the fourth transistors T114 to T434, and the fifth transistors T115 to T435 together with gate electrodes to be described later. For example, the first semiconductor layer ACT1 may include the first electrode (for example, any one of the source electrode and the drain electrode) of each of the first transistors T111 to T431, the second electrode (for example, the other one of the source electrode and the drain electrode) of each of the first transistors T111 to T431, the channel region of each of the first transistors T111 to T431, the first electrode (for example, any one of the source electrode and the drain electrode) of each of the fourth transistors T114 to T434, the second electrode (for example, the other one of the source electrode and the drain electrode) of each of the fourth transistors T114 to T434, the channel region of each of the fourth transistors T114 to T434, the first electrode (for example, any one of the source electrode and the drain electrode) of each of the fifth transistors T115 to T435, the second electrode (for example, the other one of the source electrode and the drain electrode) of each of the fifth transistors T115 to T435, and the channel region of each of the fifth transistors T115 to T435.

Further, the first semiconductor layer ACT1 may include a first upper capacitor electrode C1b and a second lower capacitor electrode C2a. The first upper capacitor electrode C1*b* may constitute the first capacitor C1 together with the above-described first lower capacitor electrode C1*a*. For example, the above-described first capacitor C1 may be formed in the region where the first lower capacitor electrode C1*a* and the first upper capacitor electrode C1*b* overlap.

Further, the first semiconductor layer ACT1 may have at least one hole 30 formed through the first semiconductor layer ACT1 along the third direction DR3. The hole 30 may be filled with an insulating layer (for example, an interlayer insulating layer ITL) to be described later. Since the interlayer insulating layer ITL is disposed between the inner wall of the hole 30 and the outer wall of the contact hole, the contact between the first semiconductor layer ACT1 and the conductive layer passing through the contact hole of the interlayer insulating layer ITL may be prevented.

The second semiconductor layer ACT2 may constitute the second transistors T112 to T432 and the third transistors T113 to T433 together with gate electrodes to be described later. For example, the second semiconductor layer ACT2 may include the first electrode (for example, any one of the source electrode and the drain electrode) of each of the second transistors T112 to T432, the second electrode (for example, the other one of the source electrode and the drain electrode) of each of the second transistors T112 to T432, the channel region of each of the second transistors T112 to T432, the first electrode (for example, any one of the source electrode and the drain electrode) of each of the third transistors T113 to T433, the second electrode (for example, the other one of the source electrode and the drain electrode) of each of the third transistors T113 to T433, and the channel region of each of the third transistors T113 to T433.

Further, the portion of the second semiconductor layer ACT2 that extends along the first direction DR1 may correspond to the horizontal portions HP31 to HP43 of the gate nodes GN31 to GN43 described above. For example, the horizontal portion HP31 of the third-first gate node GN31, the horizontal portion HP32 of the third-second gate node GN32, the horizontal portion HP33 of the third-third gate node GN33, the horizontal portion HP41 of the fourth-first gate node GN41, the horizontal portion HP42 of the fourth-second gate node GN42, and the horizontal portion HP43 of the fourth-third gate node GN43 may include a part of the second semiconductor layer ACT2.

Further, the portion of the second semiconductor layer ACT2 that extends along the second direction DR2 and is connected to the reference voltage line VRL may correspond to the vertical portions VP31 to VP43 of the gate nodes GN31 to GN43 described above. For example, the vertical portion VP31 of the third-first gate node GN31, the vertical portion VP32 of the third-second gate node GN32, the vertical portion VP33 of the third-third gate node GN33, the vertical portion VP41 of the fourth-first gate node GN41, the vertical portion VP42 of the fourth-second gate node GN42, and the vertical portion VP43 of the fourth-third gate node GN43 may include another part of the second semiconductor layer ACT2.

The first and second semiconductor layers ACT1 and ACT2 may include polycrystalline silicon, monocrystalline silicon, low-temperature polycrystalline silicon, amorphous silicon, or an oxide semiconductor material. When the semiconductor layer includes polycrystalline silicon or an oxide semiconductor material, in the semiconductor layer, the first electrode (for example, any one of the source electrode and the drain electrode) and the second electrode (for example, the other one of the source electrode and the drain electrode described above) may be conductive regions (for example, the source region and the drain region) having conductivity by ion doping.

The third conductive layer shown in FIGS. 5A to 5F and FIG. 8 may be disposed on the second conductive layer along the third direction DR3, and an insulating layer may be disposed between the second conductive layer and the third conductive layer.

The third conductive layer may include a plurality of gate electrodes GE1, GE2, GE3, GE4, and GE5 separated from each other. For example, the third conductive layer may include the first gate electrode GE1 of each of the first transistors T111 to T431, the second gate electrode GE2 of each of the second transistors T112 to T432, the third gate electrode GE3 of each of the third transistors T113 to T433, the fourth gate electrode GE4 of each of the fourth transistors T114 to T434, and the fifth gate electrode GE5 of each of the fifth transistors T115 to T435.

The first gate electrode GE1 may be disposed to overlap the first counter gate electrode Gb1 with the first semiconductor layer ACT1 interposed therebetween, the second gate electrode GE2 may be disposed to overlap the second counter gate electrode Gb2 with the second semiconductor layer ACT2 interposed therebetween, the third gate electrode GE3 may be disposed to overlap the third counter gate electrode Gb3 with the second semiconductor layer ACT2 interposed therebetween, the fourth gate electrode GE4 may be disposed to overlap the fourth counter gate electrode Gb4 with the first semiconductor layer ACT1 interposed therebetween, and the fifth gate electrode GE5 may be disposed to overlap the fifth counter gate electrode Gb5 with the first semiconductor layer ACT1 interposed therebetween.

The third conductive layer may be formed as a single layer or multiple layers made of at least one of, for example, molybdenum (Mo), aluminum (Al), chromium (Cr), gold (Au), titanium (Ti), nickel (Ni), neodymium (Nd) and copper (Cu) or an alloy thereof.

The fourth conductive layer shown in FIGS. 5A to 5F and FIG. 9 may be disposed on the third conductive layer along the third direction DR3, and an insulating layer may be disposed between the third conductive layer and the fourth conductive layer.

As shown in FIG. 9, the fourth conductive layer may include the first data line DL1 extending along the second direction DR2, the first upper driving voltage line VDLb, the upper reference voltage line VRLb, an upper initialization voltage line VILb, the second data line DL2, the third data line DL3, the fourth data line DL4, the second upper driving voltage line VSLb, the fifth data line DL5, the pixel connection electrode PCE, a first gate connection electrode GCE1, a second gate connection electrode GCE2, a third gate connection electrode GCE3, a fourth gate connection electrode GCE4, a fifth gate connection electrode GCE5, a wire connection electrode ECE, and a second upper capacitor electrode C2*b*. Here, the second upper capacitor electrode C2*b* may be a part of the first upper driving voltage line VDLb, or may be provided separately from the first upper driving voltage line VDLb. The second upper capacitor electrode C2*b* separated from the first upper driving voltage line VDLb may be connected to the first lower driving voltage line VDLa through a contact hole formed through the insulating layer.

The first data line DL1, the first upper driving voltage line VDLb, the upper reference voltage line VRLb, the upper initialization voltage line VILb, the second data line DL2, the third data line DL3, the fourth data line DL4, the second upper driving voltage line VSLb, and the fifth data line DL5 that are described above may extend along the second direction DR2.

The first upper driving voltage line VDLb may be connected to the first lower driving voltage line VDLa through a contact hole formed through the insulating layer.

The second upper driving voltage line VSLb may be connected to the second lower driving voltage line VSLa through a contact hole formed through the insulating layer.

The upper reference voltage line VRLb may be connected to the lower reference voltage line VRLa through a contact hole formed through the insulating layer.

The upper initialization voltage line VILb may be connected to the lower initialization voltage line VILa through a contact hole formed through the insulating layer.

The first to sixth data lines DL1 to DL6 may be connected to the semiconductor layers ACT1 and ACT2 through a contact holes formed through the insulating layer.

The first gate connection electrode GCE1 may connect the first gate electrodes GE1 of the first transistors T111 to T431 to the second transistors T112 to T432, the third transistors T113 to T433, and the first lower capacitor electrode C1$a$ through a contact hole formed through the insulating layer.

Further, the first gate connection electrode GCE1 may correspond to the vertical portions VP31 to VP43 of the gate nodes GN31 to GN43 described above. For example, as shown in FIG. 9, the plurality of first gate connection electrodes GCE1 may correspond to the vertical portions (for example, the lower vertical portions VP31 to VP43) of the third-first gate node GN31, the third-second gate node GN32, the third-third gate node GN33, the fourth-first gate node GN41, the fourth-second gate node GN42, and the fourth-third gate node GN43.

The second gate connection electrode GCE2 may connect the second gate electrode GE2 of the second transistors T112 to T432 to the first scan line GWL through a contact hole formed through the insulating layer.

The third gate connection electrode GCE3 may connect the third gate electrode GE3 of the third transistors T113 to T433 to the third scan line GRL through a contact hole formed through the insulating layer.

The fourth gate connection electrode GCE4 may connect the fourth gate electrode GE4 of the fourth transistors T114 to T434 to the second scan line GIL through a contact hole formed through the insulating layer.

The fifth gate connection electrode GCE5 may connect the fifth gate electrode GE5 of the fifth transistors T115 to T435 to the emission control line EML through a contact hole formed through the insulating layer.

The wire connection electrode ECE may connect the first electrodes (for example, the source electrode or the drain electrode) of the fourth transistors T114 to T434 and the lower initialization voltage line VILa to each other through a contact holes formed through the insulating layer.

The second upper capacitor electrode C2$b$ may constitute the second capacitor C2 together with the above-described second lower capacitor electrode C2$a$. For example, the second capacitor C2 may be formed in the region where the second upper capacitor electrode C2$b$ and the second lower capacitor electrode C2$a$ overlap.

The fifth conductive layer shown in FIGS. 5A to 5F and FIG. 10 may be disposed on the fourth conductive layer along the third direction DR3, and an insulating layer may be disposed between the fourth conductive layer and the fifth conductive layer.

The fifth conductive layer may include the first-first pixel electrode PE11, the first-second pixel electrode PE12, the first-third pixel electrode PE13, the second-first pixel electrode PE21, the second-second pixel electrode PE22, the second-third pixel electrode PE23, the third-first pixel electrode PE31, the third-second pixel electrode PE32, the third-third pixel electrode PE33, the fourth-first pixel electrode PE41, the fourth-second pixel electrode PE42, and the fourth-third pixel electrode PE43.

Among the pixel electrodes included in one unit pixel, the first-third pixel electrode PE13, the second-third pixel electrode PE23, the third-third pixel electrode PE33, and the fourth-third pixel electrode PE43 having the largest area may have slits ST. For example, the slit ST may be disposed at the center of the third pixel electrode (for example, the third-third pixel electrode PE33). Further, the slit ST may extend in the first direction DR1 to bisect the third pixel electrode along the second direction DR2. Further, one side of the slit ST may be opened toward the adjacent second pixel electrode (for example, the third-first pixel electrode PE31) in the third unit pixel UPX3 including the third-third pixel electrode PE33. The third-third pixel PX33 including the third-third pixel electrode PE33 may have two emission areas EA separated from each other by the slit ST. For example, the two separated emission areas EA may face each other in the second direction DR2 with the slit ST interposed therebetween.

Further, the first side S1 and the second side S2 of each third pixel electrode may be divided by the slit ST.

The pixel electrodes PE11 to PE43 may be connected to the first counter gate electrodes Gb1 of the first transistors T111 to T431 through contact holes formed through the insulating layer and the pixel connection electrodes PCE.

Figure 11A:
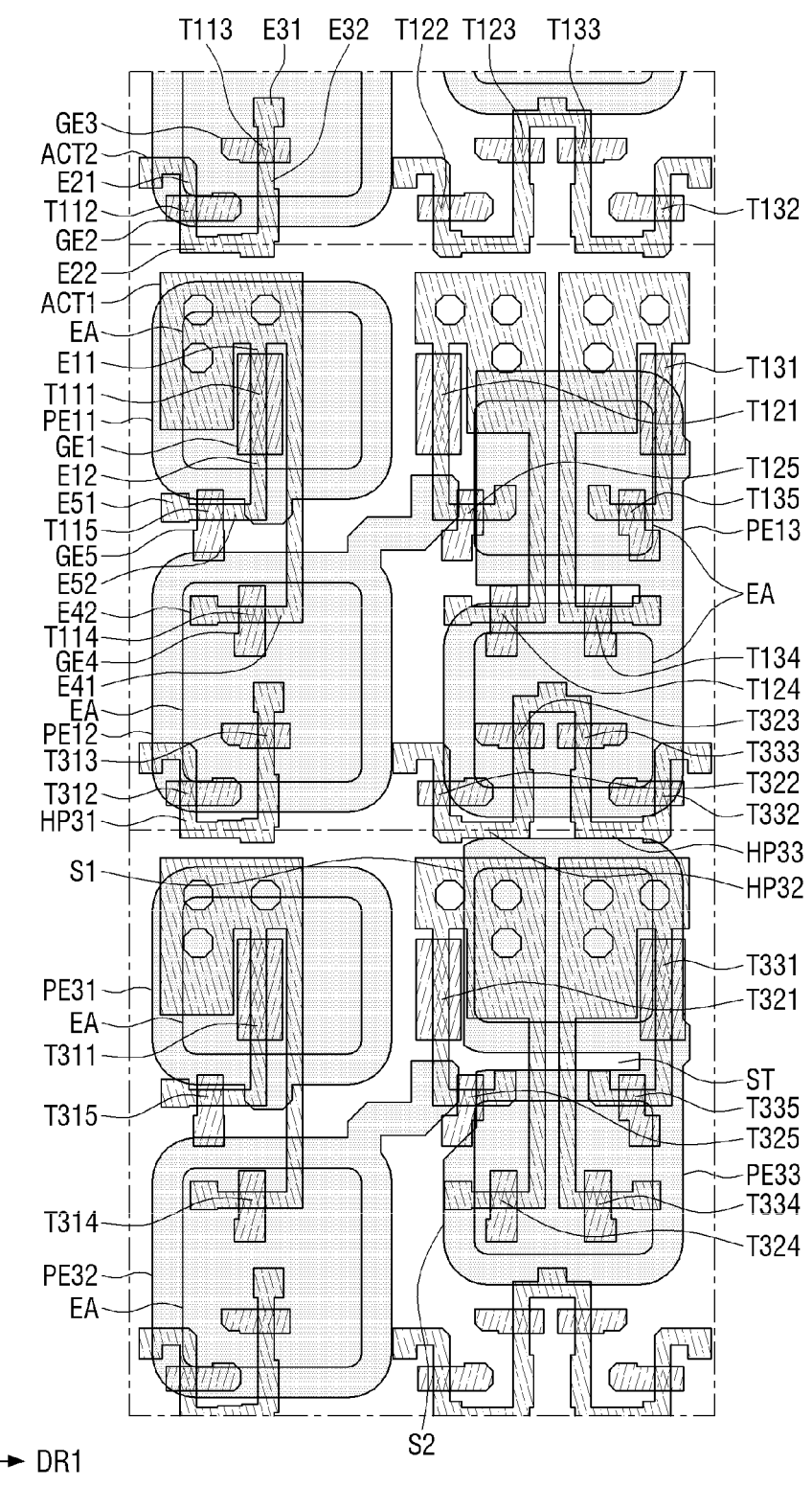
FIG. 11A is a plan view selectively showing only the second conductive layer, the third conductive layer, and the fifth conductive layer among the components of FIG. 5A.
Figure 11B:
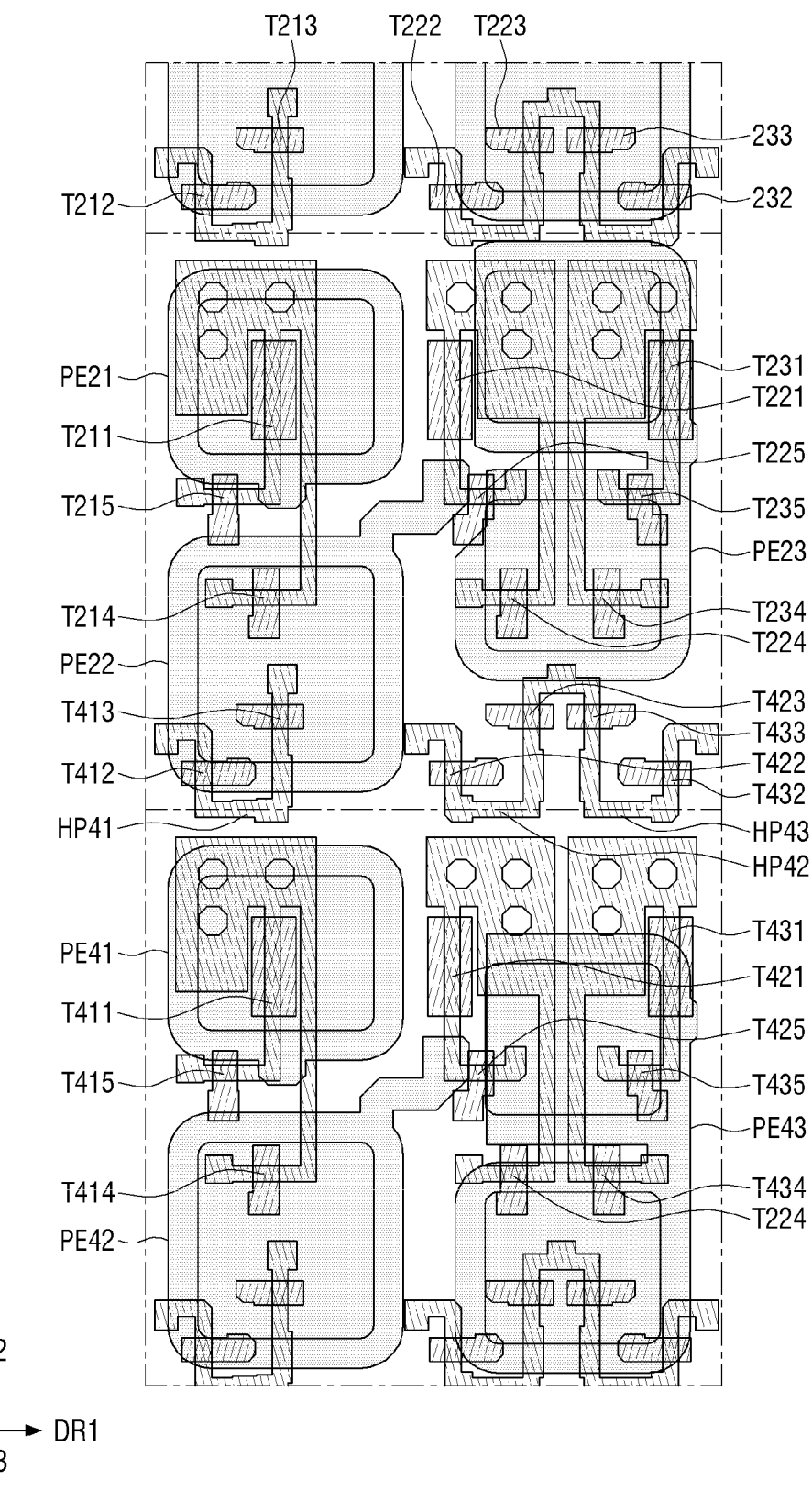
FIG. 11B is a plan view selectively showing only the second conductive layer, the third conductive layer, and the fifth conductive layer among the components of FIG. 5B.

FIG. 11A is a plan view selectively showing only the second conductive layer, the third conductive layer, and the fifth conductive layer among the components of FIG. 5A, and FIG. 11B is a plan view selectively showing only the second conductive layer, the third conductive layer, and the fifth conductive layer among the components of FIG. 5B.

As shown in FIGS. 11A and 11B, the first-first pixel PX11 included in the first unit pixel UPX1 may include the first to fifth transistors T111, T112, T113, T114, and T115.

The first transistor T111 of the first-first pixel PX11 may include the first gate electrode GE1 overlapping the first semiconductor layer ACT1, a first electrode E11 formed in the first semiconductor layer ACT1 on one side of the first gate electrode GE1, and a second electrode E12 formed in the first semiconductor layer ACT1 on the other side of the first gate electrode GE1. In addition, the first transistor T111 of the first-first pixel PX11 may further include the first counter gate electrode Gb1 positioned to face the first gate electrode GE1 with the first semiconductor layer ACT1 interposed therebetween.

The second transistor T112 of the first-first pixel PX11 may include the second gate electrode GE2 overlapping the second semiconductor layer ACT2, a first electrode E21 formed in the second semiconductor layer ACT2 on one side of the second gate electrode GE2, and a second electrode E22 formed in the second semiconductor layer ACT2 on the other side of the second gate electrode GE2. In addition, the second transistor T112 of the first-first pixel PX11 may further include the second counter gate electrode Gb2 positioned to face the second gate electrode GE2 with the second semiconductor layer ACT2 interposed therebetween.

The third transistor T113 of the first-first pixel PX11 may include the third gate electrode GE3 overlapping the second semiconductor layer ACT2, a first electrode E31 formed in the second semiconductor layer ACT2 on one side of the third gate electrode GE3, and a second electrode E32 formed in the second semiconductor layer ACT2 on the other side of the third gate electrode GE3. In addition, the third transistor T113 of the first-first pixel PX11 may further include the third counter gate electrode Gb3 positioned to face the third gate electrode GE3 with the second semiconductor layer ACT2 interposed therebetween.

The fourth transistor T114 of the first-first pixel PX11 may include the fourth gate electrode GE4 overlapping the first semiconductor layer ACT1, a first electrode E41 formed in the first semiconductor layer ACT1 on one side of the fourth gate electrode GE4, and a second electrode E42 formed in the first semiconductor layer ACT1 on the other side of the fourth gate electrode GE4. In addition, the fourth transistor T114 of the first-first pixel PX11 may further include the fourth counter gate electrode Gb4 positioned to face the fourth gate electrode GE4 with the first semiconductor layer ACT1 interposed therebetween.

The fifth transistor T115 of the first-first pixel PX11 may include the fifth gate electrode GE5 overlapping the first semiconductor layer ACT1, a first electrode E51 formed in the first semiconductor layer ACT1 on one side of the fifth gate electrode GE5, and a second electrode E52 formed in the first semiconductor layer ACT1 on the other side of the fifth gate electrode GE5. In addition, the fifth transistor T115 of the first-first pixel PX11 may further include the fifth counter gate electrode Gb5 positioned to face the fifth gate electrode GE5 with the first semiconductor layer ACT1 interposed therebetween.

Meanwhile, the first to fifth transistors T121 to T435 of other pixels also have the same configurations as those of the first to fifth transistors T111 to T115 of the first-first pixel PX11 described above, so that the description of the first to fifth transistors T121 to T435 of other pixels refers to the description of the first to fifth transistors T111 to T115 of the first-first pixel PX11 described above.

Figure 12:
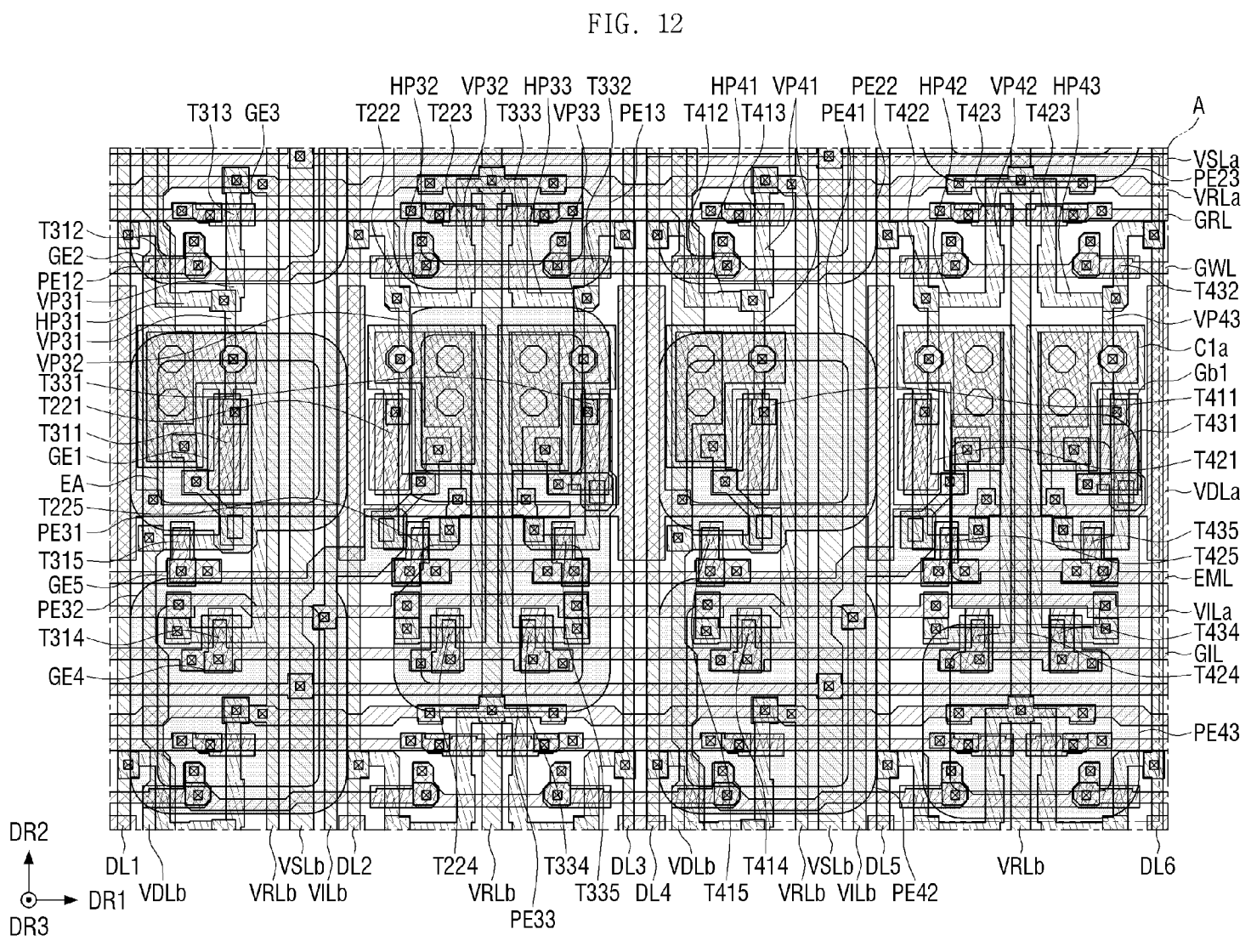
Figure 13:
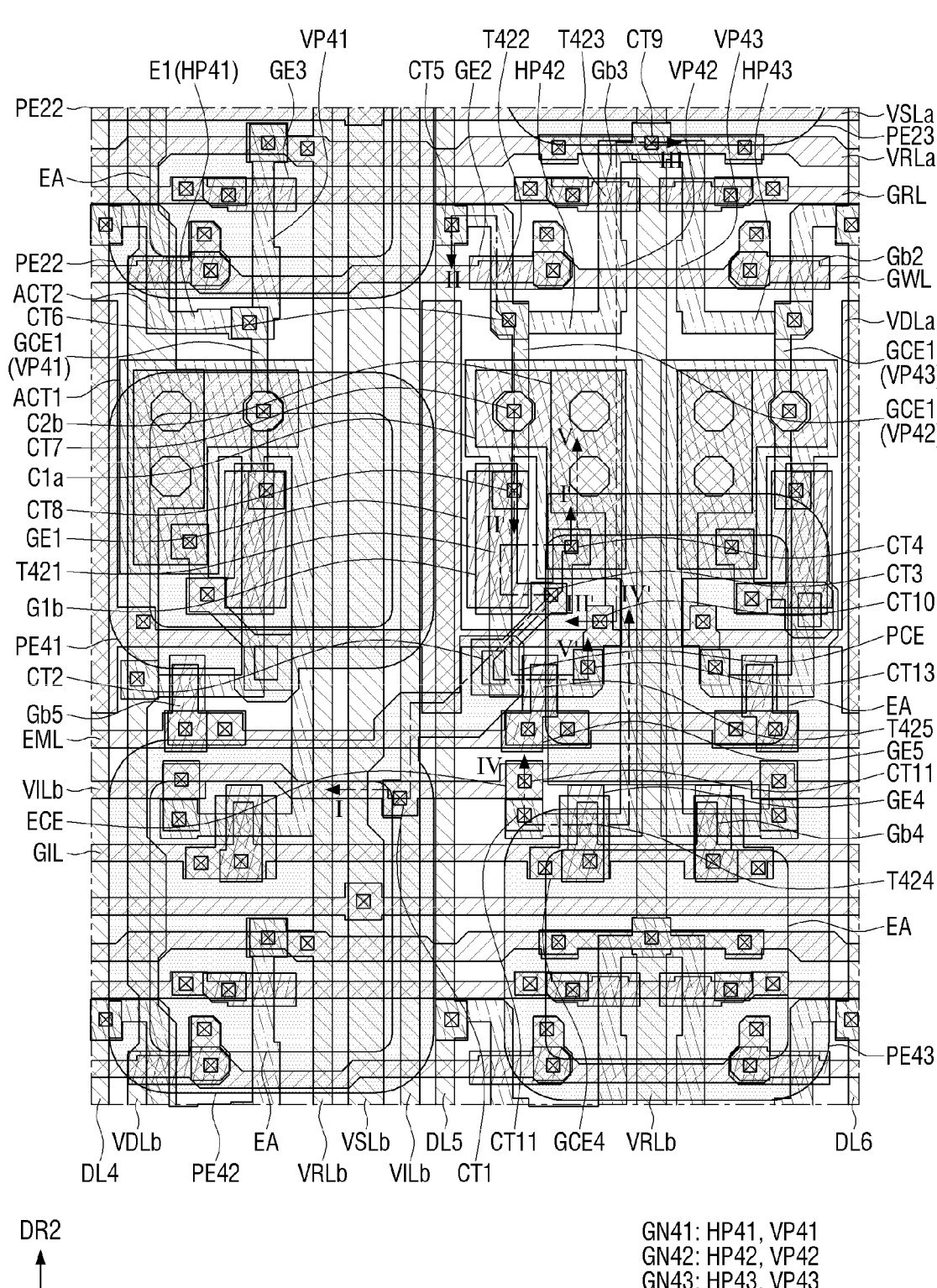
FIG. 13 is an enlarged view of area A of FIG. 12.
Figure 14:
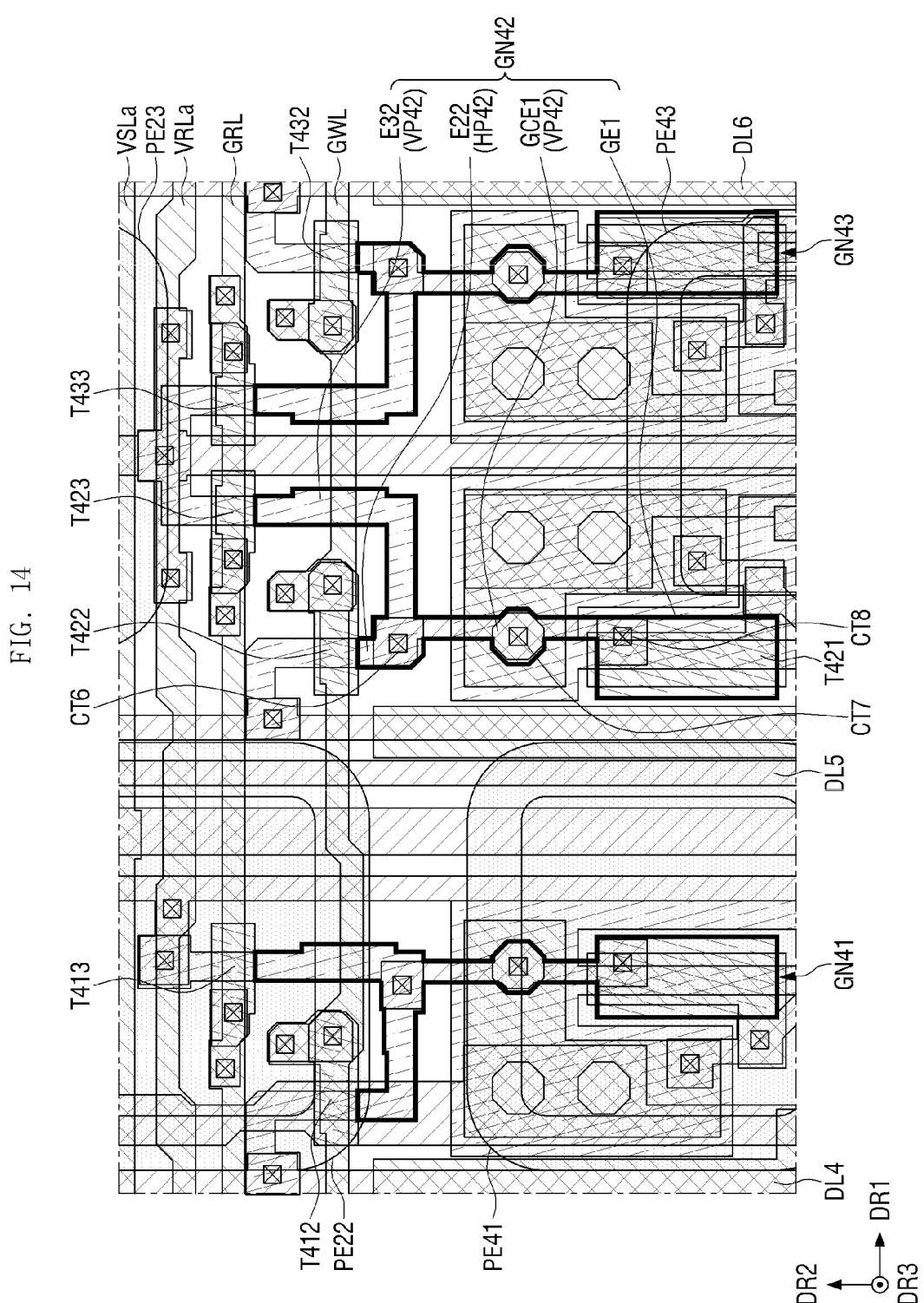
FIG. 14 is an enlarged view of the vicinity of the gate node of FIG. 13.
Figure 15:
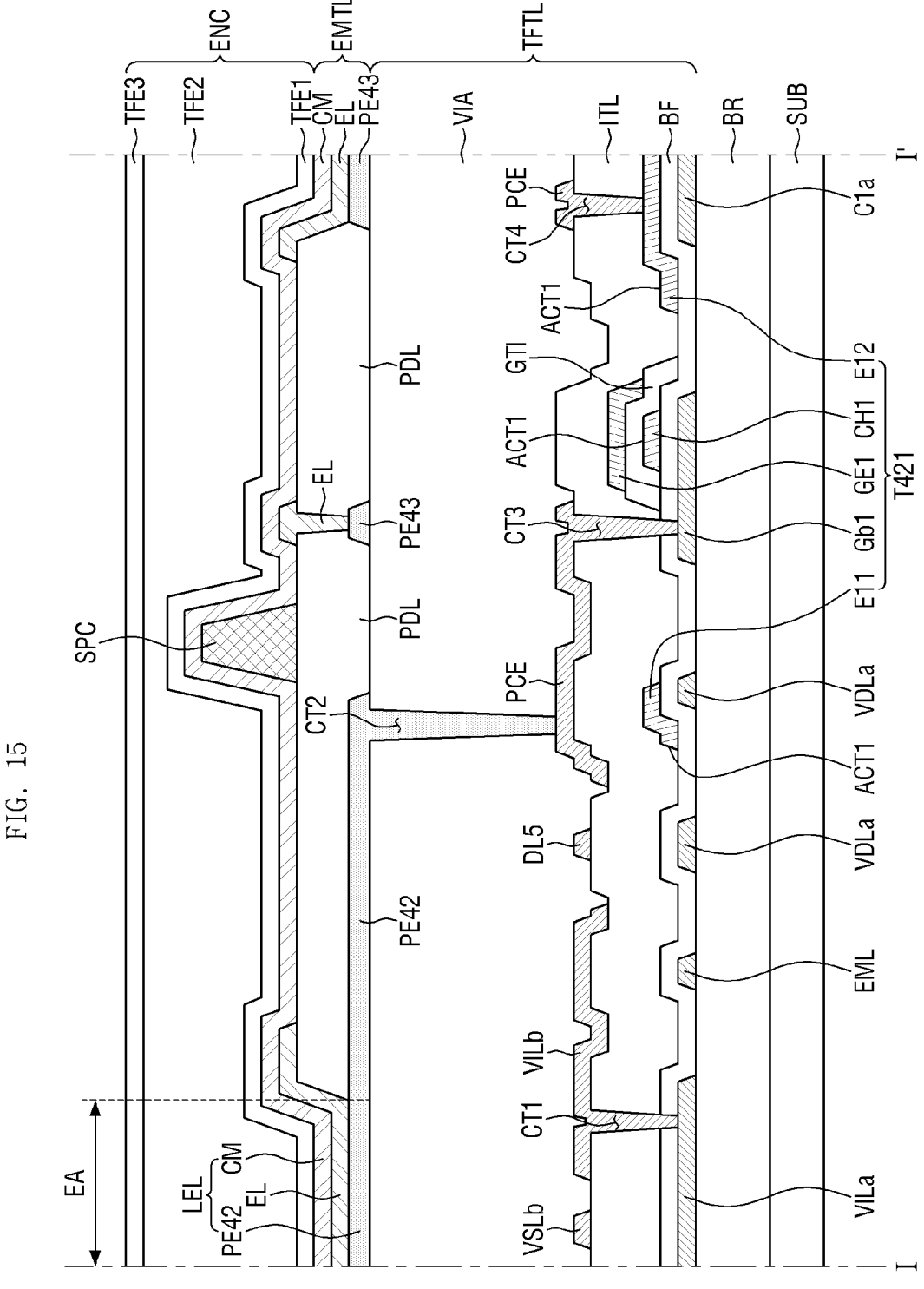
FIG. 15 is a cross-sectional view taken along line I-I' of FIG. 13.
Figure 16:
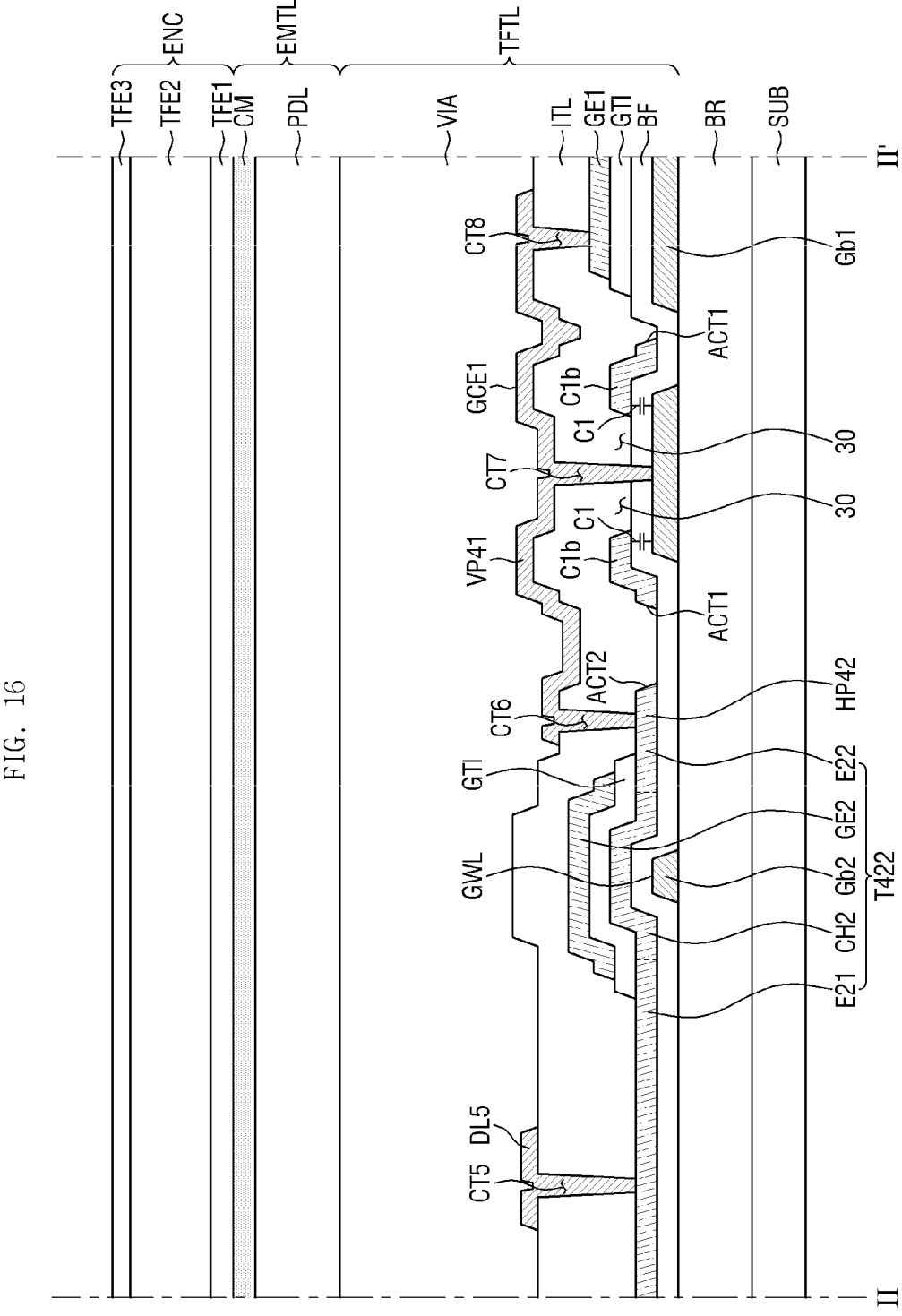
FIG. 16 is a cross-sectional view taken along line II-II' of FIG. 13.
Figure 17:
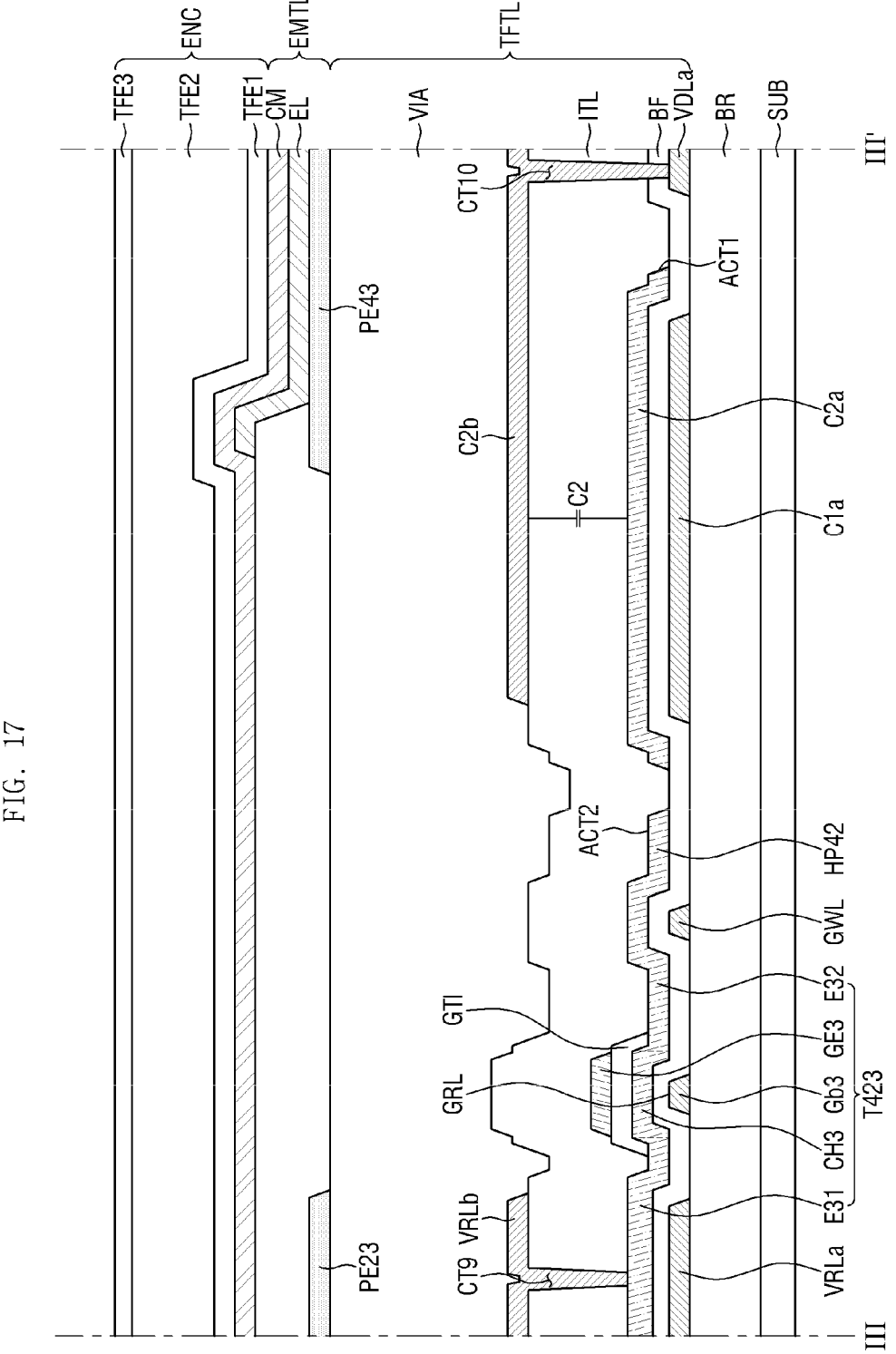
FIG. 17 is a cross-sectional view taken along line III-III' of FIG. 13.
Figure 18:
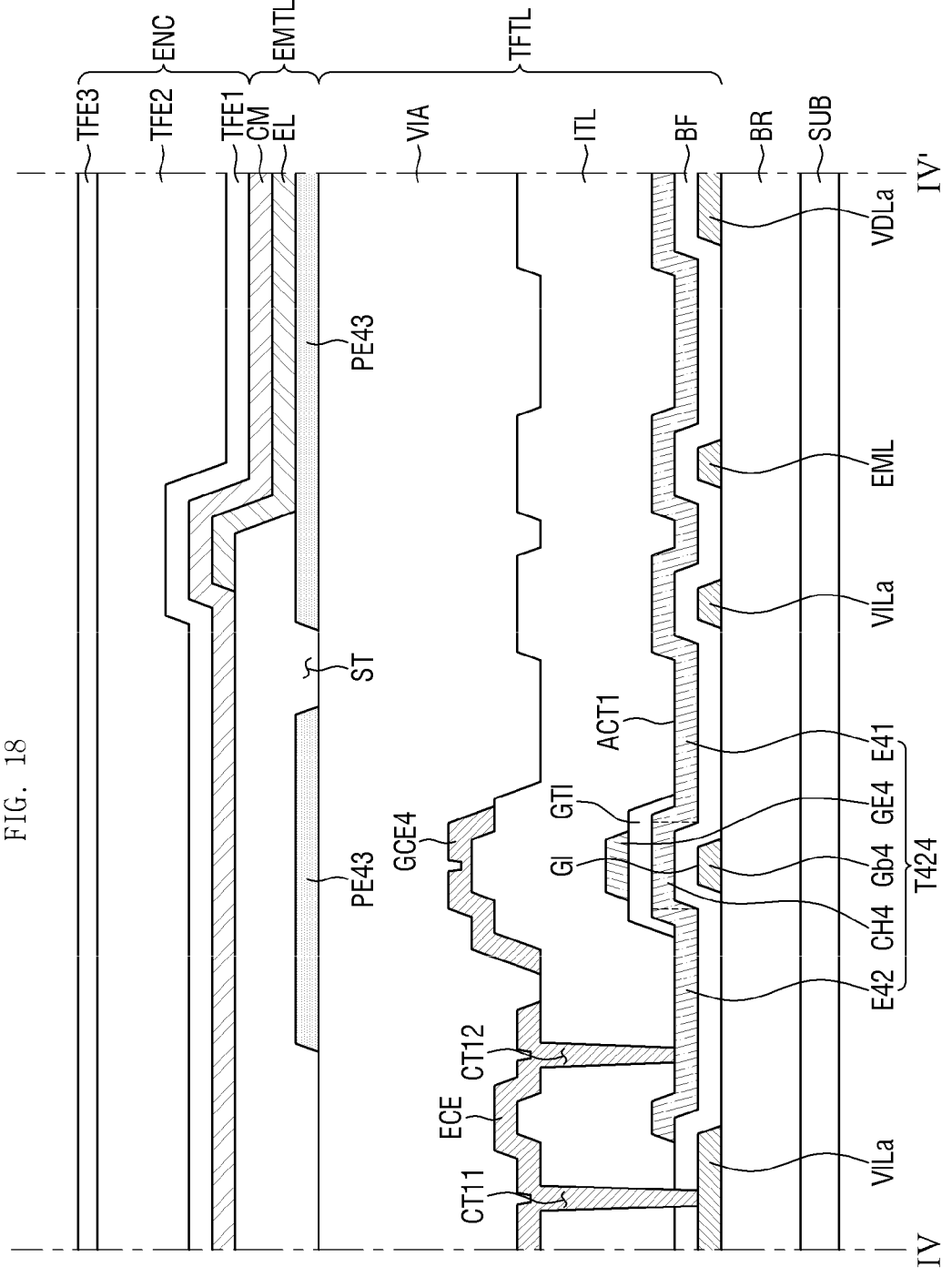
FIG. 18 is a cross-sectional view taken along line IV-IV' of FIG. 13.
Figure 19:
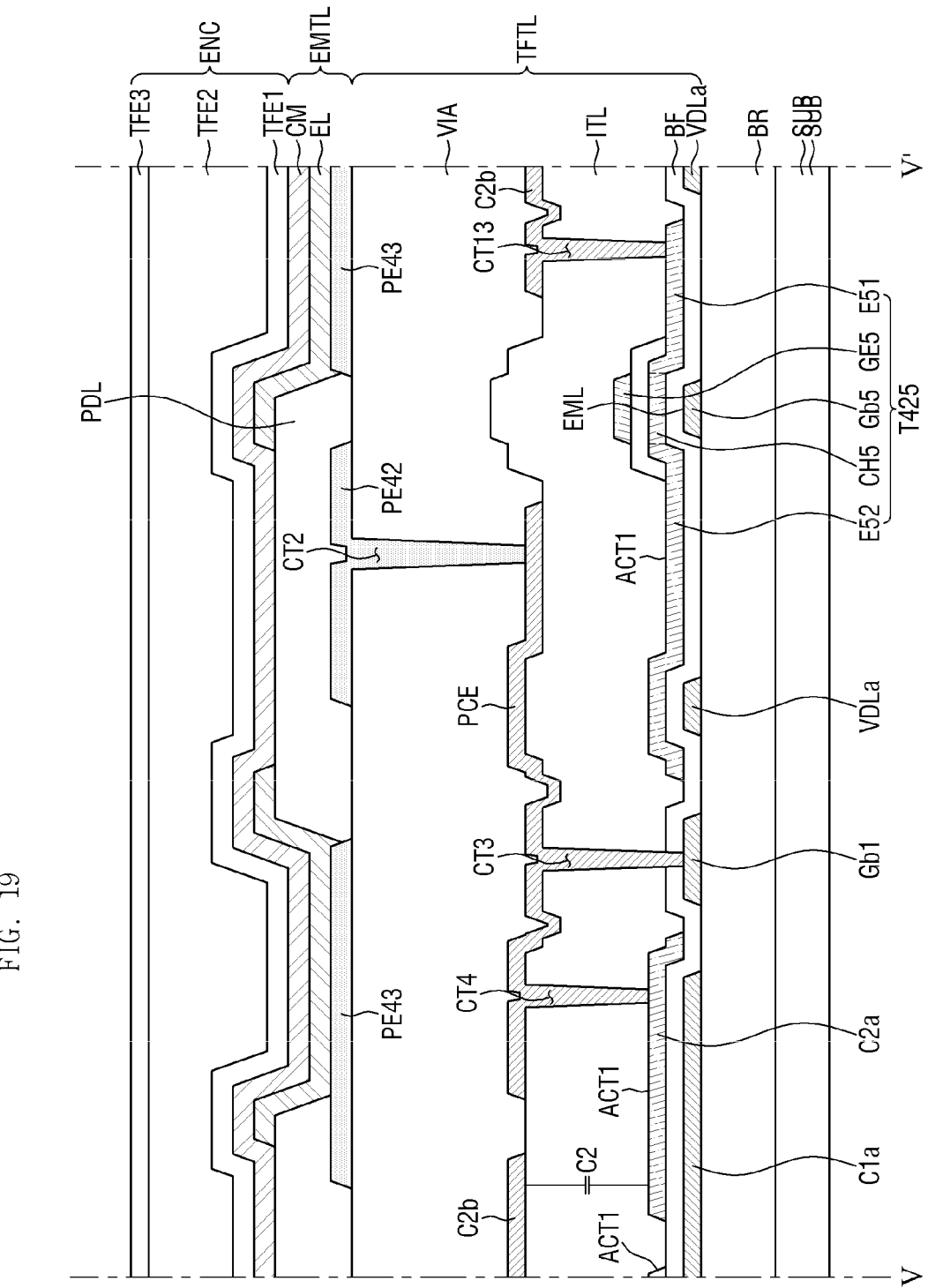
FIG. 19 is a cross-sectional view taken along line V-V' of FIG. 13.

FIG. 12 is a detailed plan view of the third unit pixel and the fourth unit pixel of FIG. 4, FIG. 13 is an enlarged view of area A of FIG. 12, FIG. 14 is an enlarged view of the vicinity of the gate node of FIG. 13, FIG. 15 is a cross-sectional view taken along line I-I' of FIG. 13, FIG. 16 is a cross-sectional view taken along line II-II' of FIG. 13, FIG. 17 is a cross-sectional view taken along line III-III' of FIG. 13, FIG. 18 is a cross-sectional view taken along line IV-IV' of FIG. 13, and FIG. 19 is a cross-sectional view taken along line V-V' of FIG. 13.

As shown in FIGS. 12 to 19, the display panel 1000 of the display device 1 may include the substrate SUB, a barrier layer BR, a thin film transistor layer TFTL, a light emitting element layer EMTL, and an encapsulation layer ENC. The barrier layer BR, the thin film transistor layer TFTL, the light emitting element layer EMTL, and the encapsulation layer ENC may be sequentially disposed on the substrate SUB along the third direction DR3.

The substrate SUB may be a rigid substrate or a flexible substrate which can be bent, folded or rolled. The substrate SUB may be formed of an insulating material such as glass, quartz, or a polymer resin. Examples of a polymer material may include polyethersulphone (PES), polyacrylate (PA), polyarylate (PAR), polyetherimide (PEI), polyethylene naphthalate (PEN), polyethylene terephthalate (PET), poly-phenylene sulfide (PPS), polyallylate, polyimide (PI), poly-carbonate (PC), cellulose triacetate (TAC), cellulose acetate propionate (CAP), or a combination thereof. Alternatively, the substrate SUB may include a metal material.

The barrier layer BR may be disposed on the substrate SUB. The barrier layer BR may be a layer for protecting transistors of the thin film transistor layer TFTL and a light emitting layer EL of the light emitting element layer EMTL from moisture permeating through the substrate SUB which is susceptible to moisture permeation. The barrier layer BR may be formed as a plurality of inorganic layers that are alternately stacked. For example, the barrier layer BR may be formed of multiple layers in which one or more inorganic layers of a silicon nitride layer, a silicon oxynitride layer, a silicon oxide layer, a titanium oxide layer and an aluminum oxide layer are alternately stacked.

The first conductive layer may be disposed on the barrier layer BR. For example, as shown in FIGS. 12 to 19, the second lower driving voltage line VSLa, the lower reference voltage line VRLa, the third scan line GRL, the first scan line GWL, the first lower capacitor electrode C1a, the first counter gate electrode Gb1, the first lower driving voltage line VDLa, the emission control line EML, and the lower initialization voltage line VILa may be disposed on the substrate SUB.

A buffer layer BF may be disposed on the first conductive layer. The buffer layer BF may be a layer for protecting transistors of the thin film transistor layer TFTL and a light emitting layer EL of the light emitting element layer EMTL from moisture permeating through the substrate SUB which is susceptible to moisture permeation. The buffer layer BF may be formed of a plurality of inorganic layers that are alternately stacked. For example, the buffer layer BF may be formed of multiple layers in which one or more inorganic layers of a silicon nitride layer, a silicon oxynitride layer, a silicon oxide layer, a titanium oxide layer and an aluminum oxide layer are alternately stacked.

The second conductive layer may be disposed on the buffer layer BF. For example, as shown in FIGS. 12 to 19, the semiconductor layer including the first semiconductor layer ACT1 and the second semiconductor layer ACT2 may be disposed on the buffer layer BF.

The first semiconductor layer ACT1 may provide the channel regions (for example, CH1, CH4, and CH5), the first electrodes (for example, E11, E41, and E51), and the second electrodes (for example, E12, E42, and E52) of the first transistor (for example, T421), the fourth transistor (for example, T424), and the fifth transistor (for example, T425). For example, the first semiconductor layer ACT1 may include the first channel region CH1 of the first transistor T421, the fourth channel region CH4 of the fourth transistor T424, the fifth channel region CH5 of the fifth transistor T425, the first electrode E11 of the first transistor T421, the second electrode E12 of the first transistor T421, the first electrode E41 of the fourth transistor T424, the second electrode E42 of the fourth transistor T424, the first electrode E51 of the fifth transistor T425, and the second electrode E52 of the fifth transistor T425.

The second semiconductor layer ACT2 may provide the channel regions (for example, CH2 and CH3), the first electrodes (for example, E21 and E31), and the second electrodes (for example, E22 and E32) of the second transistor (for example, T422) and the third transistor (for example, T423). For example, the second semiconductor layer ACT2 may include the second channel region CH2 of the second transistor T422, the third channel region CH3 of the third transistor T423, the first electrode E21 of the second channel transistor T422, the second electrode E22 of the second transistor T422, the first electrode E31 of the third transistor T423, and the second electrode E32 of the third transistor T423.

The first channel region CH1 may overlap the first gate electrode GE1 and the first counter gate electrode Gb1, the second channel region CH2 may overlap the second gate electrode GE2 and the second counter gate electrode Gb2, the third channel region CH3 may overlap the third gate electrode Gb3 and the third counter gate electrode Gb3, the fourth channel region CH4 may overlap the fourth gate electrode GE4 and the fourth counter gate electrode Gb4, and the fifth channel region CH5 may overlap the fifth gate electrode GE5 and the fifth counter gate electrode Gb5.

As shown in FIG. 15, the first capacitor C1 may be disposed in the region where the first lower capacitor electrode C1a, the first semiconductor layer ACT1 (for example, the first upper capacitor electrode C1b of the first semiconductor layer ACT1), and the first lower capacitor electrode C1a overlap. The first lower capacitor electrode C1a may correspond to the first electrode of the first capacitor C1, and a part (for example, the first upper capacitor electrode C1b) of the first semiconductor layer ACT1 may correspond to the second electrode of the first capacitor C1.

As shown in FIGS. 12 to 19, a gate insulating layer GTI may be disposed on the first semiconductor layer ACT1 and the second semiconductor layer ACT2. Meanwhile, the gate insulating layer GTI may be patterned to have the same pattern as that of the third conductive layer to be described later. For example, the gate insulating layer GTI may be disposed between the third conductive layer to be described later and the buffer layer BF (and/or the semiconductor layer). For a specific example, the gate insulating layer GTI may have substantially the same shape as those of the first gate electrode GE1, the second gate electrode GE2, the third gate electrode GE3, the fourth gate electrode GE4, and the fifth gate electrode GE5 to be disposed between the buffer layer BF (and/or the semiconductor layer) and the first gate electrode GE1, the second gate electrode GE2, the third gate electrode GE3, the fourth gate electrode GE4, and the fifth gate electrode GE5 that will be described later. The gate insulating layer GTI may include at least one of tetraethylorthosilicate (TEOS), silicon nitride (SiNx), or silicon oxide (SiO$_2$). For example, the gate insulating layer GTI may have a double layer structure in which a silicon nitride layer having a thickness of 40 nm and a tetraethylorthosilicate layer having a thickness of 80 nm are sequentially stacked.

The third conductive layer may be disposed on the gate insulating layer GTI. For example, as shown in FIGS. 14 to 19, the first gate electrode GE1, the second gate electrode GE2, the third gate electrode GE3, the fourth gate electrode GE4, and the fifth gate electrode GE5 may be disposed on the gate insulating layer GTI.

For example, as shown in FIG. 15, the first gate electrode GE1 may be disposed on the gate insulating layer GTI to overlap the first semiconductor layer ACT1 and the first counter gate electrode Gb1. The first channel region CH1 may be disposed in one region of the first semiconductor layer ACT1 that overlaps the first gate electrode GE1.

As shown in FIG. 16, the second gate electrode GE2 may be disposed on the gate insulating layer GTI to overlap the second semiconductor layer ACT2 and the second counter gate electrode Gb2. The second channel region CH2 may be disposed in one region of the second semiconductor layer ACT2 that overlaps the second gate electrode GE2.

As shown in FIG. 17, the third gate electrode GE3 may be disposed on the gate insulating layer GTI to overlap the second semiconductor layer ACT2 and the third counter gate electrode Gb3. The third channel region CH3 may be disposed in one region of the second semiconductor layer ACT2 that overlaps the third gate electrode GE3.

As shown in FIG. 18, the fourth gate electrode GE4 may be disposed on the gate insulating layer GTI to overlap the first semiconductor layer ACT1 and the fourth counter gate electrode Gb4. The fourth channel region CH4 may be disposed in one region of the first semiconductor layer ACT1 that overlaps the fourth gate electrode GE4.

As shown in FIG. 19, the fifth gate electrode GE5 may be disposed on the gate insulating layer GTI to overlap the first semiconductor layer ACT1 and the fifth counter gate electrode Gb5. The fifth channel region CH5 may be disposed in one region of the first semiconductor layer ACT1 that overlaps the fifth gate electrode GE5.

As shown in FIG. 15, the first transistor T421 may include the first gate electrode GE1, the first semiconductor layer ACT1, the first counter gate electrode Gb1, the first electrode E11, and the second electrode E12.

As shown in FIG. 16, the second transistor T422 may include the second gate electrode GE2, the second semiconductor layer ACT2, the second counter gate electrode Gb2, the first electrode E21, and the second electrode E22.

As shown in FIG. 17, the third transistor T423 may include the third gate electrode GE3, the second semiconductor layer ACT2, the third counter gate electrode Gb3, the first electrode E31, and the second electrode E32.

As shown in FIG. 18, the fourth transistor T424 may include the fourth gate electrode GE4, the first semiconductor layer ACT1, the fourth counter gate electrode Gb4, the first electrode E41, and the second electrode E42.

As shown in FIG. 19, the fifth transistor T425 may include the fifth gate electrode GE5, the first semiconductor layer ACT1, the fifth counter gate electrode Gb5, the first electrode E51, and the second electrode E52.

As shown in FIGS. 14 to 19, the interlayer insulating layer ITL may be disposed on the first to fifth gate electrodes GE1 to GE5. The interlayer insulating layer ITL may have a thickness greater than that of the gate insulating layer GTI. Here, the thickness may mean a length in the third direction DR3.

The interlayer insulating layer ITL may include an inorganic layer, for example, a silicon nitride layer, a silicon oxynitride layer, a silicon oxide layer, a titanium oxide layer, or an aluminum oxide layer. Meanwhile, the interlayer insulating layer ITL may include a plurality of inorganic layers.

The fourth conductive layer may be disposed on the interlayer insulating layer ITL. For example, the first data line DL1, the first upper driving voltage line VDLb, the upper reference voltage line VRLb, the upper initialization voltage line VILb, the second data line DL2, the third data line DL3, the fourth data line DL4, the second upper driving voltage line VSLb, the fifth data line DL5, the pixel connection electrode PCE, the first gate connection electrode GCE1, the second gate connection electrode GCE2, the third gate connection electrode GCE3, the fourth gate connection electrode GCE4, the fifth gate connection electrode GCE5, the wire connection electrode ECE, and the second upper capacitor electrode C2b may be disposed on the interlayer insulating layer ITL.

As shown in FIG. 15, the upper initialization voltage line VILb may be connected to the lower initialization voltage line VILa through a first contact hole CT1 formed through the interlayer insulating layer ITL and the buffer layer BF.

Further, as shown in FIG. 15, the pixel connection electrode PCE may be connected to the first counter gate electrode Gb1 through a third contact hole CT3 formed through the interlayer insulating layer ITL and the buffer layer BF. Further, the pixel connection electrode PCE may be connected to the second electrode (for example, the second electrode E12 of the first transistor T421) of the first semiconductor layer ACT1 through a fourth contact hole CT4 formed through the interlayer insulating layer ITL.

Further, as shown in FIG. 16, the fifth data line DL5 may be connected to the first electrode (for example, the first electrode E21 of the second transistor T422) of the second semiconductor layer ACT2 through a fifth contact hole CT5 formed through the interlayer insulating layer ITL.

Further, as shown in FIG. 16, the vertical portion VP41 of the gate node GN41 may be connected to the second electrode (for example, the second electrode E22 of the second transistor T422) of the first semiconductor layer ACT1 through a sixth contact hole CT6 formed through the interlayer insulating layer ITL. In this case, the vertical portion VP41 of the gate node GN41 may partially overlap the horizontal portion HP41 of the gate node GN41.

Further, as shown in FIG. 16, the vertical portion VP41 of the gate node GN41 may be connected to the first lower capacitor electrode C1a through a seventh contact hole CT7 formed through the interlayer insulating layer ITL and the buffer layer BF. The seventh contact hole CT7 may be disposed in the hole 30 of the first semiconductor layer ACT1. The interlayer insulating layer ITL may be disposed between edges of the hole 30 of the first semiconductor layer ACT1 and the seventh contact hole CT7 to insulate the vertical portion VP41 of the gate node GN41 and the first semiconductor layer ACT1.

Further, as shown in FIG. 16, the vertical portion VP41 of the gate node GN41 may be connected to the first gate electrode GE1 of the first transistor T421 through an eighth contact hole CT8 formed through the interlayer insulating layer ITL.

Also, as shown in FIG. 17, the upper reference voltage line VRLb may be connected to the first electrode (for example, the first electrode E31 of the third transistor T423) of the second semiconductor layer ACT2 through a ninth contact hole CT9 formed through the interlayer insulating layer ITL.

Further, as shown in FIG. 17, the second upper capacitor electrode C2b may be connected to the first lower driving voltage line VDLa through a tenth contact hole CT10 formed through the interlayer insulating layer ITL and the buffer layer BF.

Further, as shown in FIG. 17, the second capacitor C2 may be disposed in the region where the first semiconductor layer ACT1 (for example, the second lower capacitor electrode C2a of the first semiconductor layer ACT1) and the second upper capacitor electrode C2b overlap. A part of the first semiconductor layer ACT1 (for example, the second lower capacitor electrode C2a) may correspond to the first electrode of the second capacitor C2, and the second upper capacitor electrode C2b may correspond to the second electrode of the second capacitor C2.

Further, as shown in FIG. 18, one side of the wire connection electrode ECE may be connected to the lower initialization voltage line VILa through an eleventh contact hole CT11 formed through the interlayer insulating layer ITL and the buffer layer BF, and the other side of the wire connection electrode ECE may be connected to the second electrode (for example, the second electrode E42 of the fourth transistor T424) of the first semiconductor layer ACT1 through a twelfth contact hole CT12 formed through the interlayer insulating layer ITL.

Further, one side of the fourth gate connection electrode GCE4 of FIG. 18 may be connected to the fourth gate electrode GE4 of the fourth transistor T424 through the contact hole formed through the interlayer insulating layer ITL, and the other side of the fourth gate connection electrode GCE4 may be connected to the second scan line GIL through the contact hole formed the interlayer insulating layer ITL and the buffer layer BF as disclosed in FIG. 13.

Similarly, one side of the second gate connection electrode GCE2 may be connected to the second gate electrode GE2 of the second transistor T422 through a contact hole formed through the interlayer insulating layer ITL, and the other side of the second gate connection electrode GCE2 may be connected to the second counter gate electrode Gb2 of the first scan line GWL through a contact hole formed through the interlayer insulating layer ITL and the buffer layer BF.

Similarly, one side of the third gate connection electrode GCE3 may be connected to the third gate electrode GE3 of the third transistor T423 through a contact hole formed through the interlayer insulating layer ITL, and the other side of the third gate connection electrode GCE3 may be connected to the third scan line GRL through a contact hole formed through the interlayer insulating layer ITL and the buffer layer BF.

Similarly, one side of the fourth gate connection electrode GCE4 may be connected to the fourth gate electrode GE4 of the fourth transistor T424 through a contact hole formed through the interlayer insulating layer ITL, and the other side of the fourth gate connection electrode GCE4 may be connected to the second scan line GIL through a contact hole formed through the interlayer insulating layer ITL and the buffer layer BF.

Similarly, one side of the fifth gate connection electrode GCE5 may be connected to the fifth gate electrode GE5 of the fifth transistor T425 through a contact hole formed through the interlayer insulating layer ITL, and the other side of the fifth gate connection electrode GCE5 may be connected to the emission control line EML through a contact hole formed through the interlayer insulating layer ITL and the buffer layer BF.

Further, as shown in FIG. 19, one side of the pixel connection electrode PCE may be connected to the first semiconductor layer ACT1 through a fourth contact hole CT4 formed through the interlayer insulating layer ITL, and the other side of the pixel connection electrode PCE may be connected to the first counter gate electrode Gb1 through a third contact hole CT3 formed through the interlayer insulating layer ITL and the buffer layer BF.

Further, as shown in FIG. 19, the second upper capacitor electrode C2b may be connected to the first electrode (for example, the first electrode E51 of the fifth transistor T425) of the first semiconductor layer ACT1 through a thirteenth contact hole CT13 formed through the interlayer insulating layer ITL.

As shown in FIGS. 14 to 19, a planarization layer VIA may be disposed on the fourth conductive layer. The planarization layer VIA may include an organic layer such as acryl resin, epoxy resin, phenolic resin, polyamide resin, polyimide resin and the like. As shown in FIGS. 14 to 19, the light emitting element layer EMTL including the fifth conductive layer may be disposed on the planarization layer VIA. For example, the light emitting element layer EMTL may be disposed on the thin film transistor layer TFTL. The light emitting element layer EMTL may include the light emitting elements LEL and a bank.

Each of the light emitting elements LEL may include the pixel electrode (for example, PE42), the light emitting layer EL, and a common electrode CM. Each of the emission areas EA represents an area in which the pixel electrode, the light emitting layer, and the common electrode CM are sequentially stacked and holes from the pixel electrode and electrons from the common electrode CM are combined with each other in the light emitting layer to emit light. In this case, the pixel electrode PE42 may be the anode electrode of the light emitting element LEL, and the common electrode CM may be the cathode electrode of the light emitting element LEL.

The pixel electrode PE43 may be disposed on the planarization layer VIA. The pixel electrode PE43 may be connected to pixel electrode PE42. The pixel electrode PE43 may be connected to the pixel connection electrode PCE through a second contact hole CT2 formed through the planarization layer VIA.

In a top emission structure that emits light toward the common electrode CM with respect to the light emitting layer EL, the pixel electrode may be formed of a single layer of molybdenum (Mo), titanium (Ti), copper (Cu), or aluminum (Al), or may be formed to have a laminated structure of aluminum and titanium (Ti/Al/Ti), a laminated structure of aluminum and ITO (ITO/Al/ITO), an APC alloy, or a laminated structure of APC alloy and ITO (ITO/APC/ITO) to increase the reflectivity. The APC alloy is an alloy of silver (Ag), palladium (Pd) and copper (Cu).

The bank PDL (or pixel defining layer) serves to define the emission areas EA of display pixels. To this end, the bank PDL may be disposed to expose a part of the pixel electrode PE43 on the planarization layer VIA. The bank PDL may cover the edge of the pixel electrode PE43. Meanwhile, although not shown, the bank PDL may be disposed in the second contact hole CT2 formed through the planarization layer VIA. Accordingly, the second contact hole CT2 formed through the planarization layer VIA may be filled by the bank PDL. The bank may be formed of an organic layer such as acryl resin, epoxy resin, phenolic resin, polyamide resin, polyimide resin and the like.

A spacer SPC (not shown) may be disposed on the bank PDL. The spacer SPC may serve to support a mask during a process of manufacturing the light emitting layer EL. The spacer SPC may be formed of an organic layer such as acryl resin, epoxy resin, phenolic resin, polyamide resin, polyimide resin and the like.

The light emitting layer EL is formed on the pixel electrode PE42. The light emitting layer EL may include an organic material to emit light in a predetermined color. For example, the light emitting layer EL may include a hole transporting layer, an organic material layer, and an electron transporting layer. The organic material layer may include a host and a dopant. The organic material layer may include a material that emits predetermined light, and may be formed using a phosphorescent material or a fluorescent material.

For example, the organic material layer of the light emitting layer EL of the first emission area emitting the light of the first color may be a phosphorescent material including a host material including carbazole biphenyl (CBP) or mCP (1,3-bis(carbazol-9-yl), and a dopant including at least one selected from the group consisting of PIQIr(acac)(bis(1-phenylisoquinoline)acetylacetonate iridium), PQIr(acac)(bis (1-phenylquinoline)acetylacetonate iridium), PQIr(tris(1-phenylquinoline)iridium)) and PtOEP (octaethylporphyrin platinum). Alternatively, the organic material layer of the first light emitting layer of the first emission area EA may be a fluorescent material including PBD:Eu(DBM)3(Phen) or Perylene, but the present disclosure is not limited thereto.

The organic material layer of the light emitting layer EL in the second emission area emitting the light of the second color may be a phosphorescent material including a host material including CBP or mCP, and a dopant material including Ir(ppy)3(fac tris(2-phenylpyridine)iridium. Alternatively, the organic material layer of the light emitting layer EL in the emission area EA emitting the light of the second color may be a fluorescent material including tris(8-hydroxyquinolino)aluminum (Alq3), but the present disclosure is not limited thereto.

The organic material layer of the light emitting layer EL of the emission area EA emitting the light of the third color may be a phosphorescent material including a host material including CBP or mCP, and a dopant material including (4,6-F2ppy)2Irpic or L2BD111, but the present disclosure is not limited thereto.

The common electrode CM may be arranged on the light emitting layer EL. The common electrode CM may be disposed to cover the light emitting layer EL. The common electrode CM may be a common layer commonly disposed in the light emitting layers. A capping layer may be formed on the common electrode CM.

In the top emission structure, the common electrode CM may be formed of a transparent conductive material (TCO) such as ITO or IZO capable of transmitting light or a semi-transmissive conductive material such as magnesium (Mg), silver (Ag), or an alloy of magnesium (Mg) and silver (Ag). When the common electrode CM is formed of a semi-transmissive conductive material, the light emission efficiency can be increased due to a micro-cavity effect.

The encapsulation layer ENC may be formed on the light emitting element layer EMTL. The encapsulation layer ENC may include at least one inorganic layer TFE1 and TFE3 to prevent oxygen or moisture from permeating into the light emitting element layer EMTL. In addition, the encapsulation layer ENC may include at least one organic layer to protect the light emitting element layer EMTL from foreign substances such as dust. For example, the encapsulation layer ENC may include a first inorganic encapsulation layer TFE1, an organic encapsulation layer TFE2, and a second inorganic encapsulation layer TFE3.

The first inorganic encapsulation layer TFE1 may be disposed on the common electrode CM, the organic encapsulation layer TFE2 may be disposed on the first inorganic encapsulation layer TFE1, and the second inorganic encapsulation layer TFE3 may be disposed on the organic encapsulation layer TFE2. The first inorganic encapsulation layer TFE1 and the second inorganic encapsulation layer TFE3 may be formed of multiple layers in which one or more inorganic layers of a silicon nitride layer, a silicon oxynitride layer, a silicon oxide layer, a titanium oxide layer and an aluminum oxide layer are alternately stacked. The encapsulation organic layer TFE2 may be an organic layer such as acryl resin, epoxy resin, phenolic resin, polyamide resin, polyimide resin or the like.

Meanwhile, as shown in FIGS. 12, 13, 14, and 17, the horizontal portion (for example, HP42) of the gate node GN42 may be disposed between the pixel electrodes (for example, PE23 and PE43) adjacent in the second direction DR2. In other words, the horizontal portion (for example, HP42) of the gate node GN42 does not overlap the pixel electrodes (for example, PE23 and PE43).

As shown in FIGS. 14, 16 and 17, each of the gate nodes GN41 to GN43 may have a structure in which a plurality of conductive layers disposed on different layers are connected. In particular, in FIG. 14, the fourth-first gate node GN41, the fourth-second gate node GN42, and the fourth-third gate node GN43 are highlighted and displayed with thick lines to be more clearly seen.

For example, the fourth-second gate node GN42 may include the second conductive layer (for example, the second semiconductor layer ACT2 corresponding to the second electrode E22 of the second transistor T422 and the second electrode E32 of the third transistor T423), the third conductive layer (for example, the first gate connection electrode GCE1) connected to the second conductive layer through the sixth contact hole CT6, and the second conductive layer (for example, the first gate electrode GE1) connected to the third conductive layer through the eighth contact hole CT8. Here, the second electrode E22 of the second transistor may correspond to the horizontal portion HP42 of the fourth-second gate node GN42, and the second electrode E32, the first gate connection electrode GCE1, and the first gate electrode GE1 of the third transistor T423 may correspond to the vertical portion VP42 of the fourth-second gate node GN42.

The other gate nodes (for example, GN31, GN32, GN33, GN41, and GN43) may also have the same structure as that of the fourth-second gate node GN42.

Meanwhile, another structure of the light emitting element (e.g., LEL of FIGS. 14 to 18) will be described with reference to FIGS. 20 to 27.

Figure 20:
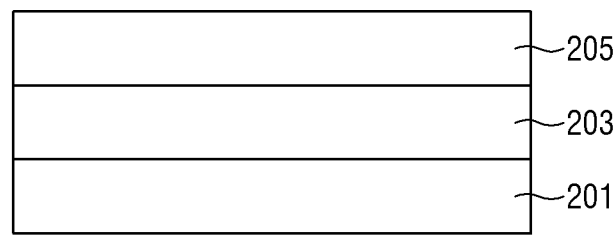
FIG. 20 is a cross-sectional view illustrating a structure of a display element according to one embodiment of the present disclosure.

FIG. 20 is a cross-sectional view illustrating a structure of a display element according to one embodiment of the present disclosure, and FIGS. 21 to 24 are cross-sectional views illustrating a structure of a light emitting element according to one embodiment.

Referring to FIG. 20, a light emitting element (e.g., an organic light emitting diode) according to one embodiment may include a pixel electrode 201, a common electrode 205, and an intermediate layer 203 disposed between the pixel electrode 201 and the common electrode 205 described above.

The pixel electrode 201 may include a light-transmitting conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 201 may include a reflective layer containing silver (Ag), magnesium (Mg), aluminum (Al), platinum (Pt), palladium (Pd), gold (Au), nickel (Ni), neodymium (Nd), iridium (Ir), chromium (Cr) or a compound thereof. For example, the pixel electrode 201 may have a three-layer structure of ITO/Ag/ITO.

The common electrode 205 may be disposed on the intermediate layer 203. The common electrode 205 may include a low work function metal, an alloy, an electrically conductive compound, or any combination thereof. For example, the common electrode 205 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The common electrode 205 may be a transmissive electrode, a semi-transmissive electrode, or a reflective electrode.

The intermediate layer 203 may include a high molecular material or a low molecular material that emits light of a predetermined color. In addition to various organic materials, the intermediate layer 203 may further include metal-containing compounds such as organometallic compounds, inorganic materials such as quantum dots, and the like.

In one embodiment, the intermediate layer 203 may include one light emitting layer and a first functional layer and a second functional layer respectively disposed below and above the one light emitting layer. The first functional layer may include, for example, a hole transport layer HTL or may include the hole transport layer and a hole injection layer HIL. The second functional layer is a component disposed on the light emitting layer and is optional. For example, the intermediate layer 203 may include or may not include the second functional layer. The second functional layer may include an electron transport layer ETL and/or an electron injection layer EIL.

In one embodiment, the intermediate layer 203 may include two or more emitting units that are sequentially stacked between the pixel electrode 201 and the common electrode 205, and a charge generation layer CGL disposed between the two emitting units. When the intermediate layer 203 includes an emitting unit and a charge generation layer, a light emitting element (e.g., an organic light emitting diode) may be a tandem light emitting element. A light emitting element (e.g., an organic light emitting diode) may improve color purity and luminous efficiency by having a stacked structure of a plurality of emitting units.

One emitting unit may include a light emitting layer and a first functional layer and a second functional layer respectively disposed below and above the light emitting layer. The charge generation layer CGL may include a negative charge generation layer and a positive charge generation layer. The luminous efficiency of an organic light emitting diode, which is a tandem light emitting element having a plurality of light emitting layers, may be further increased by the negative charge generation layer and the positive charge generation layer.

The negative charge generation layer may be an n-type charge generation layer. The negative charge generation layer may supply electrons. The negative charge generation layer may include a host and a dopant. The host may include an organic material. The dopant may include a metal material. The positive charge generation layer may be a p-type charge generation layer. The positive charge generation layer may supply holes. The positive charge generation layer may include a host and a dopant. The host may include an organic material. The dopant may include a metal material.

Figure 21:
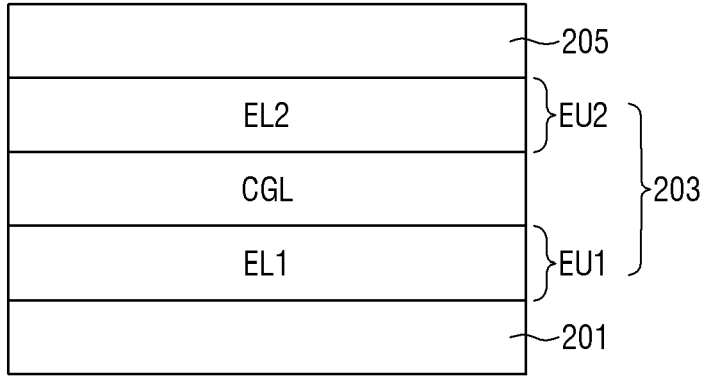
FIGS. 21, 22, 23 and 24 are cross-sectional views illustrating a structure of a light emitting element according to one embodiment.

In one embodiment, as illustrated in FIG. 21, a light emitting element (e.g., an organic light emitting diode) may include a first emitting unit EU1 including a first light emitting layer EL1 and a second emitting unit EU2 including a second light emitting layer EL2 that are sequentially stacked. The charge generation layer CGL may be disposed between the first emitting unit EU1 and the second emitting unit EU2. For example, a light emitting element (e.g., an organic light emitting diode) may include the pixel electrode 201, the first light emitting layer EL1, the charge generation layer CGL, the second light emitting layer EL2, and the common electrode 205 that are sequentially stacked. The first functional layer and the second functional layer may be disposed on and under the first light emitting layer EL1, respectively. The first functional layer and the second functional layer may be included below and above the second light emitting layer EL2, respectively. The first light emitting layer EL1 may be a blue light emitting layer, and the second light emitting layer EL2 may be a yellow light emitting layer.

Figure 22:
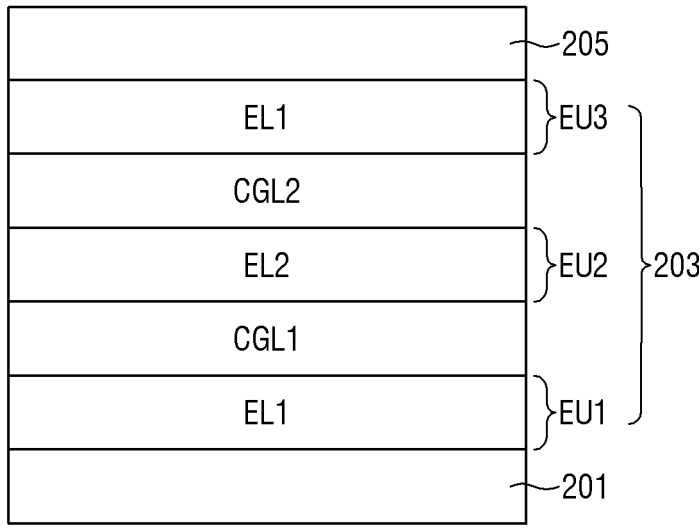

In one embodiment, as illustrated in FIG. 22, a light emitting element (e.g., an organic light emitting diode) may include the first emitting unit EU1 and the third emitting unit EU3 including the first light emitting layer EL1, and the second emitting unit EU2 including the second light emitting layer EL2. The first charge generation layer CGL1 may be disposed between the first emitting unit EU1 and the second emitting unit EU2, and the second charge generation layer CGL2 may be disposed between the second emitting unit EU2 and the third emitting unit EU3. For example, a light emitting element (e.g., an organic light emitting diode) may include the pixel electrode 201, the first light emitting layer EL1, the first charge generation layer CGL1, the second light emitting layer EL2, the second charge generation layer CGL2, the first light emitting layer EL1, and the common electrode 205 that are sequentially stacked. The first functional layer and the second functional layer may be disposed on and below the first light emitting layer EL1, respectively. The first functional layer and the second functional layer may be disposed on and below the second light emitting layer EL2, respectively. The first light emitting layer EL1 may be a blue light emitting layer, and the second light emitting layer EL2 may be a yellow light emitting layer.

In one embodiment, in a light emitting element (e.g., an organic light emitting diode), the second emitting unit EU2 may further include a third light emitting layer EL3 and/or a fourth light emitting layer EL4 directly in contact with the second light emitting layer EL2 below and/or above the second light emitting layer EL2, in addition to the second light emitting layer EL2. Here, direct contact may mean that no other layer is disposed between the second light emitting layer EL2 and the third light emitting layer EL3 and/or between the second light emitting layer EL2 and the fourth light emitting layer EL4. The third light emitting layer EL3 may be a red light emitting layer, and the fourth light emitting layer EL4 may be a green light emitting layer.

Figure 23:
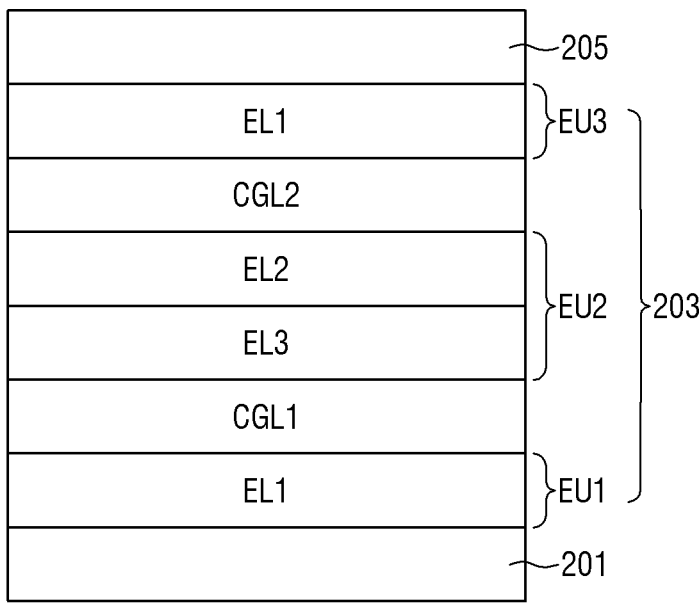

For example, as illustrated in FIG. 23, a light emitting element (e.g., an organic light emitting diode) may include the pixel electrode 201, the first light emitting layer EL1, the first charge generation layer CGL1, the third light emitting layer EL3, the second light emitting layer EL2, the second charge generation layer CGL2, the first light emitting layer EL1, and the common electrode 205 that are sequentially stacked. Alternatively, as illustrated in FIG. 24, a light emitting element (e.g., an organic light emitting diode) may include the pixel electrode 201, the first light emitting layer EL1, the first charge generation layer CGL1, the third light emitting layer EL3, the second light emitting layer EL2, the fourth light emitting layer EL4, the second charge generation layer CGL2, the first light emitting layer EL1, and the common electrode 205 that are sequentially stacked.

Figure 24:
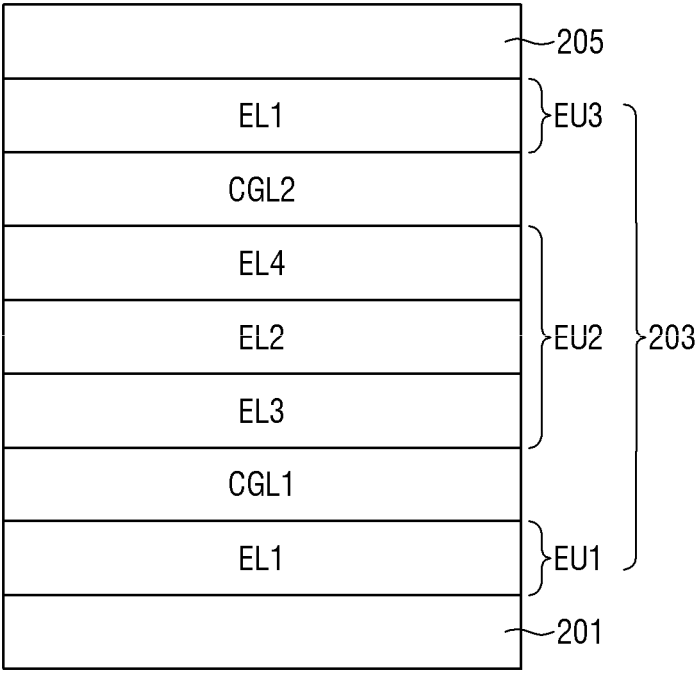
Figure 25:
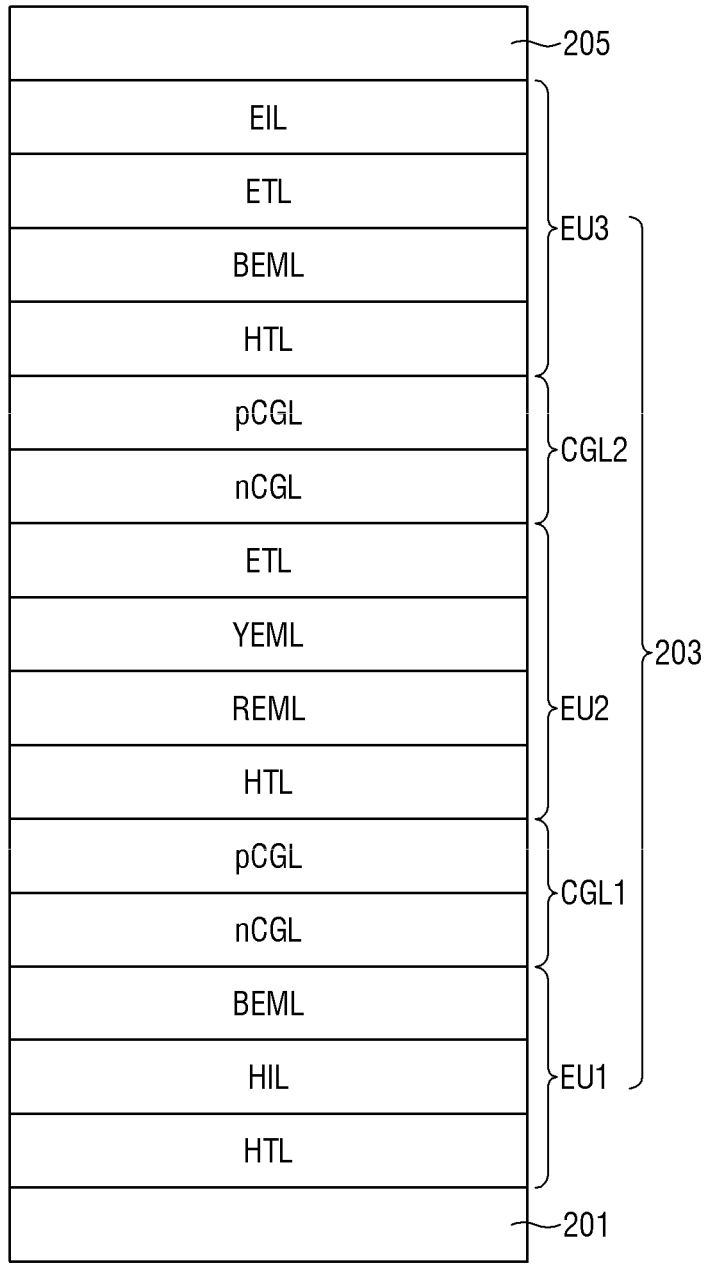
FIG. 25 is a cross-sectional view illustrating an example of the organic light emitting diode of FIG. 23.
Figure 26:
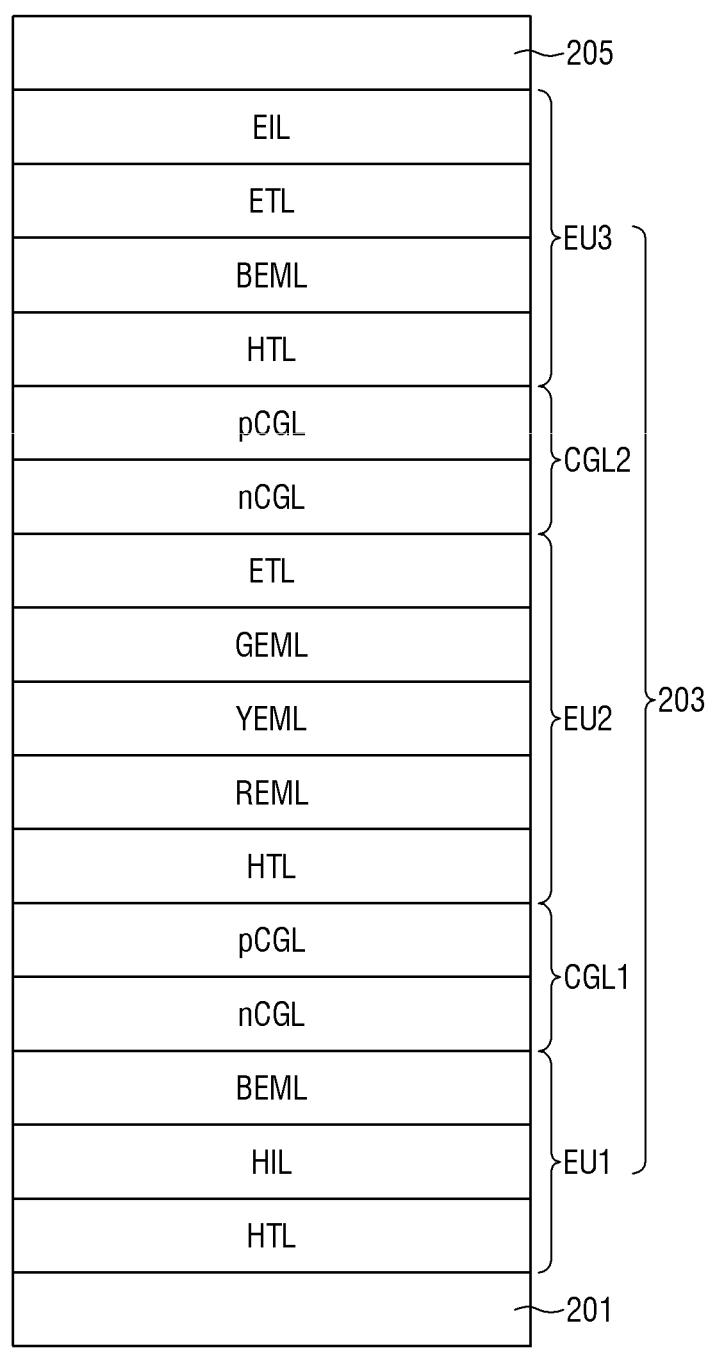
FIG. 26 is a cross-sectional view illustrating an example of the organic light emitting diode of FIG. 24.

FIG. 25 is a cross-sectional view illustrating an example of the organic light emitting diode of FIG. 23, and FIG. 26 is a cross-sectional view illustrating an example of the organic light emitting diode of FIG. 24.

Referring to FIG. 25, a light emitting element (e.g., an organic light emitting diode) may include the first emitting unit EU1, the second emitting unit EU2, and the third emitting unit EU3 that are sequentially stacked. The first charge generation layer CGL1 may be disposed between the first emitting unit EU1 and the second emitting unit EU2, and the second charge generation layer CGL2 may be disposed between the second emitting unit EU2 and the third emitting unit EU3. The first charge generation layer CGL1 and the second charge generation layer CGL2 may include a negative charge generation layer nCGL and a positive charge generation layer pCGL, respectively.

The first emitting unit EU1 may include a blue light emitting layer BEML. The first emitting unit EU1 may further include the hole injection layer HIL and the hole transport layer HTL between the pixel electrode 201 and the blue light emitting layer BEML. In one embodiment, a p-doped layer may be further included between the hole injection layer HIL and the hole transport layer HTL. The P-doped layer may be formed by doping the hole injection layer HIL with a p-type doping material. In one embodiment, at least one of a blue light auxiliary layer, an electron blocking layer, or a buffer layer may be further included between the blue light emitting layer BEML and the hole transport layer HTL. The blue light auxiliary layer may increase light emission efficiency of the blue light emitting layer BEML. The blue light auxiliary layer may increase light emission efficiency of the blue light emitting layer BEML by adjusting hole charge balance. The electron blocking layer may prevent electron injection into the hole transport layer HTL. The buffer layer may compensate for a resonance distance according to a wavelength of light emitted from the light emitting layer.

The second emitting unit EU2 may include a yellow light emitting layer YEML and a red light emitting layer REML directly in contact with the yellow light emitting layer YEML below the yellow light emitting layer YEML. The second emitting unit EU2 may further include the hole transport layer HTL between the positive charge generation layer pCGL of the first charge generation layer CGL1 and the red light emitting layer REML, and may further include the electron transport layer ETL between the yellow light emitting layer YEML and the negative charge generation layer nCGL of the second charge generation layer CGL2.

The third emitting unit EU3 may include the blue light emitting layer BEML. The third emitting unit EU3 may further include the hole transport layer HTL between the positive charge generation layer pCGL of the second charge generation layer CGL2 and the blue light emitting layer BEML. The third emitting unit EU3 may further include the electron transport layer ETL and the electron injection layer EIL between the blue light emitting layer BEML and the common electrode 205. The electron transport layer ETL may have a single layer or a multilayer. In one embodiment, at least one of a blue light auxiliary layer, an electron blocking layer, or a buffer layer may be further included between the blue light emitting layer BEML and the hole transport layer HTL. At least one of a hole blocking layer or a buffer layer may be further included between the blue light emitting layer BEML and the electron transport layer ETL. The hole blocking layer may prevent hole injection into the electron transport layer ETL.

A light emitting element (e.g., an organic light emitting diode) illustrated in FIG. 26 is different from the light emitting element (e.g., an organic light emitting diode) illustrated in FIG. 24 in the stacked structure of the second emitting unit EU2, and other configurations are the same. Referring to FIG. 26, the second emitting unit EU2 may include the yellow light emitting layer YEML, the red light emitting layer REML directly in contact with the yellow light emitting layer YEML below the yellow light emitting layer YEML, and a green light emitting layer GEML directly in contact with the yellow light emitting layer YEML above the yellow light emitting layer YEML. The second emitting unit EU2 may further include the hole transport layer HTL disposed between the positive charge generation layer pCGL of the first charge generation layer CGL1 and the red light emitting layer REML, and may further include the electron transport layer ETL disposed between the green light emitting layer GEML and the negative charge generation layer nCGL of the second charge generation layer CGL2.

Figure 27:
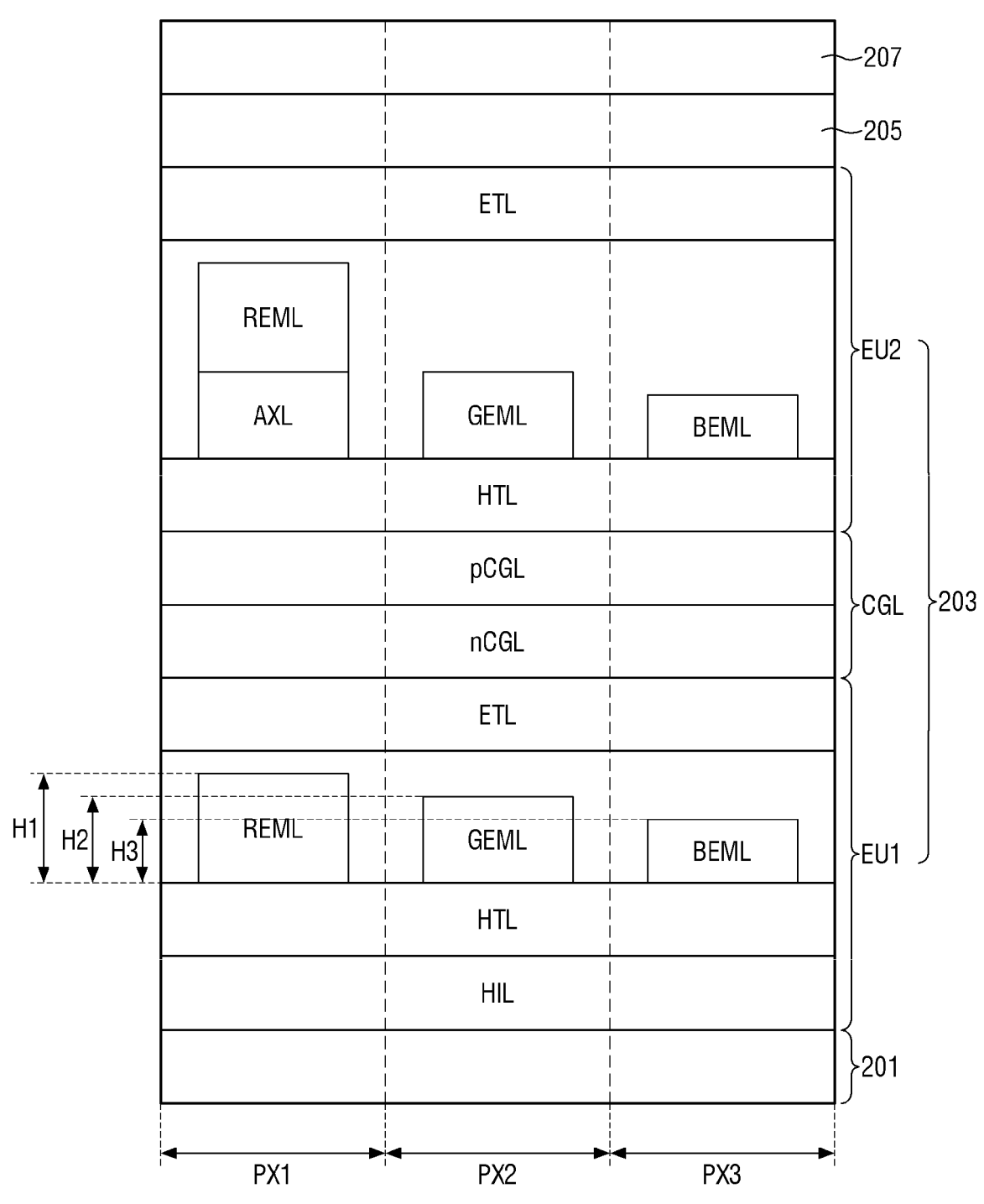
FIG. 27 is a cross-sectional view illustrating a structure of a pixel of a display device according to one embodiment of the present disclosure.

FIG. 27 is a cross-sectional view illustrating a structure of a pixel of a display device according to one embodiment of the present disclosure.

Referring to FIG. 27, the display panel 1000 of the display device 1 may include a plurality of pixels (e.g., the sub-pixels described above). The plurality of pixels may include the first pixel PX1, the second pixel PX2, and the third pixel PX3. Each of the first pixel PX1, the second pixel PX2, and the third pixel PX3 may include the pixel electrode 201, the common electrode 205, and the intermediate layer 203. In one embodiment, the first pixel PX1 may be a red pixel, the second pixel PX2 may be a green pixel, and the third pixel PX3 may be a blue pixel. For example, the first pixel PX1 may be the aforementioned first-first pixel PX11 of FIG. 1, the second pixel PX2 may be the aforementioned first-second pixel PX12 of FIG. 1, and the third pixel PX3 may be the aforementioned first-third pixel PX13 of FIG. 1.

The pixel electrode 201 may be independently provided in each of the first pixel PX1, the second pixel PX2, and the third pixel PX3.

The intermediate layer 203 of each of the first pixel PX1, the second pixel PX2, and the third pixel PX3 may include the first emitting unit EU1 and the second emitting unit EU2 that are sequentially stacked, and the charge generation layer CGL disposed between the first emitting unit EU1 and the second emitting unit EU2. The charge generation layer CGL may include the negative charge generation layer nCGL and the positive charge generation layer pCGL. The charge generation layer CGL may be a common layer continuously formed in the first pixel PX1, the second pixel PX2, and the third pixel PX3.

The first emitting unit EU1 of the first pixel PX1 may include the hole injection layer HIL, the hole transport layer HTL, the red light emitting layer REML, and the electron transport layer ETL that are sequentially stacked on the pixel electrode 201. The first emitting unit EU1 of the second pixel PX2 may include the hole injection layer HIL, the hole transport layer HTL, the green light emitting layer GEML, and the electron transport layer ETL that are sequentially stacked on the pixel electrode 201. The first emitting unit EU1 of the third pixel PX3 may include the hole injection layer HIL, the hole transport layer HTL, the blue light emitting layer BEML, and the electron transport layer ETL that are sequentially stacked on the pixel electrode 201. Each of the hole injection layer HIL, the hole transport layer HTL, and the electron transport layer ETL of the first emitting unit EU1 may be a common layer continuously formed in the first pixel PX1, the second pixel PX2, and the third pixel PX3.

The second emitting unit EU2 of the first pixel PX1 may include the hole transport layer HTL, an auxiliary layer AXL, the red light emitting layer REML, and the electron transport layer ETL that are sequentially stacked on the charge generation layer CGL. The second emitting unit EU2 of the second pixel PX2 may include the hole transport layer HTL, the green light emitting layer GEML, and the electron transport layer ETL that are sequentially stacked on the charge generation layer CGL. The second emitting unit EU2 of the third pixel PX3 may include the hole transport layer HTL, the blue light emitting layer BEML, and the electron transport layer ETL that are sequentially stacked on the charge generation layer CGL. Each of the hole transport layer HTL and the electron transport layer ETL of the second emitting unit EU2 may be a common layer continuously formed in the first pixel PX1, the second pixel PX2, and the third pixel PX3. In one embodiment, at least one of a hole blocking layer or a buffer layer may be further included between the light emitting layer and the electron transport layer ETL in the second emitting unit EU2 of the first pixel PX1, the second pixel PX2, and the third pixel PX3.

A thickness H1 of the red light emitting layer REML, a thickness H2 of the green light emitting layer GEML, and a thickness H3 of the blue light emitting layer BEML may be determined according to the resonance distance. The auxiliary layer AXL may be a layer added to adjust the resonance distance, and may include a resonance auxiliary material.

For example, the auxiliary layer AXL may include the same material as the hole transport layer HTL.

In FIG. 27, the auxiliary layer AXL may be disposed only in the first pixel PX1, but the embodiment of the present disclosure is not limited thereto. For example, the auxiliary layer AXL may be disposed in at least one of the first pixel PX1, the second pixel PX2, or the third pixel PX3 to adjust the resonance distance of each of the first pixel PX1, the second pixel PX2, and the third pixel PX3.

The display panel 1000 of the display device 1 may further include a capping layer 207 disposed on the common electrode 205. The capping layer 207 may serve to improve luminous efficiency by creating constructive interference. Accordingly, the light extraction efficiency of a light emitting element (e.g., an organic light emitting diode) may be increased, so that the luminous efficiency of the light emitting element (e.g., the organic light emitting diode) may be improved.

Figure 28:
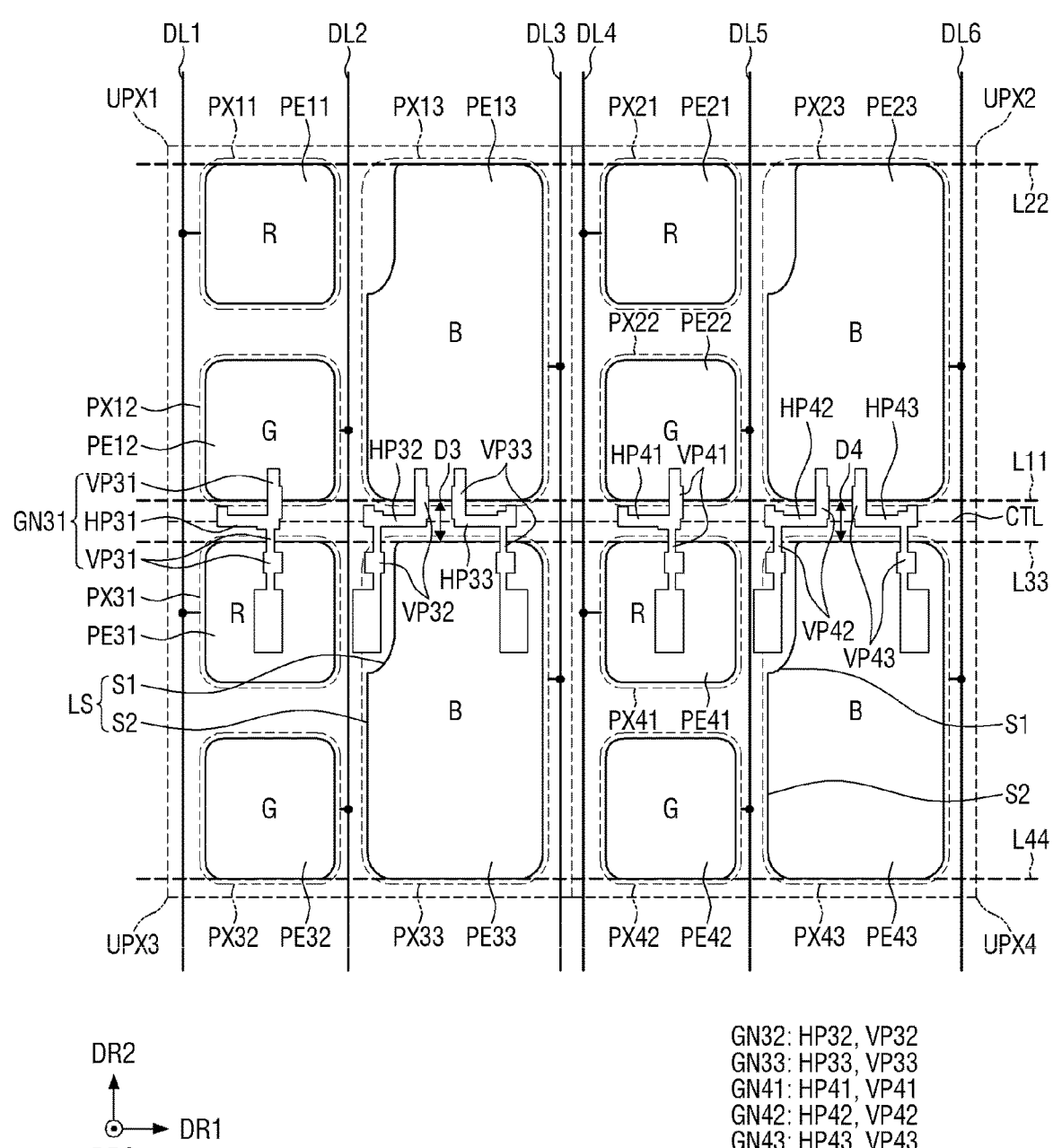
FIG. 28 is a diagram schematically showing four adjacent unit pixels of a display device according to one embodiment.
Figure 29A:
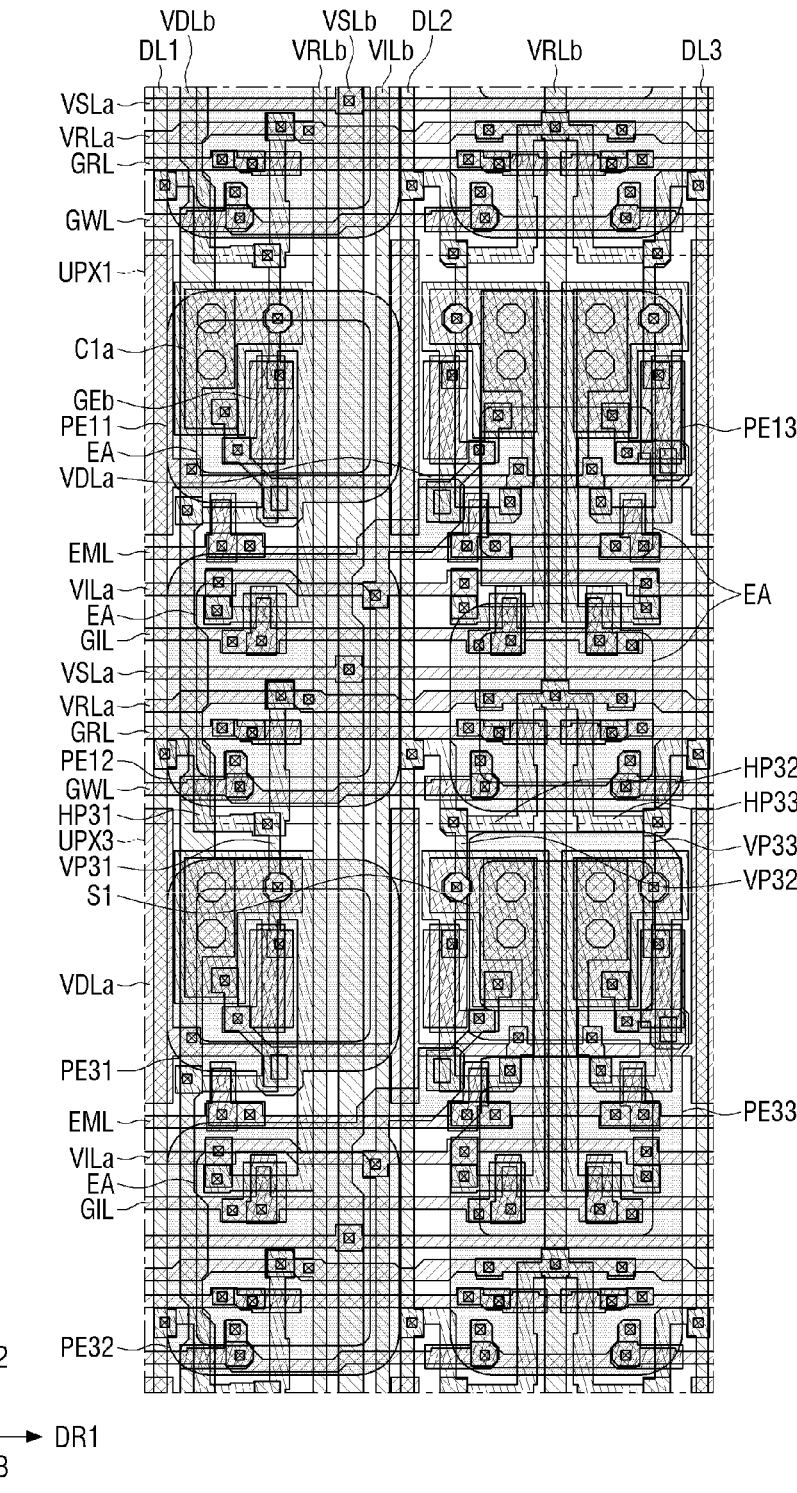
FIG. 29A is a detailed plan view of the first unit pixel and the third unit pixel of FIG. 28.
Figure 29B:
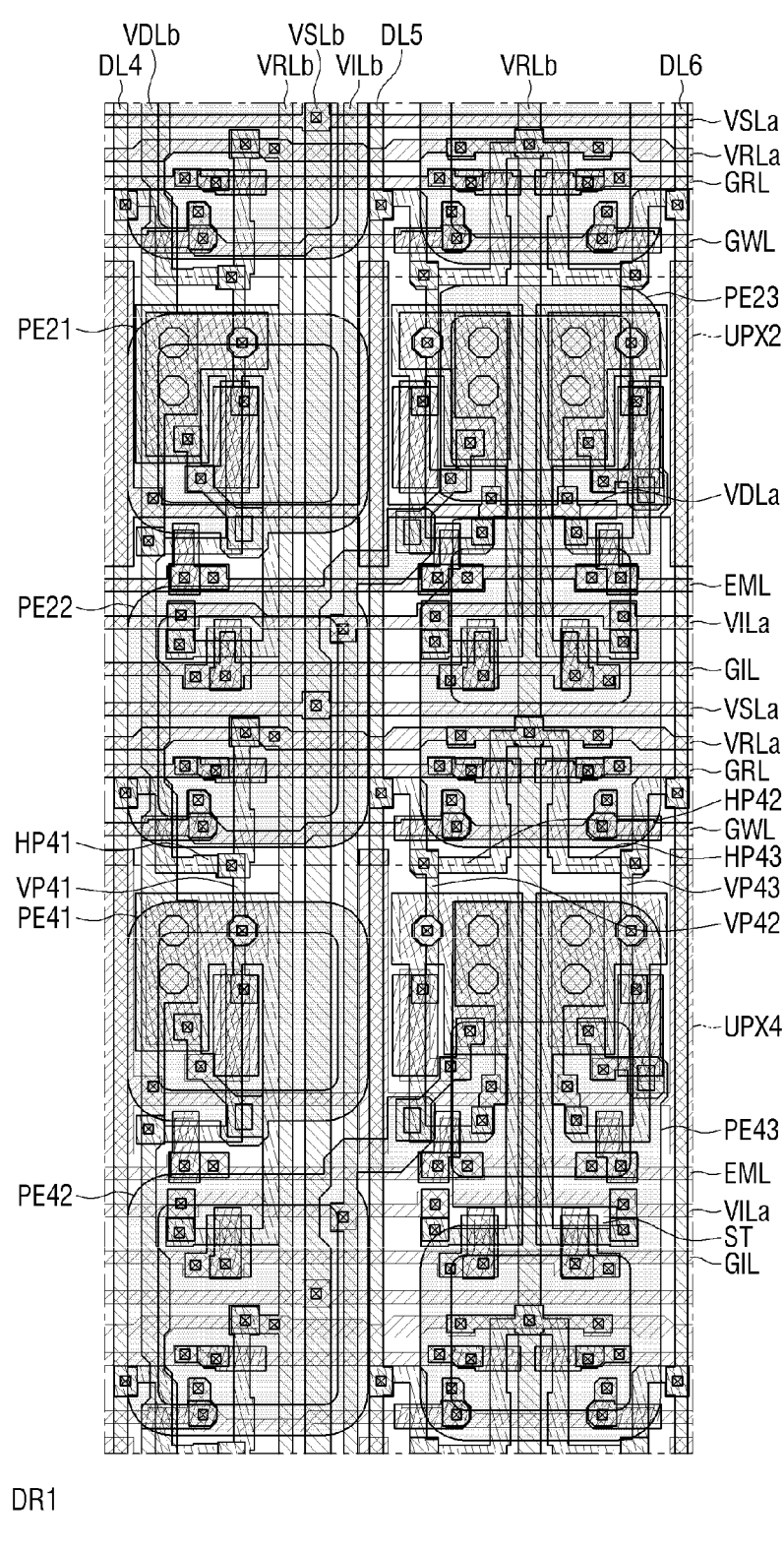
FIG. 29B is a detailed plan view of the second unit pixel and the fourth unit pixel of FIG. 28.

FIG. 28 is a diagram schematically showing four adjacent unit pixels of a display device according to one embodiment, FIG. 29A is a detailed plan view of the first unit pixel and the third unit pixel of FIG. 28, and FIG. 29B is a detailed plan view of the second unit pixel and the fourth unit pixel of FIG. 28.

As shown in FIGS. 28, 29A, and 29B, the plurality of unit pixels UPX1 to UPX4 may be disposed in the display area DA of the display device 1 (or the display panel 1000 of the display device 1) according to one embodiment of the present disclosure. For example, the plurality of unit pixels may include the first unit pixel UPX1, the second unit pixel UPX2, the third unit pixel UPX3, and the fourth unit pixel UPX4.

Here, the display device 1 of FIGS. 28, 29A, and 29B is different in that the first-third pixel electrode PE13, the second-third pixel electrode PE23, the third-third pixel electrode PE33, and the fourth-third pixel electrode PE43 have areas larger than those of the first-third pixel electrode PE13, the second-third pixel electrode PE23, the third-third pixel electrode PE33, and the fourth-third pixel electrode PE43 of FIG. 4 (or FIGS. 5A and 5B) described above. Accordingly, in the embodiment related to FIGS. 28, 29A and 29B, only the differences will be described.

As shown in FIG. 28 (or FIGS. 29A and 29B), the first-third pixel electrode PE13 may further extend along the upward direction (for example, the second direction DR2 or the extension direction of the data line) compared to the first-third pixel electrode PE13 of FIG. 4. For example, the upper side of the first-third pixel electrode PE13 of FIG. 28 (or FIGS. 29A and 29B) may further extend to the upper side of the second-third pixel electrode PE23 provided in another unit pixel (for example, the second unit pixel UPX2) adjacent in the first direction DR1.

Further, the second-third pixel electrode PE23 of FIG. 28 (or FIGS. 29A and 29B) may further extend along the downward direction (for example, the second reverse direction) compared to the second-third pixel electrode PE23 of FIG. 4. For example, the lower side of the second-third pixel electrode PE23 may further extend to the lower side of the first-third pixel electrode provided in another unit pixel (for example, the first unit pixel UPX1) adjacent in the first direction DR1.

Further, the third-third pixel electrode PE33 of FIG. 28 (or FIGS. 29A and 29B) may further extend along the downward direction (for example, the second reverse direction) compared to the fourth-third pixel electrode PE43 of FIG. 4. For example, the lower side of the third-third pixel electrode PE33 of FIG. 28 (or FIGS. 29A and 29B) may further extend to the lower side of the fourth-third pixel electrode PE43 provided in another unit pixel (for example, the fourth unit pixel UPX4) adjacent in the first direction DR1.

Further, the fourth-third pixel electrode PE43 of FIG. 28 (or FIGS. 29A and 29B) may further extend along the upward direction (for example, in the second direction DR2) compared to the fourth-third pixel electrode PE43 of FIG. 4. For example, the upper side of the fourth-third pixel electrode PE43 of FIG. 28 (or FIGS. 29A and 29B) may further extend to the upper side of the third-third pixel electrode PE33 provided in another unit pixel (for example, the third unit pixel UPX3) adjacent in the first reverse direction.

Accordingly, as in the example shown in FIG. 28 (or FIGS. 29A and 29B), the lower surface of the first-third pixel electrode PE13 provided in the first unit pixel UPX1 and the lower surface of the second-third pixel electrode PE23 provided in the second unit pixel UPX2 may be disposed on the same imaginary line L11 in a plan view. Further, the upper surface of the first-third pixel electrode PE13 provided in the first unit pixel UPX1 and the upper surface of the second-third pixel electrode PE23 provided in the second unit pixel UPX2 may be disposed on the same imaginary line L22 in a plan view. Further, the upper surface of the third-third pixel electrode PE33 provided in the third unit pixel UPX3 and the upper surface of the fourth-third pixel electrode PE43 provided in the fourth unit pixel UPX4 may be disposed on the same imaginary line L33 in a plan view. Further, the lower surface of the third-third pixel electrode PE33 provided in the third unit pixel UPX3 and the lower surface of the fourth-third pixel electrode PE43 provided in the fourth unit pixel UPX4 may be disposed on the same imaginary line L44 in a plan view. Therefore, a distance D3 between the first-third pixel electrode PE13 and the third-third pixel electrode PE33 disposed adjacent thereto in the second direction DR2 and a distance D4 between the second-third pixel electrode PE23 and the fourth-third pixel electrode PE43 disposed adjacent thereto in the direction DR2 may be the same. For example, the distance D3 and the distance D4 may have the same distance.

Therefore, according to FIG. 28 (or FIGS. 29A and 29B), the overlapping area (hereinafter, referred to as a first overlapping area) between the third-third pixel electrode PE33 and the third-third gate node GN33 may be substantially the same as the overlapping area (hereinafter, referred to as a second overlapping area) between the fourth-third pixel electrode PE43 and the fourth-third gate node GN43. Further, according to FIG. 27, the overlapping area (hereinafter, referred to as a third overlapping area) between the first-third pixel electrode PE13 and the gate nodes (for example, the third-second gate node GN32 and the third-third gate node GN33) may be substantially the same as the overlapping area (hereinafter, referred to as a fourth overlapping area) between the second-third pixel electrode PE23 and the gate nodes (for example, the fourth-second gate node GN42 and the fourth-third gate node GN43).

As described above, the first overlapping area and the second overlapping area are the same, and the third overlapping area and the fourth overlapping area are the same, so that the third pixel electrodes of the unit pixels UPX1 to UPX4 may overlap the corresponding gate nodes GN31 to GN43 with the same area and, thus, the capacitance variation between the pixel electrodes for each unit pixel and the gate nodes may be minimized.

Meanwhile, the distance between the first-second pixel electrode PE12 of the first unit pixel UPX1 and the third-first pixel electrode PE31 of the third unit pixel UPX3 adjacent thereto in the second direction DR2 may be the same as or different from the above-described distance D3. Further, the distance between the second-second pixel electrode PE22 of the second unit pixel UPX2 and the fourth-first pixel electrode PE41 of the fourth unit pixel UPX4 adjacent thereto in the second direction DR2 may be the same as or different from the above-described distance D4.

Meanwhile, as illustrated in FIGS. 29A and 29B, the emission areas of the pixels of FIGS. 29A and 29B and the emission areas of the pixels of FIGS. 5A and 5B corresponding thereto may have the same area. For example, the first-third pixel electrode of FIGS. 29A and 29B has an area greater than that of the first-third pixel electrode of FIGS. 5A and 5B, but the emission area of the first-third pixel of FIGS. 29A and 29B and the emission area of the first-third pixel of FIGS. 5A and 5B may have the same area.

Figure 30:
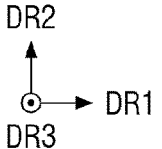
FIG. 30 is a diagram schematically illustrating four adjacent unit pixels of a display device according to one embodiment of the present disclosure.

FIG. 30 is a diagram schematically illustrating four adjacent unit pixels of a display device according to one embodiment of the present disclosure.

As in the example shown in FIG. 30, a plurality of unit pixels may be disposed in the display area DA of the display device 1 (or the display panel 1000 of the display device 1). For example, the plurality of unit pixels may include the first unit pixel UPX1, the second unit pixel UPX2, the third unit pixel UPX3, and the fourth unit pixel UPX4.

In FIG. 30, the unit pixels UPX1 to UPX4 may be distinguished with respect to the pixel electrodes, for example. For example, the first unit pixel UPX1 may be a unit pixel including the first-first pixel electrode PE11 of the first-first pixel PX11, the first-second pixel electrode PE12 of the first-second pixel PX12, and the first-third pixel electrode PE13 of the first-third pixel PX13, the second unit pixel UPX2 may be a unit pixel including the second-first pixel electrode PE21 of the second-first pixel PX21, the second-second pixel electrode PE22 of the second-second pixel PX22, the second-third pixel electrode PE23 of the second-third pixel PX23, and the third unit pixel UPX3 may be a unit pixel including the third-first pixel electrode PE31 of the third-first pixel PX31, the third-second pixel electrode PE32 of the third-second pixel PX32, and the third-third pixel electrode PE33 of the third-third pixel PX33.

Each of the unit pixels UPX1 to UPX4 may include a plurality of pixels. For example, the first unit pixel UPX1 may include the first-first pixel PX11, the first-second pixel PX12, and the first-third pixel PX13, the second unit pixel UPX2 may include the second-first pixel PX21, the second-second pixel PX22, and the second-third pixel PX23, the third unit pixel UPX3 may include the third-first pixel PX31, the third-second pixel PX32, and the third-third pixel PX33, and the fourth unit pixel UPX4 may include the fourth-first pixel PX41, the fourth-second pixel PX42, and the fourth-third pixel PX43.

Each of the pixels PX11 to PX43 may include a light emitting element and a pixel circuit connected to the light emitting element (e.g., an anode electrode of the light emitting element corresponding to a pixel electrode). For example, the first-first pixel PX11 may include a first-first pixel electrode PE11 and a first-first pixel circuit connected to the first-first pixel electrode PE11, the first-second pixel PX12 may include a first-second pixel electrode PE12 and a first-second pixel circuit connected to the first-second pixel electrode PE12, and the first-third pixel PX13 may include a first-third pixel electrode PE13 and a first-third pixel circuit connected to the first-third pixel electrode PE13. Further, the second-first pixel PX21 may include a second-first pixel electrode PE21 and a second-first pixel circuit connected to the second-first pixel electrode PE21, the second-second pixel PX22 may include a second-second pixel electrode PE22 and a second-second pixel circuit connected to the second-second pixel electrode PE22, and the second-third pixel PX23 may include a second-third pixel electrode PE23 and a second-third pixel circuit connected to the second-third pixel electrode PE23. Further, the third-first pixel PX31 may include a third-first pixel electrode PE31 and a third-first pixel circuit connected to the third-first pixel electrode PE31, the third-second pixel PX32 may include a third-second pixel electrode PE32 and a third-second pixel circuit connected to the third-second pixel electrode PE32, and the third-third pixel PX33 may include a third-third pixel electrode PE33 and a third-third pixel circuit connected to the third-third pixel electrode PE33. Further, the fourth-first pixel PX41 may include a fourth-first pixel electrode PE41 and a fourth-first pixel circuit connected to the fourth-first pixel electrode PE41, the fourth-second pixel PX42 may include a fourth-second pixel electrode PE42 and a fourth-second pixel circuit connected to the fourth-second pixel electrode PE42, and the fourth-third pixel PX43 may include a fourth-third pixel electrode PE43 and a fourth-third pixel circuit connected to the fourth-third pixel electrode PE43.

The pixels (for example, three pixels) of each of the unit pixels UPX1 to UPX4 may include light emitting layers providing lights of different wavelengths. For example, each of the first-first pixel PX11 of the first unit pixel UPX1, the second-first pixel PX21 of the second unit pixel UPX2, the third-first pixel PX31 of the third unit pixel UPX3, and the fourth-first pixel PX41 of the fourth unit pixel UPX4 may include a light emitting layer providing light of a first wavelength. Further, each of the first-second pixel PX12 of the first unit pixel UPX1, the second-second pixel PX22 of the second unit pixel UPX2, the third-second pixel PX32 of the third unit pixel UPX3, and the fourth-second pixel PX42 of the fourth unit pixel UPX4 may include a light emitting layer providing light of a second wavelength. Further, each of the first-third pixel PX13 of the first unit pixel UPX1, the second-third pixel PX23 of the second unit pixel UPX2, the third-third pixel PX33 of the third unit pixel UPX3, and the fourth-third pixel PX43 of the fourth unit pixel UPX4 may include a light emitting layer providing light of a third wavelength. Here, the light of the first wavelength may correspond to a wavelength of red light, the light of the second wavelength may correspond to a wavelength of green light, and the light of the third wavelength may correspond to a wavelength of blue light. However, the present disclosure is not limited thereto, and, for example, the light of the first wavelength may correspond to the wavelength of green light, the light of the second wavelength may correspond to the wavelength of red light, and the light of the third wavelength may correspond to the wavelength of blue light. For another example, the light of the first wavelength may correspond to the wavelength of green light, the light of the second wavelength may correspond to the wavelength of blue light, and the light of the third wavelength may correspond to the wavelength of red light. For another example, the light of the first wavelength may correspond to the wavelength of blue light, the light of the second wavelength may correspond to the wavelength of red light, and the light of the third wavelength may correspond to the wavelength of green light. For another example, the light of the first wavelength may correspond to the wavelength of blue light, the light of the second wavelength may correspond to the wavelength of green light, and the light of the third wavelength may correspond to the wavelength of red light. For a specific example, in the first unit pixel UPX1, the first-first pixel PX11 may provide light corresponding to any one of the first, second, and third wavelengths, the first-second pixel PX12 may provide light corresponding to a wavelength different from the wavelength of the light of the first-first pixel PX11 among the first, second, and third wavelengths, and the first-third pixel PX13 may provide light corresponding to a wavelength different from the wavelengths of the lights of the first-first and first-second pixels PX11 and PX12 among the first, second, and third wavelengths.

Each of the pixels PX11 to PX43 may be connected to a respectively data line among the data lines. For example, pixels providing light of the same wavelength among pixels arranged in a column along the extension direction (or length direction; for example, the second direction DR2) of the data line may be connected to the same data line. For one example, the first-first pixel PX11 of the first unit pixel UPX1 and the third-first pixel PX31 of the second unit pixel UPX2 may be connected to the first data line DL1, the first-second pixel PX12 of the first unit pixel UPX1 and the third-second pixel PX32 of the second unit pixel UPX2 may be connected to the second data line DL2, the first-third pixel PX13 of the first unit pixel UPX1 and the third-third pixel PX33 of the second unit pixel UPX2 may be connected to the third data line DL3, the second-first pixel PX21 of the second unit pixel UPX2 and the fourth-first pixel PX41 of the fourth unit pixel UPX4 may be connected to the fourth data line DL4, the second-second pixel PX22 of the second unit pixel UPX2 and the fourth-second pixel PX42 of the fourth unit pixel UPX4 may be connected to the fifth data line DL5, and the second-third pixel PX23 of the second unit pixel UPX2 and the fourth-third pixel PX43 of the fourth unit pixel UPX4 may be connected to the sixth data line DL6.

At least two pixels among the pixels included in one unit pixel may include pixel electrodes having different areas. For example, as shown in FIG. 29, among the three pixels provided in the first unit pixel UPX1, the first-third pixel PX13 may include the pixel electrode (for example, the first-third pixel electrode PE13) having the largest area. Meanwhile, the first-first pixel electrode PE11 of the first-first pixel PX11 provided in the first unit pixel UPX1 and the first-second pixel electrode PE12 of the first-second pixel PX12 provided in the first unit pixel UPX1 may have the same area. Other unit pixels may also have the same configuration as that of the first unit pixel UPX1.

The pixel circuits of the pixels PX11 to PX43 may include gate nodes GN11, GN12, GN13, GN21, GN22, GN23, GN31, GN32, GN33, GN41, GN42, and GN43 connected to the gate electrode of the first transistor (for example, T1 of FIG. 3) of the corresponding pixel. At least a part of the gate node may be disposed to be spaced apart from the pixel electrodes not to overlap the pixel electrodes.

For example, in FIG. 30, a horizontal portion HP11 of the first-first gate node GN11, which is a node connected to the gate electrode of the first transistor included in the first-first pixel PX11 of the first unit pixel UPX1, may be disposed between the first-first pixel electrode PE11 and the first-second pixel electrode PE12 adjacent thereto along the second direction D2. In other words, the first-first gate node GN11 may include the horizontal portion HP11 extending along the first direction DR1 and a vertical portion VP11 extending along the second direction DR2, and the horizontal portion HP11 of the first-first gate node GN11 may be disposed between the first-first pixel electrode PE11 of the first unit pixel UPX1 and the first-second pixel electrode PE12 of the first unit pixel UPX1 not to overlap the pixel electrodes in a plan view. Meanwhile, a part of the vertical portion VP11 (for example, an upper vertical portion) of the first-first gate node GN11 may overlap the pixel electrode (for example, the first-first pixel electrode PE11) connected to the first-first gate node GN11 through the first capacitor (for example, the first capacitor C1 of the first-first pixel PX11).

Further, in FIG. 30, a horizontal portion HP12 of the first-second gate node GN12, which is a node connected to the gate electrode of the first transistor included in the first-second pixel PX12 of the first unit pixel UPX1, may be disposed between the first-first pixel electrode PE11 and the first-second pixel electrode PE12 adjacent thereto along the second direction DR2. In other words, the first-second gate node GN12 may include the horizontal portion HP12 extending along the first direction DR1 and the vertical portion VP12 extending along the second direction DR2, and the horizontal portion HP12 of the first-second gate node GN12 may be disposed between the first-first pixel electrode PE11 of the first unit pixel UPX1 and the first-second pixel electrode PE12 of the first unit pixel UPX1 not to overlap the pixel electrodes in a plan view. Meanwhile, a part of the vertical portion VP12 (for example, the upper vertical portion) of the first-second gate node GN12 may overlap the pixel electrode (for example, the first-first pixel electrode PE11) connected to the first-second gate node GN12 through the first capacitor (for example, the first capacitor C1 of the first-second pixel PX12). Further, a part of the vertical portion VP12 (for example, the lower vertical portion) of the first-second gate node GN12 may overlap the first-second pixel electrode PE12 adjacent to the first-first pixel electrode PE11 in the second direction DR2.

Further, in FIG. 30, the first-third gate node GN13, which is a node connected to the gate electrode of the first transistor included in the first-third pixel PX13 of the first unit pixel UPX1, may overlap the first-third pixel PX13. In other words, the first-third gate node GN13 may include the horizontal portion HP13 extending along the first direction DR1 and the vertical portion VP13 extending along the second direction DR2, and the entire first-third gate node GN13 including the vertical portion HP13 and the horizontal portion VP13 may overlap the first-third pixel electrode PE13.

Meanwhile, in FIG. 30, the second-first gate node GN21 may be a node connected to the gate electrode of the first transistor included in the second-first pixel PX21 of the second unit pixel UPX2, the second-second gate node GN22 may be a node connected to the gate electrode of the first transistor included in the second-second pixel PX22 of the second unit pixel UPX2, the second-third gate node GN23 may be a node connected to the gate electrode of the first transistor included in the second-third pixel PX23 of the second unit pixel UPX2, the third-first gate node GN31 may be a node connected to the gate electrode of the first transistor included in the third-first pixel PX31 of the third unit pixel UPX3, the third-second gate node GN32 may be a node connected to the gate electrode of the first transistor included in the third-second pixel PX32 of the third unit pixel UPX3, the third-third gate node GN33 may be a node connected to the gate electrode of the first transistor included in the third-third pixel PX33 of the third unit pixel UPX3, the fourth-first gate node GN41 may be a node connected to the gate electrode of the first transistor included in the fourth-first pixel PX41 of the fourth unit pixel UPX4, the fourth-second gate node GN42 may be a node connected to the gate electrode of the first transistor included in the fourth-second pixel PX42 of the fourth unit pixel UPX4, and the fourth-third gate node GN43 may be a node connected to the gate electrode of the first transistor included in the fourth-third pixel PX43 of the fourth unit pixel UPX4. Here, the second-first gate node GN21, the third-first gate node GN31, and the fourth-first gate node GN41 may overlap the corresponding pixels similarly to the above-described first-first gate node GN11, the second-second gate node GN22, the third-second gate node GN32, and the fourth-second gate node GN42 may overlap the corresponding electrodes similarly to the above-described first-second gate node GN12, and the second-third gate node GN23, the third-third gate node GN33, and the fourth-third gate node GN43 may overlap the corresponding pixel electrodes similarly to the above-described first-third gate node GN13.

Figure 31A:
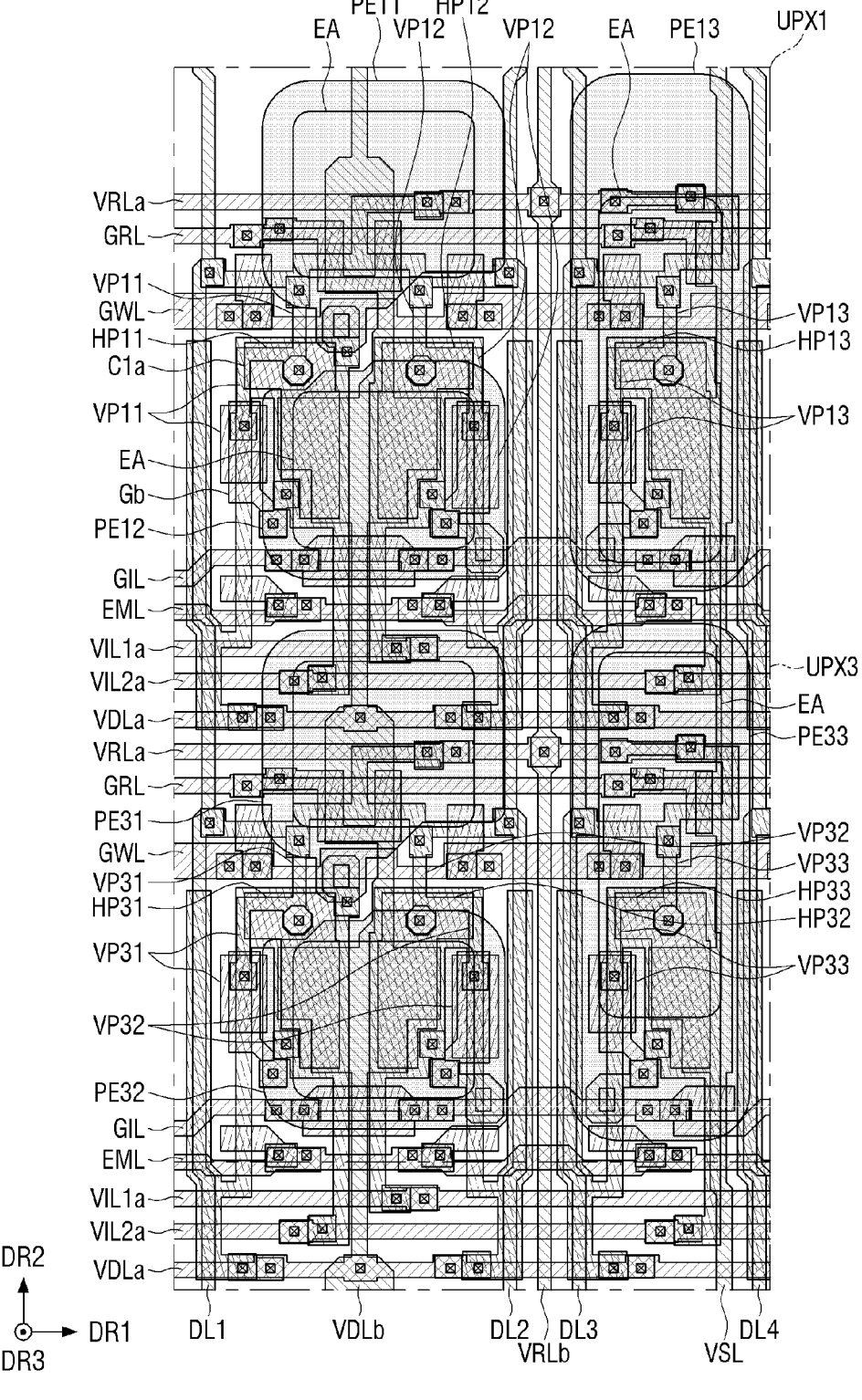
FIG. 31A is a detailed plan view of the first unit pixel and the third unit pixel of FIG. 30.
Figure 31B:
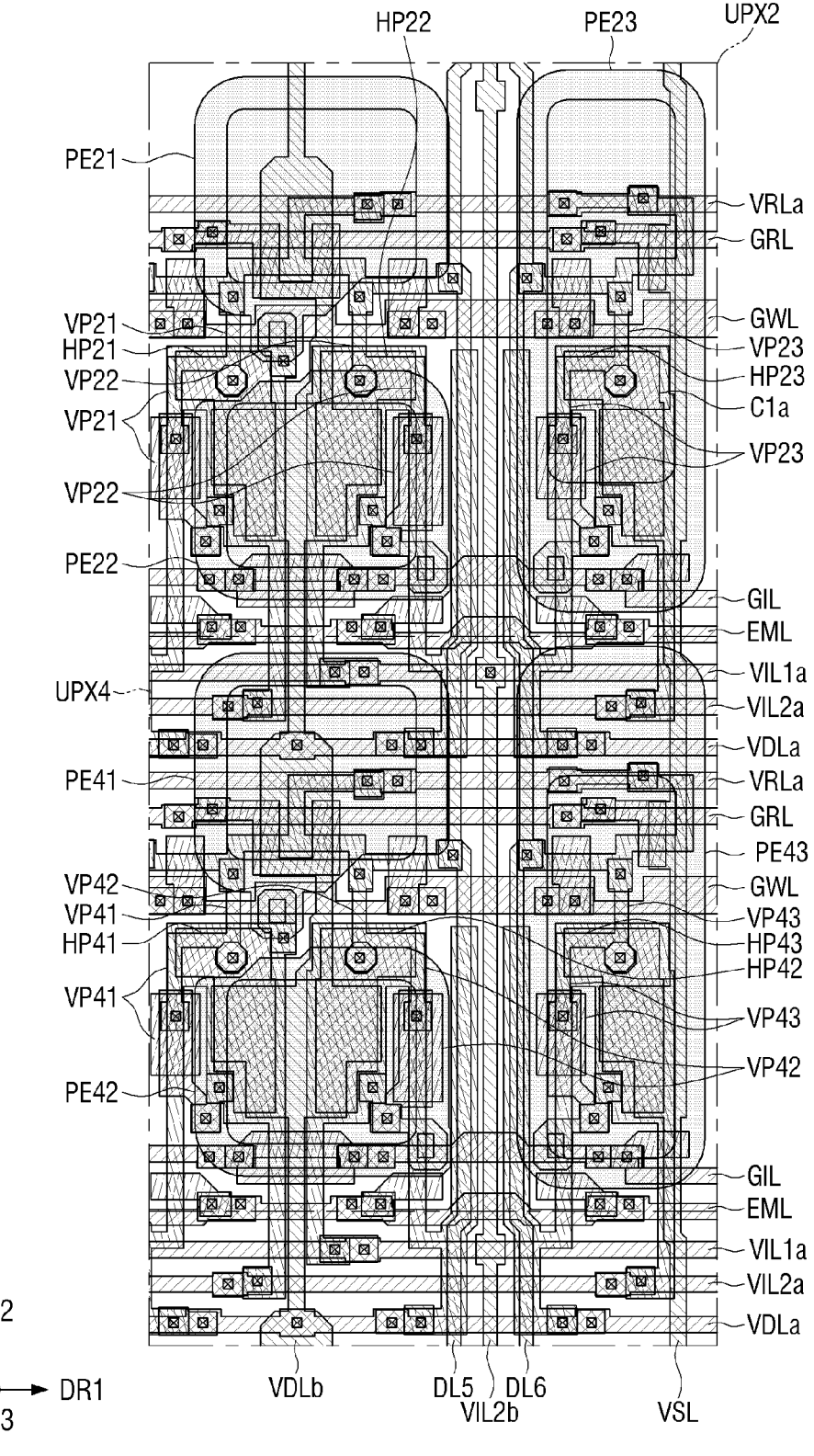
FIG. 31B is a detailed plan view of the second unit pixel and the fourth unit pixel of FIG. 30.
Figure 31C:
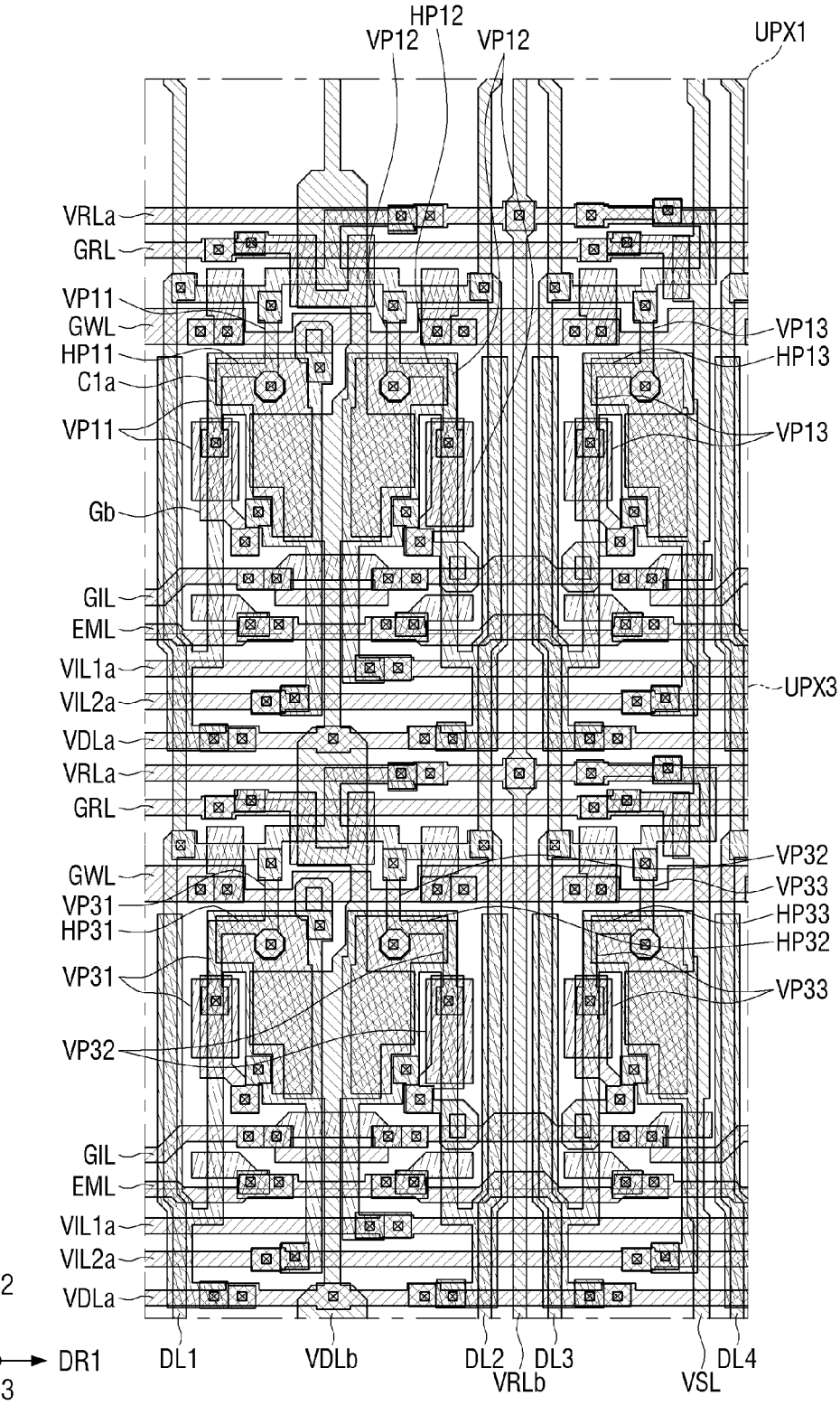
FIG. 31C is a plan view excluding pixel electrodes in FIG. 31A.
Figure 31D:
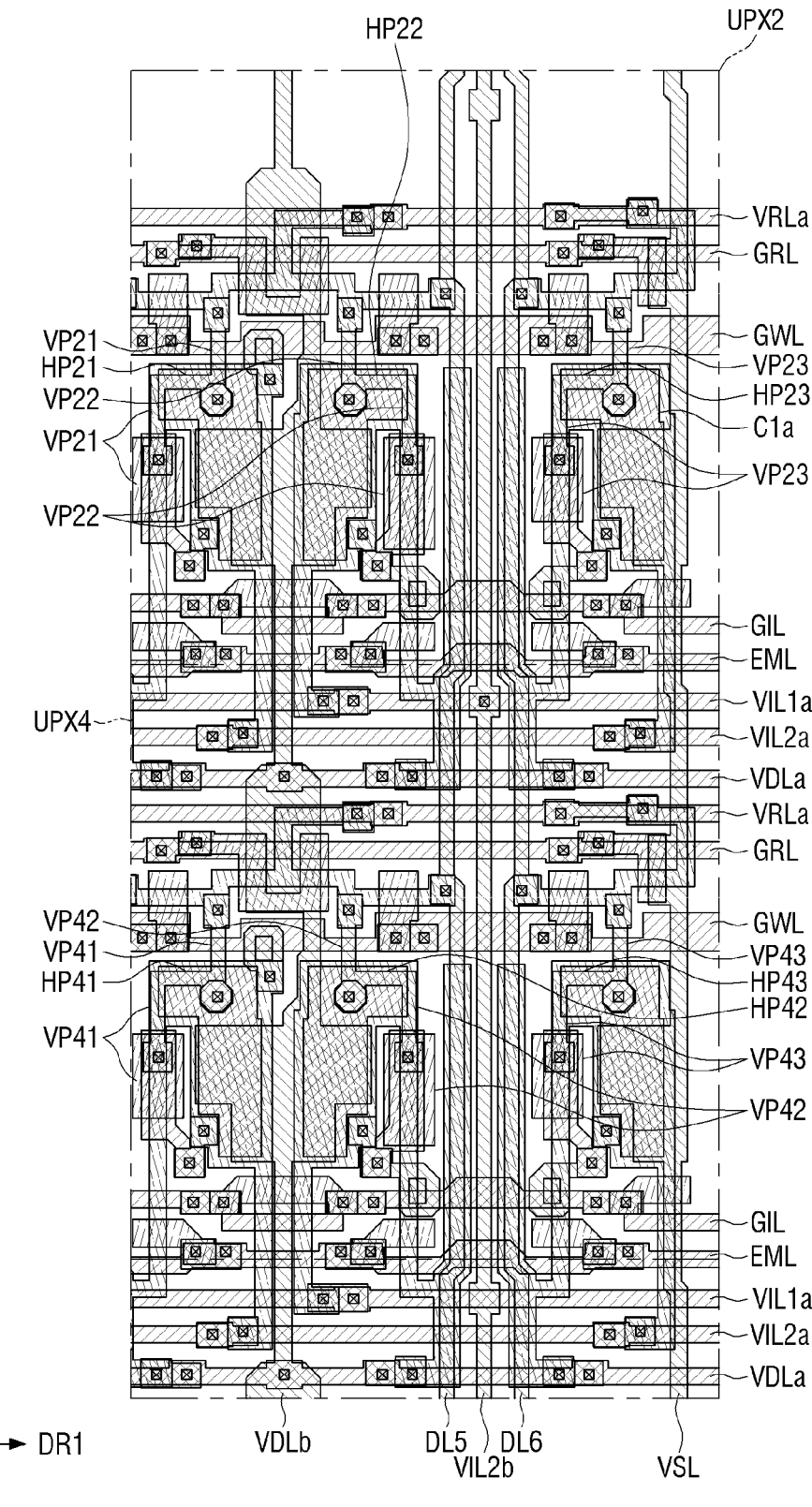
FIG. 31D is a plan view excluding pixel electrodes in FIG. 31B.
Figure 31E:
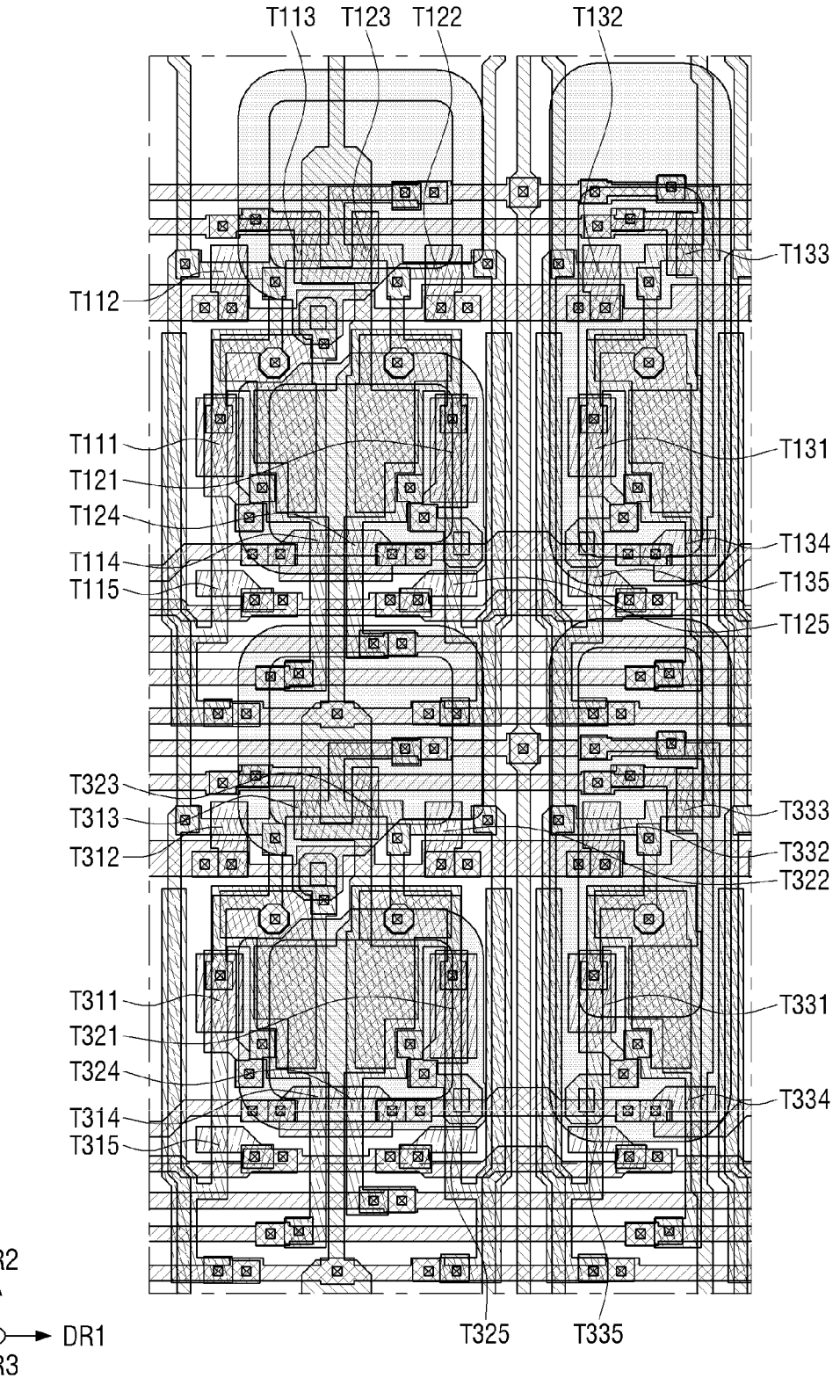
FIG. 31E is a plan view in which reference numerals of transistors in FIG. 31A are displayed.
Figure 31F:
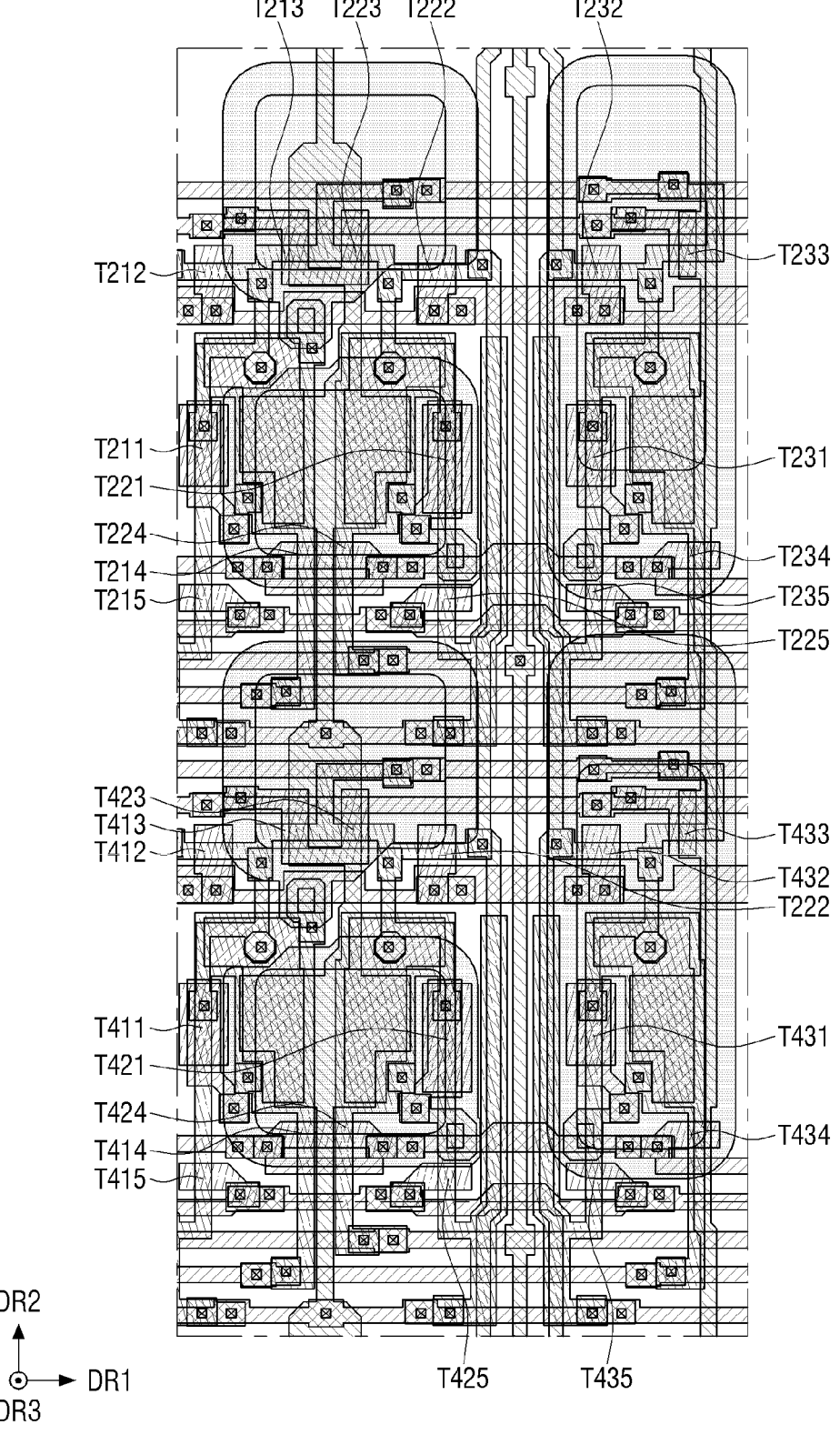
FIG. 31F is a plan view in which reference numerals of transistors in FIG. 31B are displayed.
Figure 32:
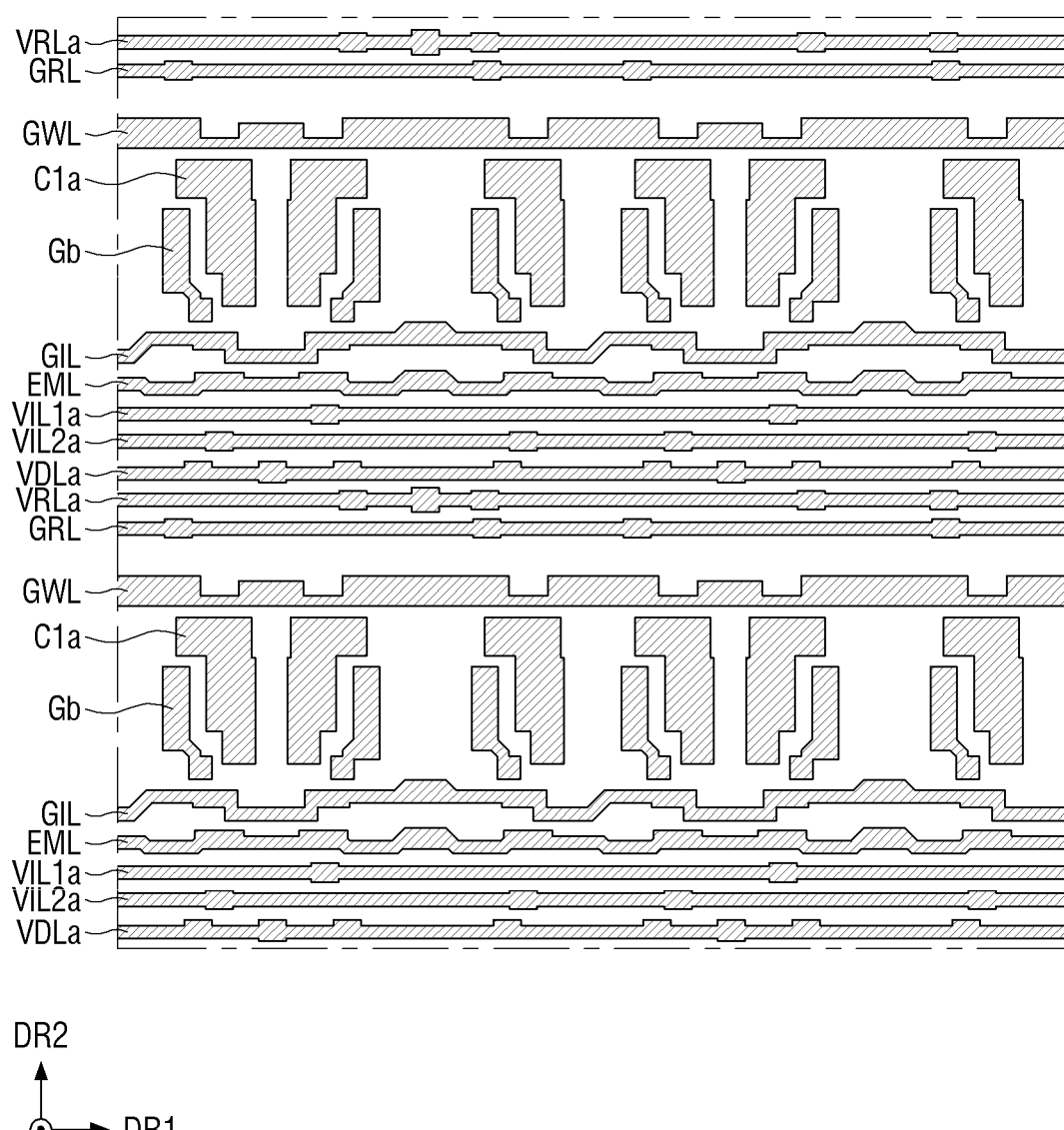
FIG. 32 is a plan view selectively showing only the first conductive layer among the components of FIGS. 31A and 31B.
Figure 33:
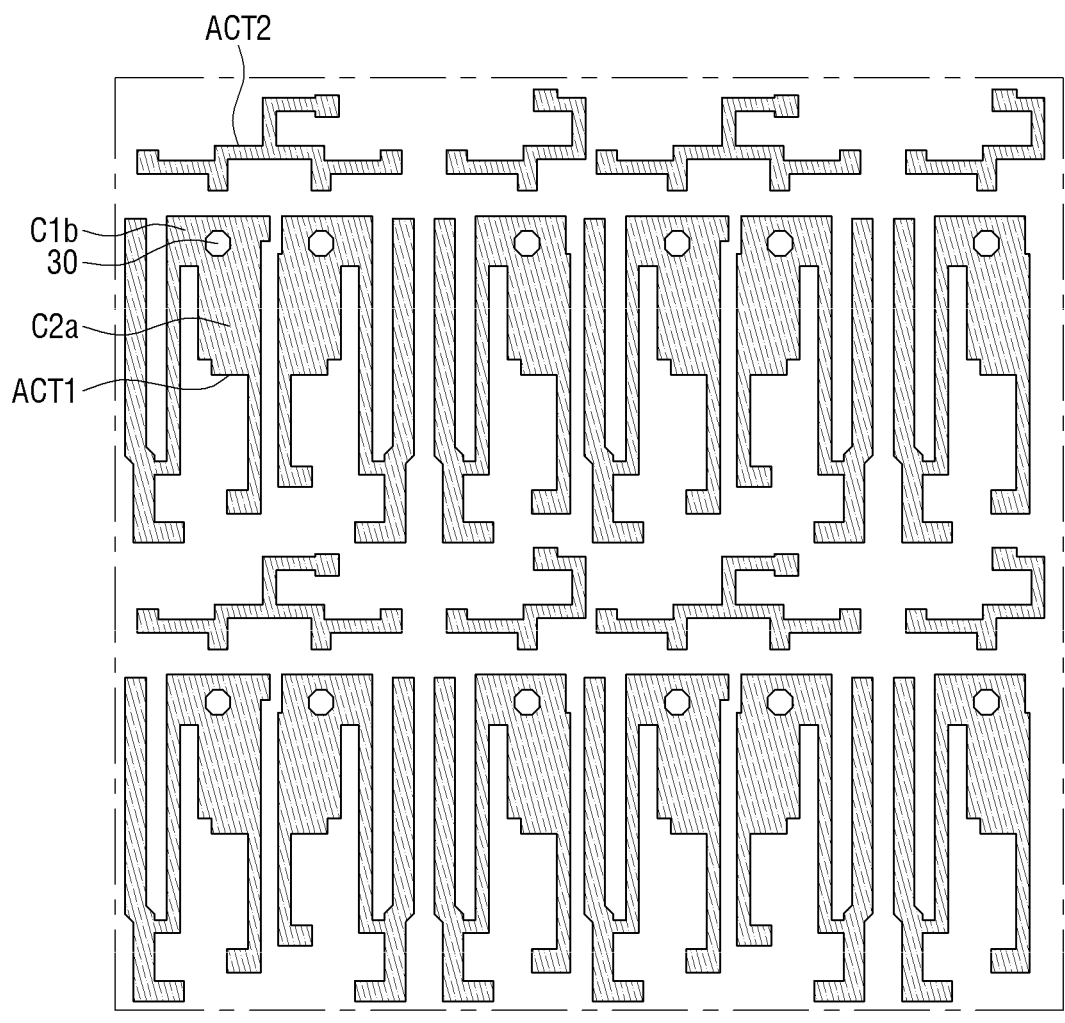
FIG. 33 is a plan view selectively showing only the second conductive layer among the components of FIGS. 31A and 31B.
Figure 33:
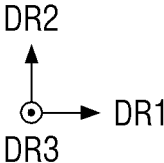
Figure 34:
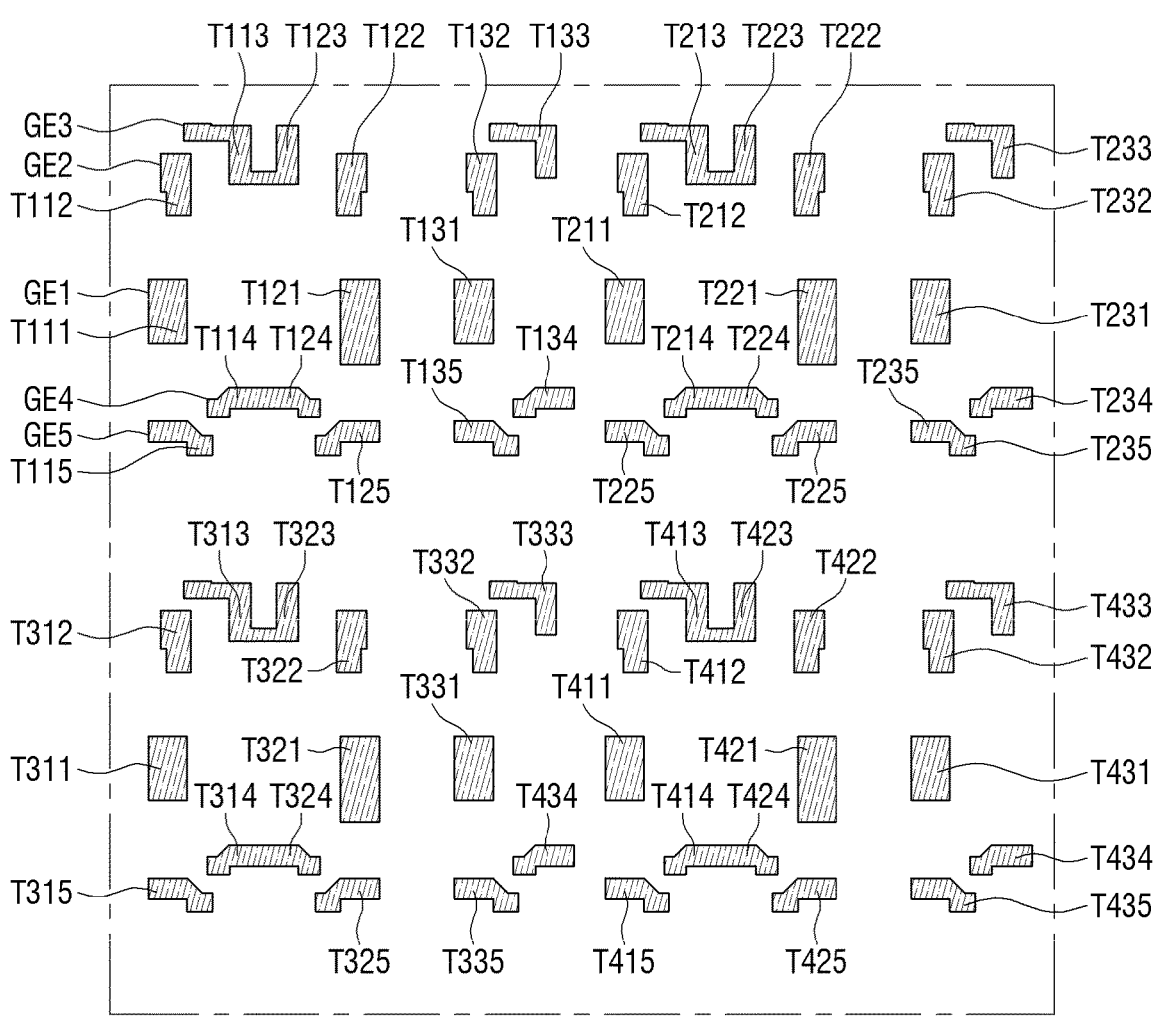
FIG. 34 is a plan view selectively showing only the third conductive layer among the components of FIGS. 31A and 31B.
Figure 34:
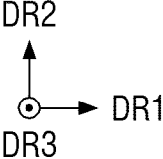
Figure 35:
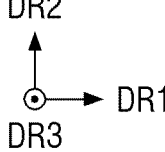
FIG. 35 is a plan view selectively showing only the fourth conductive layer among the components of FIGS. 31A and 31B.
Figure 36:
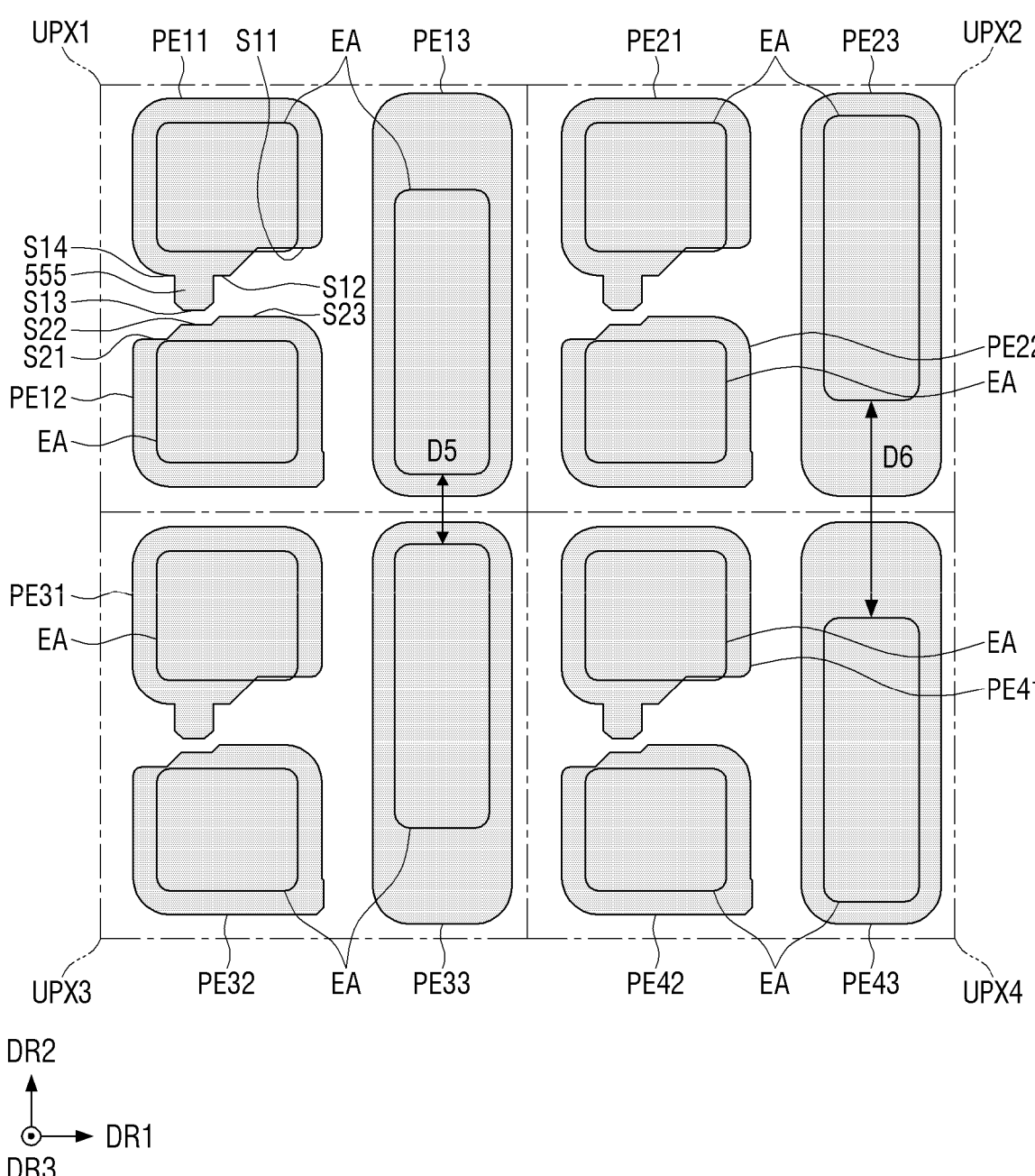
FIG. 36 is a plan view selectively showing only the fifth conductive layer among the components of FIGS. 31A and 31B.

FIG. 31A is a detailed plan view of the first unit pixel and the third unit pixel of FIG. 30, FIG. 31B is a detailed plan view of the second unit pixel and the fourth unit pixel of FIG. 30, FIG. 31C is a plan view excluding pixel electrodes in FIG. 31A, FIG. 31D is a plan view excluding pixel electrodes in FIG. 31B, FIG. 31E is a plan view in which reference numerals of transistors in FIG. 31A are displayed, FIG. 31F is a plan view in which reference numerals of transistors in FIG. 31B are displayed, FIG. 32 is a plan view selectively showing only the first conductive layer among the components of FIGS. 31A and 31B, FIG. 33 is a plan view selectively showing only the second conductive layer among the components of FIGS. 31A and 31B, FIG. 34 is a plan view selectively showing only the third conductive layer among the components of FIGS. 31A and 31B, FIG. 35 is a plan view selectively showing only the fourth conductive layer among the components of FIGS. 31A and 31B, and FIG. 36 is a plan view selectively showing only the fifth conductive layer among the components of FIGS. 31A and 31B.

The first conductive layer illustrated in FIGS. 31A to 31F and FIG. 32 may be disposed on the substrate SUB along the third direction DR3. The first conductive layer may serve as the voltage line for transmitting various voltages, the first lower capacitor electrode C1a, and the counter gate electrode Gb of each of the first transistors T111 to T431.

The first conductive layer may include the lower reference voltage line VRLa, the third scan line GRL, the first scan line GWL, the first lower capacitor electrode C1a, the counter gate electrode Gb, the second scan line GIL, the emission control line EML, the first lower initialization voltage line VIL1a, the second lower initialization voltage line VIL2a, and the first lower driving voltage line VDLa.

The lower reference voltage line VRLa and the upper reference voltage line VRLb to be described later may be connected to each other through a contact hole formed through the insulating layer, thereby constituting the above-described reference voltage line VRL. In other words, the reference voltage line VRL may include the plurality of lower reference voltage lines VRLa extending along the first direction DR1 and arranged along the second direction DR2, and the plurality of upper reference voltage lines VRLb extending along the second direction DR2 intersecting the lower reference voltage lines VRLa and arranged along the first direction DR1. The reference voltage line VRL may have a mesh shape.

The first lower capacitor electrode C1a may constitute the first capacitor C1 together with the first semiconductor layer ACT1 to be described later.

The counter gate electrode Gb may function as the counter gate electrode of each of the first transistors T111 to T431.

The first lower driving voltage line VDLa and the first upper driving voltage line VDLb to be described later may be connected to each other through a contact hole formed through the insulating layer, thereby constituting the above-described first driving voltage line VDL. In other words, the first driving voltage line VDL may include the plurality of lower driving voltage lines VDLa extending along the first direction DR1 and arranged along the second direction DR2, and the plurality of upper driving voltage lines VDLb extending along the second direction DR2 intersecting the lower driving voltage lines VDLa and arranged along the first direction DR1. The first driving voltage line VDL may have a mesh shape.

The first lower initialization voltage line VIL1a and the first upper initialization voltage line VIL1b may be connected to each other through the contact hole of the insulating layer, thereby constituting a first initialization voltage line. In other words, the first initialization voltage line may include the plurality of first lower initialization voltage lines VIL1a extending along the first direction DR1 and arranged along the second direction DR2, and the plurality of second upper initialization voltage lines VIL1b extending along the second direction DR2 intersecting the first lower initialization voltage lines VIL1a and arranged along the first direction DR1. The first initialization voltage line may have a mesh shape. The first initialization voltage line may be connected to pixels of any one color among pixels included in each unit pixel. For example, the first initialization voltage line may be connected to the fourth transistors (for example, T124, T224, T324, and T424) of green pixels providing light corresponding to a green wavelength.

The second lower initialization voltage line VIL2a and the second upper initialization voltage line VIL2b to be described later may be connected to each other through a contact hole formed through the insulating layer, thereby constituting a second initialization voltage line. In other words, the second initialization voltage line may include the plurality of second lower initialization voltage lines VIL2a extending along the first direction DR1 and arranged along the second direction DR2, and the plurality of second upper initialization voltage lines VIL2b extending along the second direction DR2 intersecting the second lower initialization voltage lines VIL2a and arranged along the first direction DR1. The second initialization voltage line may have a mesh shape. The second initialization voltage line may be connected to pixels of two or more colors among pixels included in each unit pixel. For example, the second initialization voltage line may be connected to the fourth transistors (for example, T114, T214, T314, and T414) of red pixels providing light corresponding to a red wavelength and the fourth transistors (for example, T134, T234, T334, and T434) of blue pixels providing light corresponding to a blue wavelength.

The first conductive layer may be formed as a single layer or multiple layers made of at least one of, for example, molybdenum (Mo), aluminum (Al), chromium (Cr), gold (Au), titanium (Ti), nickel (Ni), neodymium (Nd) and copper (Cu) or an alloy thereof. For another example, the light blocking layer BML may be an organic layer including a black pigment.

The second conductive layer shown in FIGS. 31A to 31F and FIG. 33 may be disposed on the first conductive layer along the third direction DR3, and an insulating layer may be disposed between the first conductive layer and the second conductive layer.

The second conductive layer may include, the first semiconductor layer ACT1 and a second semiconductor layer ACT2 separated from each other.

The first semiconductor layer ACT1 may constitute the first transistors T111 to T431, the fourth transistors T114 to T434, and the fifth transistors T115 to T435 together with gate electrodes to be described later.

In addition, the first semiconductor layer ACT1 may include the first upper capacitor electrode C1b and the second lower capacitor electrode C2a. The first upper capacitor electrode C1b together with the first lower capacitor electrode C1a described above may constitute the first capacitor C1. For example, the first capacitor C1 described above may be formed in an area in which the first lower capacitor electrode C1a and the first upper capacitor electrode C1b overlap.

Further, the first semiconductor layer ACT1 may have at least one hole 30 formed through the first semiconductor layer ACT1 along the third direction DR3. The hole 30 may be filled with the interlayer insulating layer ITL having a contact hole. The interlayer insulating layer ITL is disposed between the inner wall of the hole 30 and the outer wall of a contact hole, so that contact between the conductive layer formed through the contact hole of the interlayer insulating layer ITL and the first semiconductor layer ACT1 may be prevented.

The second semiconductor layer ACT2 may constitute the second transistors T112 to T432 and the third transistors T113 to T433 together with gate electrodes to be described later.

The first and second semiconductor layers ACT1 and ACT2 may include polycrystalline silicon, monocrystalline silicon, low-temperature polycrystalline silicon, amorphous silicon, or an oxide semiconductor material. When the semiconductor layer includes polycrystalline silicon or an oxide semiconductor material, in the semiconductor layer, the first electrode (for example, any one of the source electrode and the drain electrode) and the second electrode (for example, the other one of the source electrode and the drain electrode described above) may be conductive regions (for example, the source region and the drain region) having conductivity by ion doping.

The third conductive layer shown in FIGS. 31A to 31F and FIG. 34 may be disposed on the second conductive layer along the third direction DR3, and an insulating layer may be disposed between the second conductive layer and the third conductive layer.

The third conductive layer may include a plurality of gate electrodes separated from each other. For example, the third conductive layer may include the first gate electrode GE1 of the first transistor, the second gate electrode GE2 of the second transistor, the third gate electrode GE3 of the third transistor, and the fourth gate electrode GE4 of the fourth transistor, and the fifth gate electrode GE5 of the fifth transistor.

The first gate electrode GE1 may be disposed to overlap the first counter gate electrode Gb1 with the first semiconductor layer ACT1 interposed therebetween, the second gate electrode GE2 may be disposed to overlap the second counter gate electrode Gb2 with the second semiconductor layer ACT2 interposed therebetween, the third gate electrode GE3 may be disposed to overlap the third counter gate electrode Gb3 with the second semiconductor layer ACT2 interposed therebetween, the fourth gate electrode GE4 may be disposed to overlap the fourth counter gate electrode Gb4 with the first semiconductor layer ACT1 interposed therebetween, and the fifth gate electrode GE5 may be disposed to overlap the fifth counter gate electrode Gb5 with the first semiconductor layer ACT1 interposed therebetween.

The third conductive layer may be formed as a single layer or multiple layers made of at least one of, for example, molybdenum (Mo), aluminum (Al), chromium (Cr), gold (Au), titanium (Ti), nickel (Ni), neodymium (Nd) and copper (Cu) or an alloy thereof.

The fourth conductive layer shown in FIGS. 31A to 31F and FIG. 35 may be disposed on the third conductive layer along the third direction DR3, and an insulating layer may be disposed between the third conductive layer and the fourth conductive layer.

The fourth conductive layer may include the first data line DL1, the first upper driving voltage line VDLb, the second data line DL2, the upper reference voltage line VRLb, the third data line DL3, the second driving voltage line VSL, the fourth data line DL4, the fifth data line DL5, the second upper initialization voltage line VILb, the sixth data line DL6, the pixel connection electrode PCE, the first gate connection electrode GCE1, the second gate connection electrode GCE2, the third gate connection electrode GCE3, the fourth gate connection electrode GCE4, the fifth gate connection electrode GCE5, the lower gate connection electrode GCEb, and the second upper capacitor electrode C2b.

Meanwhile, although not shown, the fourth conductive layer may further include the first upper initialization voltage line VIL1b. The first upper initialization voltage line VIL1b may have substantially the same shape as that of the second upper initialization voltage line VIL2b, for example.

The first upper driving voltage line VDLb may be connected to the first lower driving voltage line VDLa through a contact hole formed through the insulating layer.

The upper reference voltage line VRLb may be connected to the lower reference voltage line VRLa through a contact hole formed through the insulating layer.

The first upper initialization voltage line VIL1b may be connected to the first lower initialization voltage line VIL1a through a contact hole formed through the insulating layer.

The second upper initialization voltage line VIL2b may be connected to the second lower initialization voltage line VIL2a through a contact hole formed through the insulating layer.

The first to sixth data lines DL1 to DL6 may be connected to the semiconductor layers ACT1 and ACT2 through the contact holes formed through the insulating layer.

The first gate connection electrode GCE1 may connect the first gate electrode GE1 of the first transistor (for example, T111) to the second transistor (for example, T112), the third transistor (for example, T113), and the first lower capacitor electrode C1a through a contact hole formed through the insulating layer. The first gate connection electrode GCE1 is a part of the above-described gate node. For example, the first gate connection electrode GCE1 may include the horizontal portion HP11 and the vertical portion VP11 that are described above. For example, as shown in FIG. 35, the first gate connection electrode GCE1 of the first-first pixel PX11 may include one horizontal portion HP11 and the plurality of vertical portions VP11 integrally formed therewith, the first gate connection electrode GCE1 of the first-second pixel PX12 may include one horizontal portion HP12 and the plurality of vertical portions VP12 integrally formed therewith, and the first gate connection electrode GCE1 of the first-third pixel PX13 may include one horizontal portion HP13 and the plurality of vertical portions VP13 integrally formed therewith.

The second gate connection electrode GCE2 may connect the second gate electrode GE2 of the second transistors T112 to T432 to the first scan line GWL through a contact hole formed through the insulating layer.

The third gate connection electrode GCE3 may connect the third gate electrode GE3 of the third transistors T113 to T433 to the third scan line GRL through a contact hole formed through the insulating layer.

The fourth gate connection electrode GCE4 may connect the fourth gate electrode GE4 of the fourth transistors T114 to T434 to the second scan line GIL through a contact hole formed through the insulating layer.

The fifth gate connection electrode GCE5 may connect the fifth gate electrode GE5 of the fifth transistors T115 to T435 to the emission control line EML through a contact hole formed through the insulating layer.

The lower gate connection electrode GCEb may connect the counter gate electrode Gb to the first semiconductor layer ACT1 through a contact holes formed through the insulating layer.

The pixel connection electrode PCE (for example, the pixel connection electrode PCE having a relatively small area in FIG. 35) may connect the first semiconductor layer ACT1 (for example, portions of the first semiconductor layer ACT1 corresponding to the first electrodes E11 of the first transistors T111 to T431) to the pixel electrode through a contact hole formed through the insulating layer. Another type of the pixel connection electrode PCE (for example, the pixel connection electrode PCE having a relatively large area in FIG. 35) may connect the counter gate electrode Gb to the first semiconductor layer ACT1 (for example, portions of the first semiconductor layer ACT1 corresponding to the first electrodes E11 of the first transistors T111 to T431) and the pixel electrode through a contact hole formed through the insulating layer.

The second upper capacitor electrode C2b may constitute the second capacitor C2 together with the above-described second lower capacitor electrode C2a. For example, the second capacitor C2 may be formed in the region where the second upper capacitor electrode C2b and the second lower capacitor electrode C2a overlap. Here, the second upper capacitor electrode C2b may be a part of the first upper driving voltage line VDLb or a part of the second driving voltage line VSL. For example, each of a red pixel providing light of a wavelength corresponding to red light and a green pixel providing light of a wavelength corresponding to green light may utilize a part of the first upper driving voltage line VDLb as the second upper capacitor electrode C2b, and a blue pixel providing light of a wavelength corresponding to blue light may utilize a part of the second driving voltage line VSL as the second upper capacitor electrode C2b.

The fifth conductive layer shown in FIGS. 31A to 31F and FIG. 36 may be disposed on the fourth conductive layer along the third direction DR3, and an insulating layer may be disposed between the fourth conductive layer and the fifth conductive layer.

The fifth conductive layer may include the first-first pixel electrode PE11, the first-second pixel electrode PE12, the first-third pixel electrode PE13, the second-first pixel electrode PE21, the second-second pixel electrode PE22, the second-third pixel electrode PE23, the third-first pixel electrode PE31, the third-second pixel electrode PE32, the third-third pixel electrode PE33, the fourth-first pixel electrode PE41, the fourth-second pixel electrode PE42, and the fourth-third pixel electrode PE43.

Among the pixel electrodes included in the unit pixels UPX1 to UPX4, each of the first-third pixel electrode PE13, the second-third pixel electrode PE23, the third-third pixel electrode PE33, and the fourth-third pixel electrode PE43 may have the largest area in the corresponding unit pixel. For example, among the pixel electrodes in the first unit pixel UPX1, the first-third pixel PX13 may have the largest area in the first unit pixel UPX1, among the pixel electrodes in the second unit pixel UPX2, the second-third pixel PX23 may have the largest area in the second unit pixel UPX2, among the pixel electrodes in the third unit pixel UPX3, the third-third pixel PX33 may have the largest area in the third unit pixel UPX3, and among the pixel electrodes in the fourth unit pixel UPX4, the fourth-third pixel PX43 may have the largest area in the fourth unit pixel UPX4.

The pixel electrodes of the unit pixels UPX1 to UPX4 corresponding to each other may have the same area. For example, the first-first pixel electrode PE11 of the first unit pixel UPX1, the second-first pixel electrode PE21 of the second unit pixel UPX2, the third-first pixel electrode PE31 of the third unit pixel UPX3, and the fourth-first pixel electrode PE41 of the fourth unit pixel UPX4 corresponding to one another may have the same area. Further, the first-second pixel electrode PE12 of the first unit pixel UPX1, the second-second pixel electrode PE22 of the second unit pixel UPX2, the third-second pixel electrode PE32 of the third unit pixel UPX3, and the fourth-second pixel electrode PE42 of the fourth unit pixel UPX4 corresponding to one another may have the same area. Further, the first-third pixel electrode PE13 of the first unit pixel UPX1, the second-third pixel electrode PE23 of the second unit pixel UPX2, the third-third pixel electrode PE33 of the third unit pixel UPX3, and the fourth-third pixel electrode PE43 of the fourth unit pixel UPX4 corresponding to one another may have the same area.

The sides of the first pixel electrode and the second pixel electrode of the unit pixels UPX1 to UPX4 disposed adjacent to and facing each other in the second direction DR2 may have uneven sides. For example, the lower surface of the first-first pixel electrode PE11 of the first unit pixel UPX1 may include a plurality of sides that are disposed to have different distances from the above-described first-second pixel electrode PE12. In other words, the lower surface of the first-first pixel electrode PE11 of the first unit pixel UPX1 may gradually protruding more toward the first-second pixel electrode PE12 along the first reverse direction. For example, the lower side of the first-first pixel electrode PE11 may include a first side S11 having a shortest length from the upper side (for example, the surface opposite to the lower surface of the first-first pixel electrode PE11) of the first-first pixel electrode PE11, a second step surface S12 protruding more toward the first-second pixel electrode PE12 (for example, in the second reverse direction) than the first side S11, and a third side S13 protruding more toward the first-second pixel electrode PE12 (for example, in the second reverse direction) than the second side S2. Meanwhile, the lower surface of the first-first pixel electrode PE11 may further include, for example, a fourth side S14 having the same length from the upper surface of the first-first pixel electrode PE11 as that of the above-described second side S12. The fourth side S14 may be disposed on the opposite side of the second side S12 with respect to a protrusion 555 defining the third side S13 interposed therebetween.

In addition, the upper side of the first-second pixel electrode PE12 of the first unit pixel UPX1 may include a plurality of sides that are disposed to have different distances from the first-first pixel electrode PE11 of the first unit pixel UPX1. In other words, the upper side of the first-second pixel electrode PE12 of the first unit pixel UPX1 may include a plurality of sides gradually protruding more toward the first-first pixel electrode PE11 PE11 of the first unit pixel UPX1 along the second direction DR2. For example, the upper side of the first-second pixel electrode PE12 may include a first side S21 having a shortest length from the lower surface (for example, the surface opposite to the upper surface of the first-second pixel electrode PE12) of the first-second pixel electrode PE12, a second side S22 protruding more toward the first-first pixel electrode PE11 (for example, in the second direction DR2) than the first side S21, and a third side S23 protruding more toward the first-first pixel electrode PE11 (for example, in the second direction DR2) than the second side S22. Here, the second side S22 of the first-second pixel electrode PE12 may face the third side S13 of the first-first pixel electrode PE11, and the third side S23 of the first-second pixel electrode PE12 may face the first side S11 and the second side S12 of the first-first pixel electrode PE11.

The horizontal portion HP11 of the above-described first-first gate node GN11 (for example, the first-first gate node GN11 indirectly connected to the first-first pixel electrode PE11 through the first capacitor C1 of the first-first pixel PX11) may be disposed between the fourth side S14 of the first-first pixel electrode PE11 and the first side S21 of the first-second pixel electrode PE12 that has the shortest length from the lower side of the first-second pixel electrode PE12. Accordingly, the overlapping area between the first-first gate node GN11 and the first-second pixel electrode PE12 may be minimized. In other words, the overlapping area between the pixel electrode and the gate node of different pixels may be minimized, so that the influence of a parasitic capacitance between the pixel electrode and the gate node of different pixels may be minimized.

Further, the horizontal portion HP12 of the above-described first-second gate node GN12 (for example, the first-second gate node GN12 indirectly connected to the first-second pixel electrode PE12 through the first capacitor C1 of the first-second pixel PX12) may be disposed between the third side S23 of the first-second pixel electrode PE12 and the first side S11 of the first-first pixel electrode PE11 that has the shortest length from the upper side of the first-first pixel electrode PE11. Accordingly, the overlapping area between the first-second gate node GN12 and the first-first pixel electrode PE11 may be minimized. In other words, the overlapping area between the pixel electrode and the gate node of different pixels may be minimized, so that the influence of a parasitic capacitance between the pixel electrode and the gate node of different pixels may be minimized.

Figure 43:
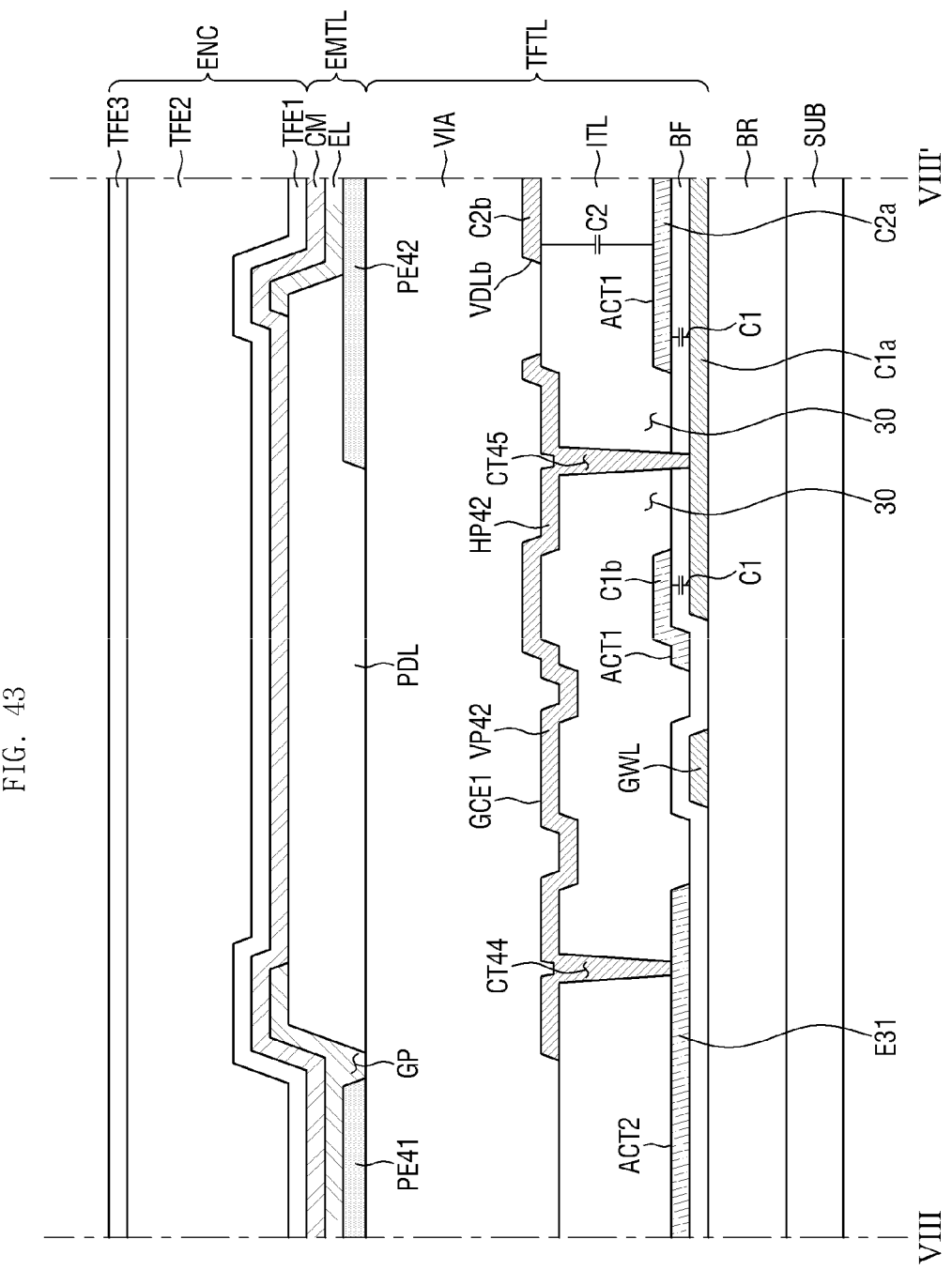
FIG. 43 is a cross-sectional view taken along line VIII-VIII' of FIG. 38.

Meanwhile, additionally or alternatively, as in the example shown in FIG. 36, at least a part of the first side S11 of the first-first pixel electrode PE11 that has the shortest length from the upper side of the first-first pixel electrode PE11 may be disposed in the emission area EA of the first-first pixel PX11. In other words, the bank PDL defining the emission area EA of the first-first pixel PX11 (that is, the first-first pixel PX11 including the first-first pixel electrode PE11) is disposed to be spaced apart from the first side S11 of the first-first pixel electrode PE11, so that at least a part of the first side S1 may not be in contact with the bank PDL. Accordingly, as shown in FIG. 43 to be described later, a gap GP may exist between the pixel electrode (for example, PE41) and the bank PDL. Therefore, the overlapping area between the first-second gate node GN12 of the first-second pixel PX12 and the first-first pixel electrode PE11 of the first-first pixel PX11 may be further minimized.

Meanwhile, additionally or alternatively, as in the example shown in FIG. 36, at least a part of the first side S21 of the first-second pixel electrode PE12 that has the shortest length from the lower side of the first-second pixel PX12 may be disposed on or overlap the edge (or boundary) of the emission area EA of the first-second pixel PX12. In other words, the bank PDL defining the emission area EA of the first-second pixel PX12 and a part of the edge of the first side S21 may be located on a same line extending along the first direction DR1. Accordingly, the overlapping area between the first-first gate node GN11 of the first-first pixel PX11 and the first-second pixel electrode PE12 of the first-second pixel PX12 may be further minimized.

Meanwhile, the distance between the emission areas EA of the third pixels (for example, the third pixels including the third pixel electrodes) included in unit pixels adjacent in the second direction DR2 in odd columns may be different from the distance between the emission areas EA of the third pixels (for example, the third pixels including the third pixel electrodes) included in unit pixels adjacent in the second direction DR2 in even columns. For example, when the distance between the emission area EA corresponding to the first-third pixel electrode PE13 of the first unit pixel UPX1 and the emission area EA corresponding to the third-third pixel electrode PE33 of the third unit pixel UPX3 adjacent to the first-third pixel electrode PE13 in the second direction DR2 (for example, the extension direction of the data line) is defined as a fifth distance D5 and the distance between the emission area EA corresponding to the second-third pixel electrode PE23 of the second unit pixel UPX2 and the emission area EA corresponding to the fourth-third pixel electrode PE43 of the fourth unit pixel UPX4 adjacent to the second-third pixel electrode PE23 in the second direction DR2 (for example, the extension direction of the data line) is defined as a sixth distance D6, the sixth distance D6 may be longer than the fifth distance D5. In other words, the bank PDL may include the emission areas EA exposing at least parts of the pixel electrodes PE13, PE23, PE33, and PE43 of the unit pixels UPX1 to UPX4, and the sixth distance D6 between the emission area EA exposing at least a part of the second-third pixel electrode PE23 and the emission area EA exposing at least a part of the fourth-third pixel electrode PE43 may be greater than the fifth distance D5 between the emission area EA exposing at least a part of the first-third pixel electrode PE13 and the emission area EA exposing at least a part of the third-third pixel electrode PE33.

Meanwhile, the first unit pixel UPX1 and the second unit pixel UPX2 may be positioned in one same row, and the third unit pixel UPX3 and the fourth unit pixel UPX4 may be positioned in another same row.

The pixel electrode (for example, PE11) may be connected to the counter gate electrode Gb of the first transistor (for example, T111) through a contact hole formed through the insulating layer and the pixel connection electrode PCE.

Figure 37A:
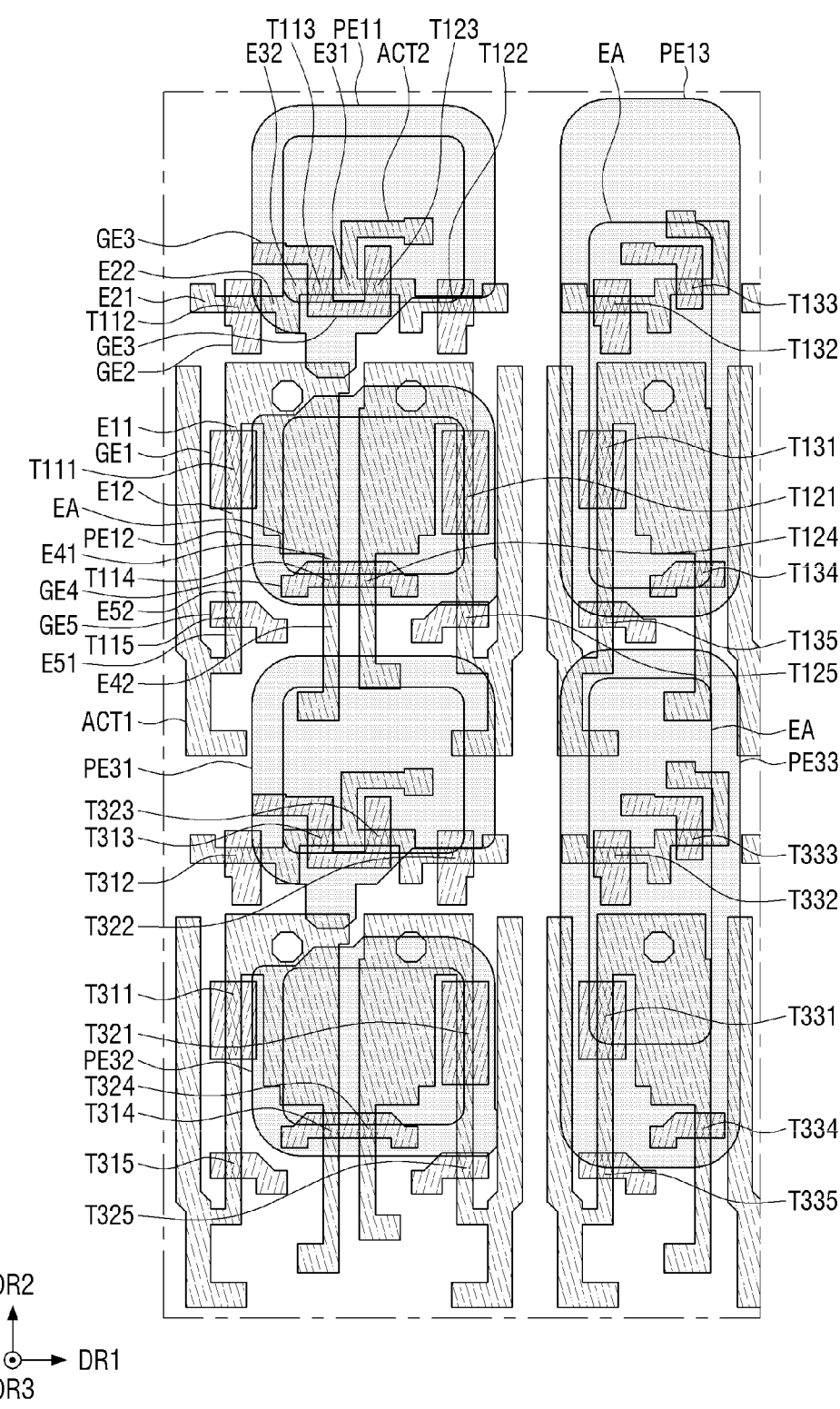
FIG. 37A is a plan view selectively illustrating only the second conductive layer, the third conductive layer, and the fifth conductive layer among the components of FIG. 31A.
Figure 37B:
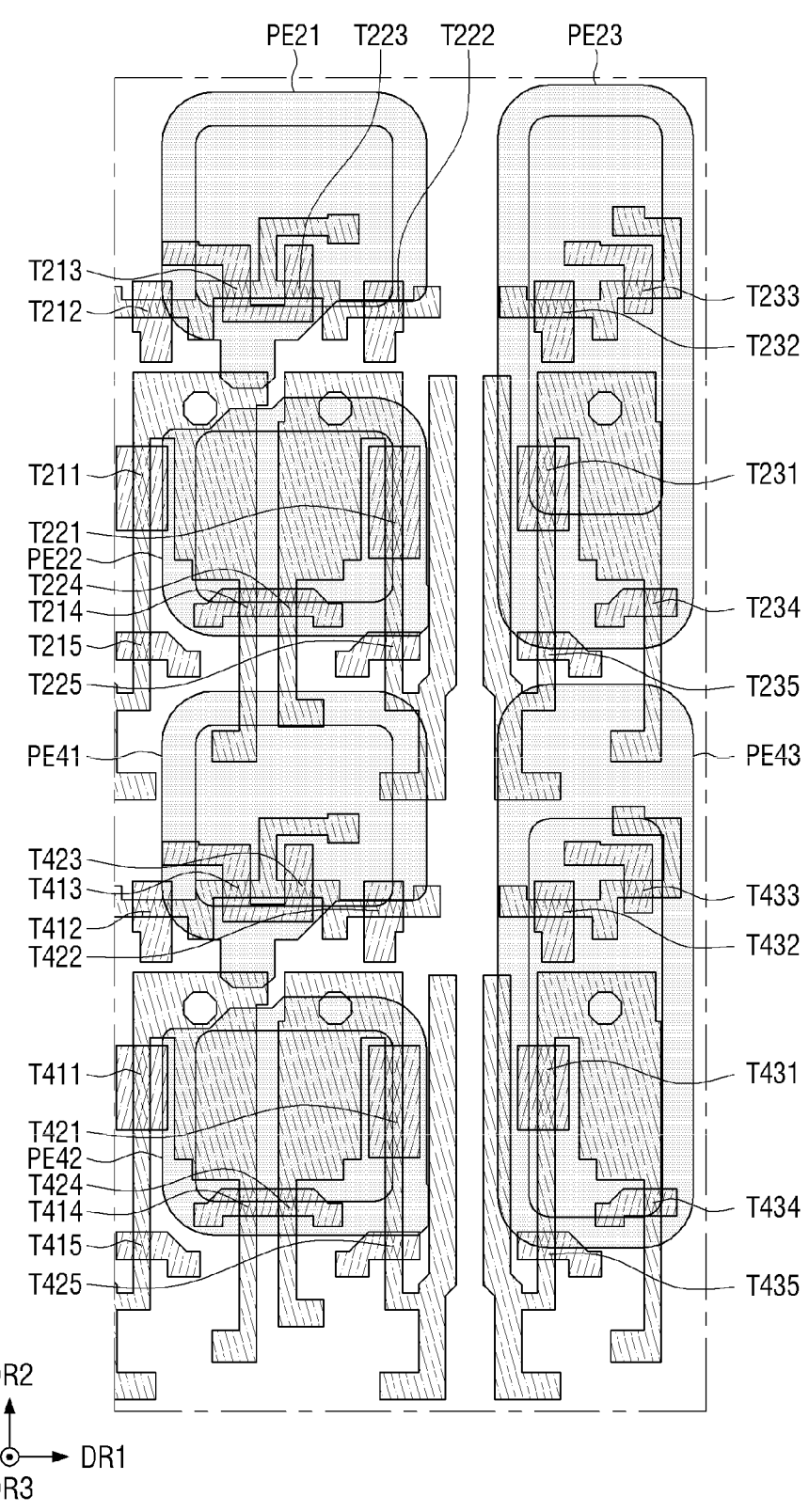
FIG. 37B is a plan view selectively illustrating only the second conductive layer, the third conductive layer, and the fifth conductive layer among the components of FIG. 31B.

FIG. 37A is a plan view selectively illustrating only the second conductive layer, the third conductive layer, and the fifth conductive layer among the components of FIG. 31A, and FIG. 37B is a plan view selectively illustrating only the second conductive layer, the third conductive layer, and the fifth conductive layer among the components of FIG. 31B.

As shown in FIGS. 37A and 37B, the first-first pixel PX11 included in the first unit pixel UPX1 may include the first to fifth transistors T111, T112, T113, T114, and T115.

The first transistor T111 of the first-first pixel PX11 may include the first gate electrode GE1 overlapping the first semiconductor layer ACT1, a first electrode E11 formed in the first semiconductor layer ACT1 on one side of the first gate electrode GE1, and a second electrode E12 formed in the first semiconductor layer ACT1 on the other side of the first gate electrode GE1. In addition, the first transistor T111 of the first-first pixel PX11 may further include the counter gate electrode Gb disposed to face the first gate electrode GE1 with the first semiconductor layer ACT1 interposed therebetween.

The second transistor T112 of the first-first pixel PX11 may include the second gate electrode GE2 overlapping the second semiconductor layer ACT2, a first electrode E21 formed in the second semiconductor layer ACT2 on one side of the second gate electrode GE2, and a second electrode E22 formed in the second semiconductor layer ACT2 on the other side of the second gate electrode GE2. In addition, the second transistor T112 of the first-first pixel PX11 may further include the counter gate electrode positioned to face the second gate electrode GE2 with the second semiconductor layer ACT2 interposed therebetween.

The third transistor T113 of the first-first pixel PX11 may include the third gate electrode GE3 overlapping the second semiconductor layer ACT2, a first electrode E31 formed in the second semiconductor layer ACT2 on one side of the third gate electrode GE3, and a second electrode E32 formed in the second semiconductor layer ACT2 on the other side of the third gate electrode GE3. In addition, the third transistor T113 of the first-first pixel PX11 may further include the counter gate electrode positioned to face the third gate electrode GE3 with the second semiconductor layer ACT2 interposed therebetween.

The fourth transistor T114 of the first-first pixel PX11 may include the fourth gate electrode GE4 overlapping the first semiconductor layer ACT1, a first electrode E41 formed in the first semiconductor layer ACT1 on one side of the fourth gate electrode GE4, and a second electrode E42 formed in the first semiconductor layer ACT1 on the other side of the fourth gate electrode GE4. In addition, the fourth transistor T114 of the first-first pixel PX11 may further include the counter gate electrode positioned to face the fourth gate electrode GE4 with the first semiconductor layer ACT1 interposed therebetween.

The fifth transistor T115 of the first-first pixel PX11 may include the fifth gate electrode GE5 overlapping the first semiconductor layer ACT1, a first electrode E51 formed in the first semiconductor layer ACT1 on one side of the fifth gate electrode GE5, and a second electrode E52 formed in the first semiconductor layer ACT1 on the other side of the fifth gate electrode GE5. In addition, the fifth transistor T115 of the first-first pixel PX11 may further include the counter gate electrode positioned to face the fifth gate electrode GE5 with the first semiconductor layer ACT1 interposed therebetween.

Meanwhile, the first to fifth transistors T121 to T435 of other pixels also have the same configurations as those of the first to fifth transistors T111 to T115 of the first-first pixel PX11 described above, so that the description of the first to fifth transistors T121 to T435 of other pixels refers to the description of the first to fifth transistors T111 to T115 of the first-first pixel PX11 described above.

Figure 38:
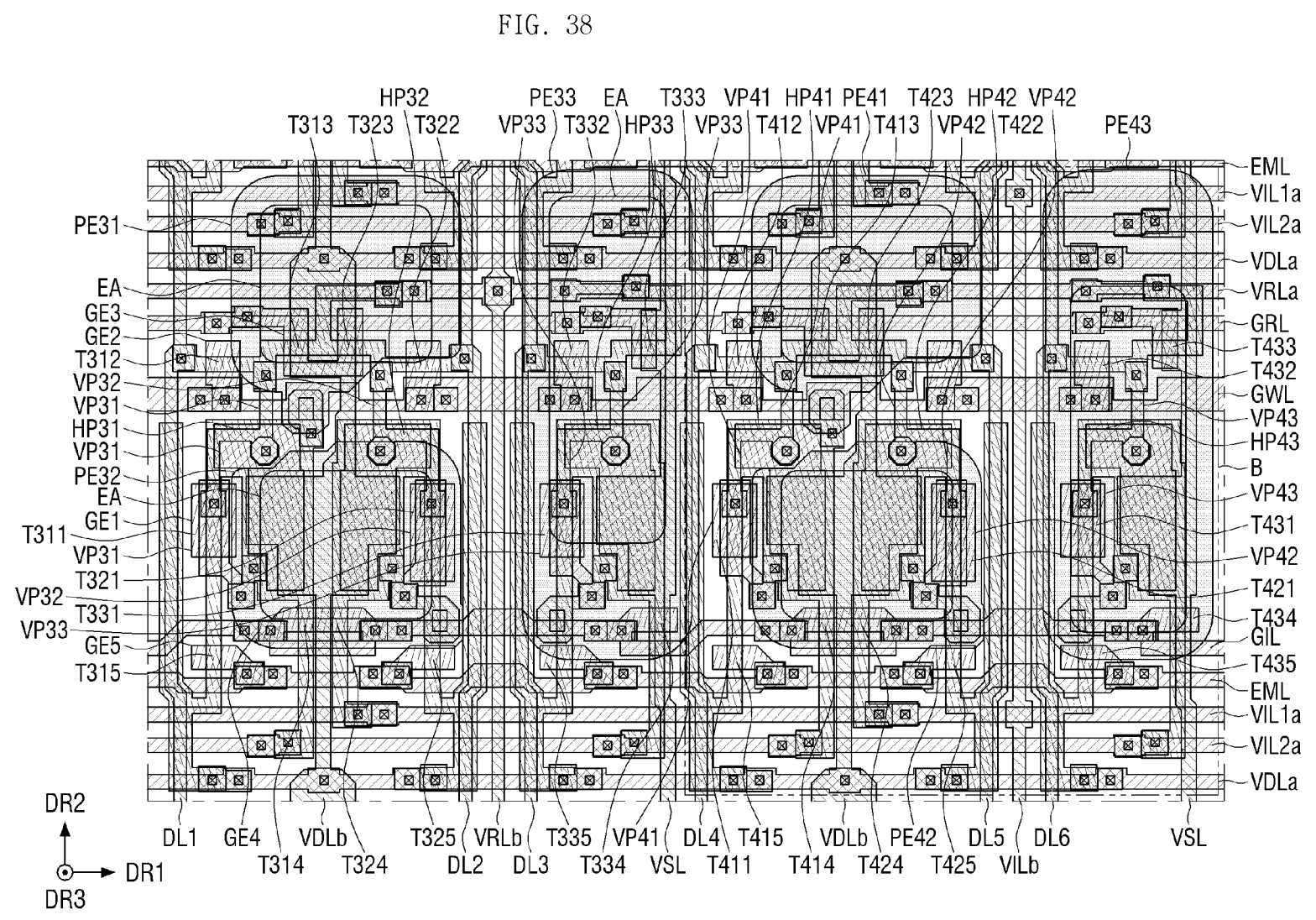
Figure 39:
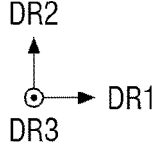
FIG. 39 is an enlarged view of area B of FIG. 38.
Figure 40:
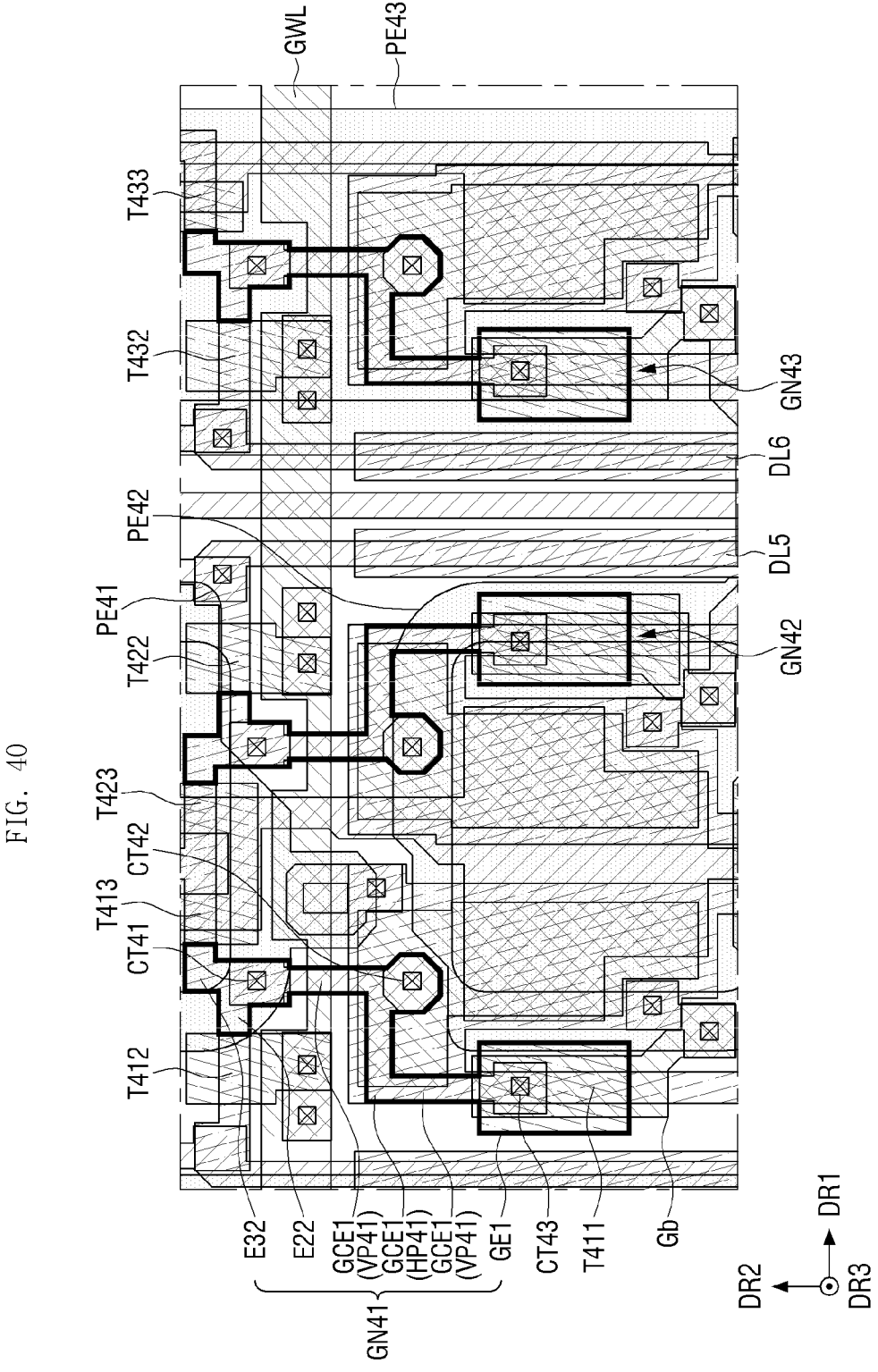
FIG. 40 is an enlarged view of the vicinity of the gate node of FIG. 39.
Figure 41:
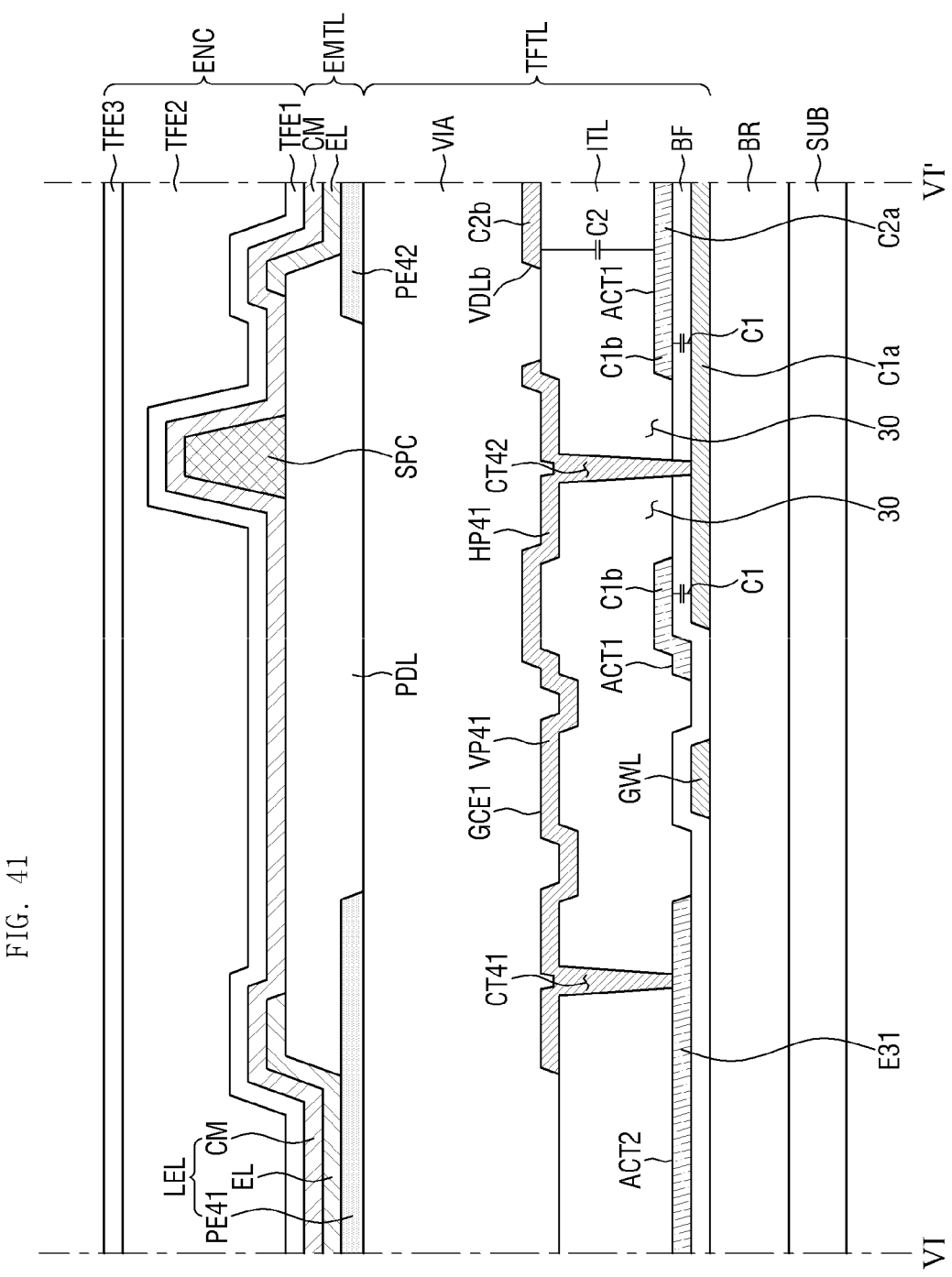
FIG. 41 is a cross-sectional view taken along line VI-VI' of FIG. 38.
Figure 42:
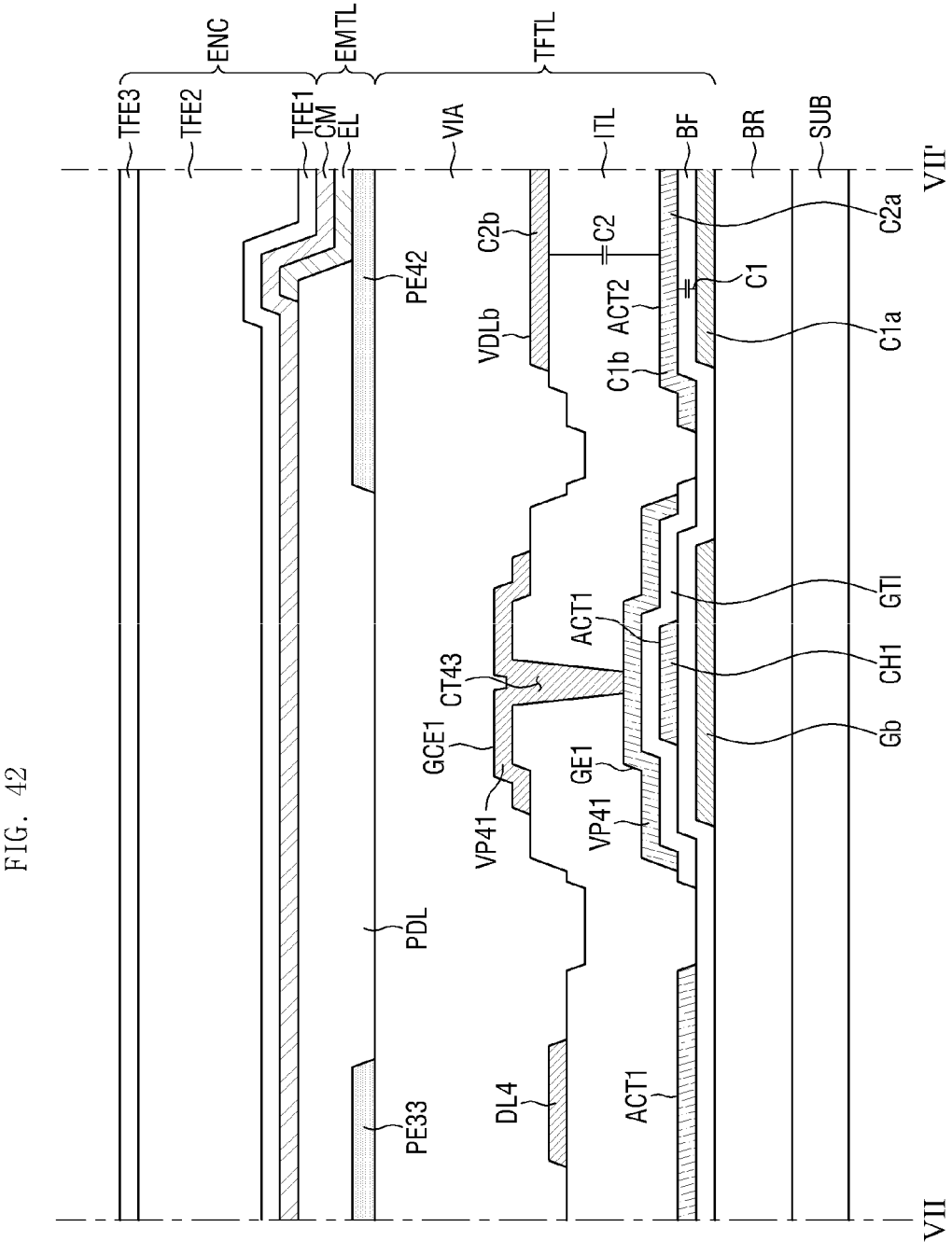
FIG. 42 is a cross-sectional view taken along line VII-VII' of FIG. 38.
Figure 44:
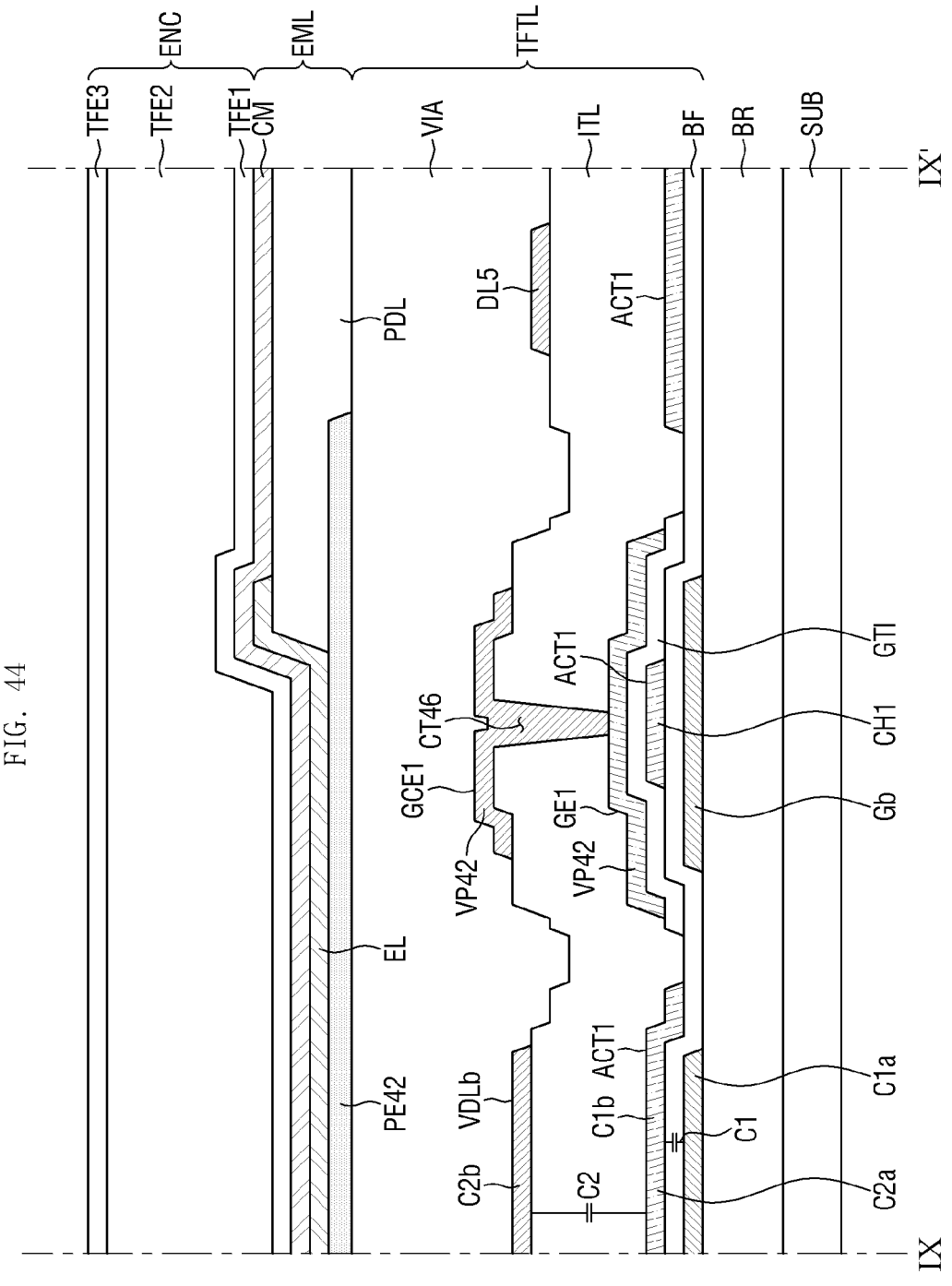
FIG. 44 is a cross-sectional view taken along line IX-IX' of FIG. 38.
Figure 45:
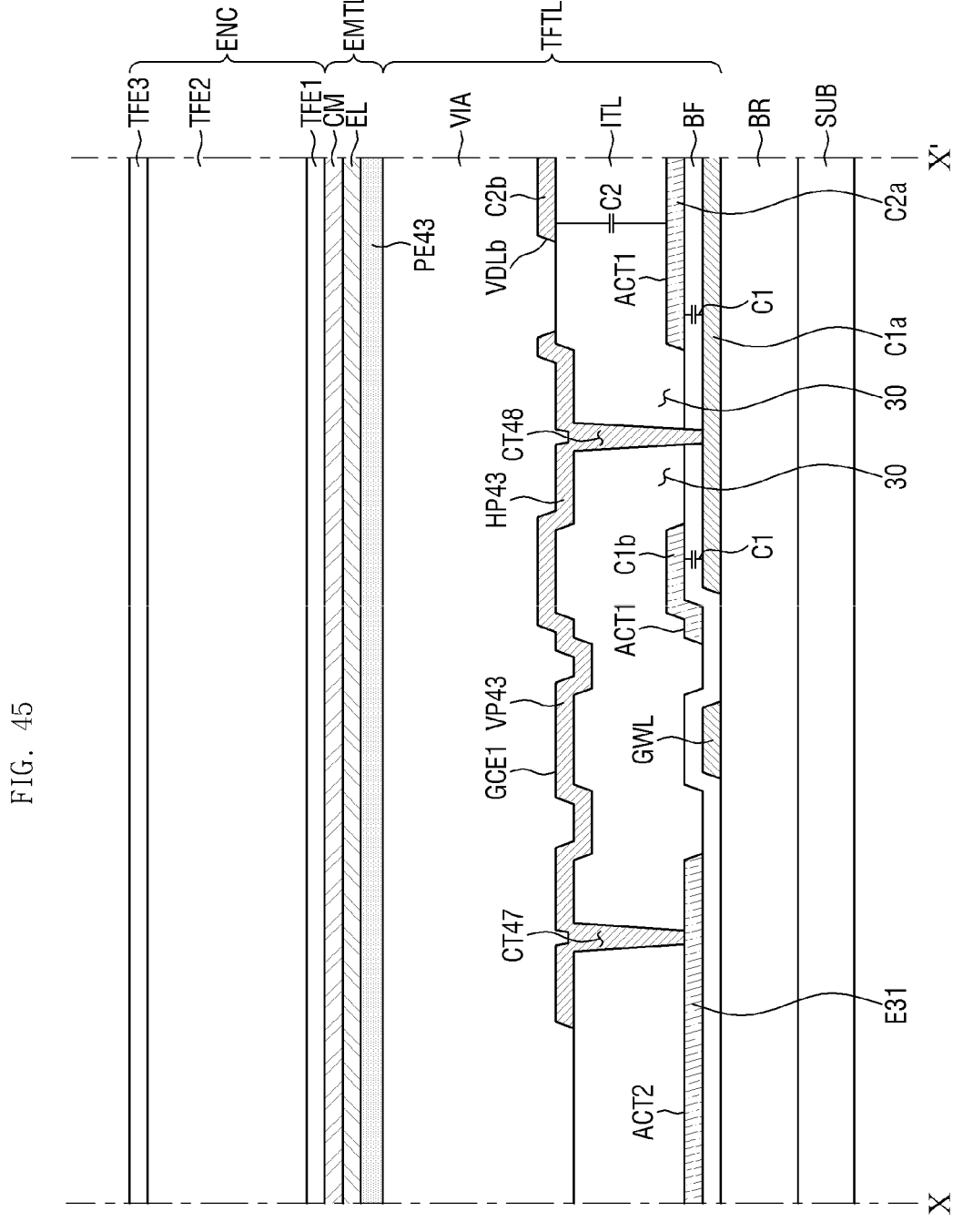
FIG. 45 is a cross-sectional view taken along line X-X' of FIG. 38.
Figure 46:
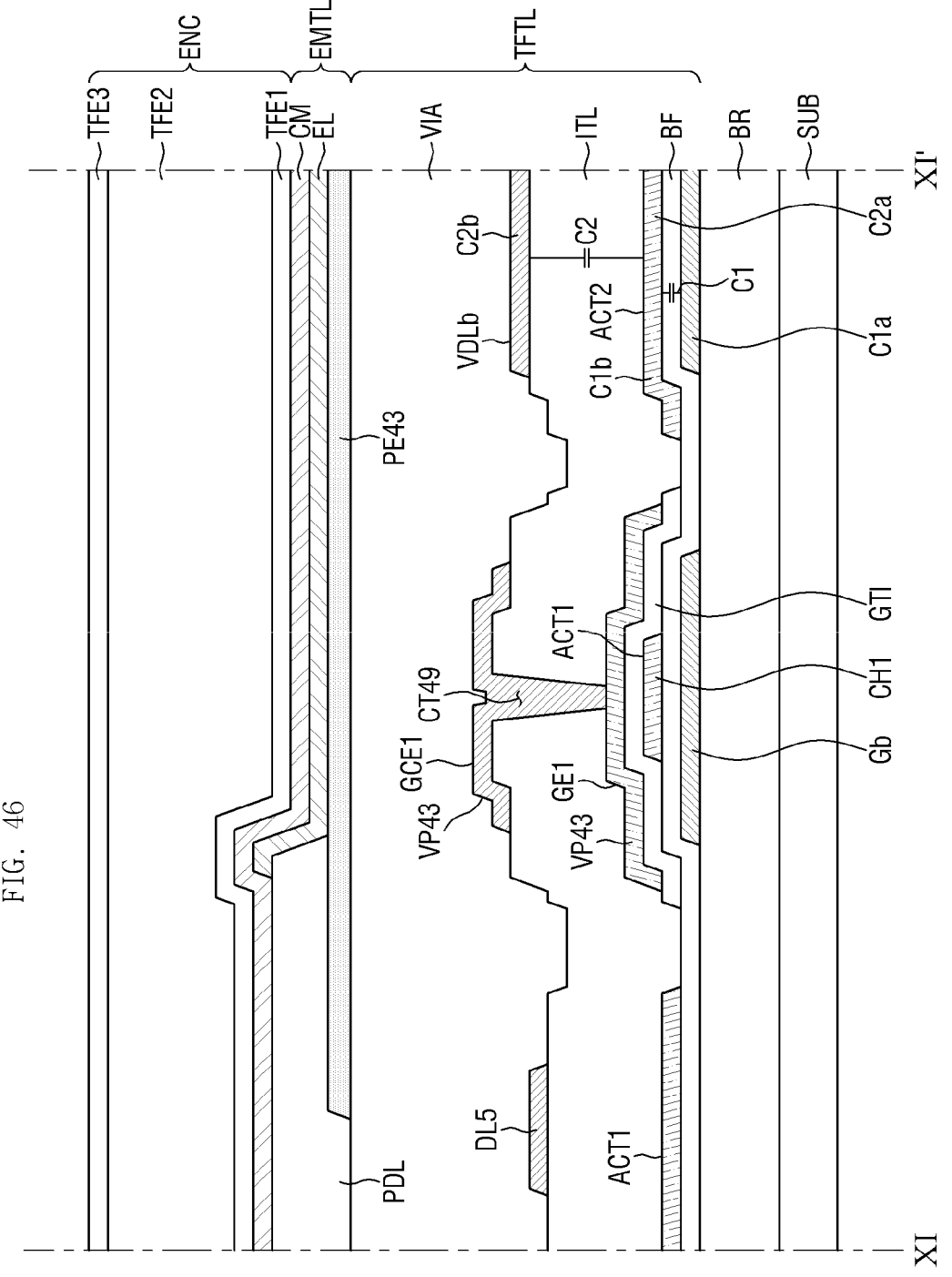
FIG. 46 is a cross-sectional view taken along line XI-XI' of FIG. 38.

FIG. 38 is a detailed plan view of the third unit pixel and the fourth unit pixel of FIG. 30, FIG. 39 is an enlarged view of area B of FIG. 38, FIG. 40 is an enlarged view of the vicinity of the gate node of FIG. 39, FIG. 41 is a cross-sectional view taken along line VI-VI of FIG. 38, FIG. 42 is a cross-sectional view taken along line VII-VII' of FIG. 38, FIG. 43 is a cross-sectional view taken along line VIII-VIII' of FIG. 38, FIG. 44 is a cross-sectional view taken along line IX-IX' of FIG. 38, FIG. 45 is a cross-sectional view taken along line X-X' of FIG. 38, and FIG. 46 is a cross-sectional view taken along line XI-XI' of FIG. 38.

As shown in FIGS. 38 to 46, the display panel 1000 of the display device 1 may include the substrate SUB, the barrier layer BR, the thin film transistor layer TFTL, the light emitting element layer EMTL, and the encapsulation layer ENC. The barrier layer BR, the thin film transistor layer TFTL, the light emitting element layer EMTL, and the encapsulation layer ENC may be sequentially disposed on the substrate SUB along the third direction DR3.

The barrier layer BR may be disposed on the substrate SUB. Meanwhile, the description of materials of the substrate SUB and the barrier layer BR refers to the description of the substrate SUB and the barrier layer BR of the above-described embodiment.

The first conductive layer may be disposed on the barrier layer BR. For example, as shown in FIGS. 38 to 46, the lower reference voltage line VRLa, the third scan line GRL, the first scan line GWL, the first lower capacitor electrode C1a, the counter gate electrode Gb, the second scan line GIL, the emission control line EML, the first lower initialization voltage line VIL1a, the second lower initialization voltage line VIL2a, and the first lower driving voltage line VDLa may be disposed on the substrate SUB. Meanwhile, the detailed description of the first conductive layer refers to the description of the first conductive layer of the above-described embodiment.

The buffer layer BF may be disposed on the first conductive layer. Meanwhile, the description of the buffer layer BF refers to the description of the buffer layer BF of the above-described embodiment.

The second conductive layer which include the semiconductor layer may be disposed on the buffer layer BF. For example, as shown in FIGS. 38 to 46, the semiconductor layer including the first semiconductor layer ACT1 and the second semiconductor layer ACT2 may be disposed on the buffer layer BF.

The first semiconductor layer ACT1 may provide the channel regions (for example, CH1, CH4, and CH5), the first electrodes (for example, E11, E41, and E51), and the second electrodes (for example, E12, E42, and E52) of the first transistor (for example, T421), the fourth transistor (for example, T424), and the fifth transistor (for example, T425). The detailed description thereof refers to the description of the above-described embodiment.

The second semiconductor layer ACT2 may provide the channel regions (for example, CH2 and CH3), the first electrodes (for example, E21 and E31), and the second electrodes (for example, E22 and E32) of the second transistor (for example, T422) and the third transistor (for example, T423). The detailed description thereof refers to the description of the above-described embodiment.

As shown in FIGS. 41 to 46, the first capacitor C1 may be disposed in the region where the first lower capacitor electrode C1a and the first semiconductor layer ACT1 (for example, the first upper capacitor electrode C1b of the first semiconductor layer ACT1) overlap. The detailed description thereof refers to the description of the above-described embodiment.

As shown in FIGS. 41 to 46, the gate insulating layer GTI may be disposed on the first semiconductor layer ACT1 and the second semiconductor layer ACT2. Meanwhile, the description of the gate insulating layer GTI refers to the description of the gate insulating layer GTI of the above-described embodiment.

The third conductive layer may be disposed on the gate insulating layer GTI. For example, as shown in FIGS. 42 and 44, the first gate electrode GE1 may be disposed on the gate insulating layer GTI. The first gate electrode GE1 may be disposed on the gate insulating layer GTI to overlap the first semiconductor layer ACT1 and the counter gate electrode Gb. The first channel region may be disposed in one region of the first semiconductor layer ACT1 that overlaps the first gate electrode GE1.

Further, the second gate electrode GE2, the third gate electrode GE3, the fourth gate electrode GE4, and the fifth gate electrode GE5 may be disposed on the gate insulating layer GTI.

The first to fifth transistors T411 to T415 provided in the fourth-first pixel PX41 of the fourth unit pixel UPX4 will be described with reference to FIGS. 37 and 39.

The first transistor T411 may include the first gate electrode GE1, the first semiconductor layer ACT1, the counter gate electrode Gb, the first electrode E11, and the second electrode E12.

The second transistor T412 may include the second gate electrode GE2, the second semiconductor layer ACT2, the first electrode E21, and the second electrode E22.

The third transistor T413 may include the third gate electrode GE3, the second semiconductor layer ACT2, the first electrode E31, and the second electrode E32.

The fourth transistor T414 may include the fourth gate electrode GE4, the first semiconductor layer ACT1, the first electrode E41, and the second electrode E42.

The fifth transistor T415 may include the fifth gate electrode GE5, the first semiconductor layer ACT1, the first electrode E51, and the second electrode E52.

Meanwhile, the first gate electrode GE1 of each of the transistors (for example, T411 to T415) may correspond to one of the vertical portions (for example, VP41 of FIG. 39) of each gate node.

Meanwhile, the detailed description of the third conductive layer refers to the description of the third conductive layer of the above-described embodiment.

As illustrated in FIGS. 41 to 46, the interlayer insulating layer ITL may be disposed on the first to fifth gate electrodes GE1 to GE5.

Meanwhile, the description of the material of the interlayer insulating layer ITL refers to the description of the interlayer insulating layer ITL of the above-described embodiment.

The fourth conductive layer may be disposed on the interlayer insulating layer ITL. For example, the first data line DL1, the first upper driving voltage line VDLb, the second data line DL2, the upper reference voltage line VRLb, the third data line DL3, the second driving voltage line VSL, the fourth data line DL4, the fifth data line DL5, the second upper initialization voltage line VIL2b, the sixth data line DL6, the pixel connection electrode PCE, the first gate connection electrode GCE1, the second gate connection electrode GCE2, the third gate connection electrode GCE3, the fourth gate connection electrode GCE4, the fifth gate connection electrode GCE5, the lower gate connection electrode GCEb, and the second upper capacitor electrode C2b may be disposed on the interlayer insulating layer ITL.

As shown in FIG. 41, one side of the first gate connection electrode GCE1 included in the fourth-first pixel PX41 (for example, the pixel including the fourth-first pixel electrode PE41) may be connected to the first electrode E31 of the third transistor T413 through a first contact hole CT41 formed through the interlayer insulating layer ITL, and the other side of the gate connection electrode of the third-first pixel PX31 may be connected to the first lower capacitor electrode C1a (for example, the first lower capacitor electrode of the fourth-first pixel) through a second contact hole CT42 formed through the interlayer insulating layer ITL and the buffer layer BF.

As shown in FIG. 43, one side of the first gate connection electrode GCE1 included in the fourth-second pixel PX42 (for example, the pixel including the fourth-second pixel electrode PE42) may be connected to the first electrode E31 of the third transistor T423 through a fourth contact hole CT44 formed through the interlayer insulating layer ITL, and the other side of the first gate connection electrode GCE1 included in the fourth-second pixel PX42 may be connected to the first lower capacitor electrode C1$a$ (for example, the first lower capacitor electrode of the fourth-second pixel) through a fifth contact hole CT45 formed through the interlayer insulating layer ITL and the buffer layer BF.

As shown in FIG. 45, one side of the first gate connection electrode GCE1 included in the fourth-third pixel PX43 (for example, the pixel including the fourth-third pixel electrode PE33) may be connected to the first electrode E31 of the third transistor T433 through a seventh contact hole CT47 formed through the interlayer insulating layer ITL, and the other side of first gate connection electrode GCE1 included in the fourth-third pixel PX43 may be connected to the first lower capacitor electrode C1$a$ (for example, the first lower capacitor electrode of the fourth-third pixel) through an eighth contact hole CT48 formed through the interlayer insulating layer ITL and the buffer layer BF.

As shown in FIGS. 39, 40, and 41, the first gate connection electrode GCE1 of the fourth-first pixel PX41 (for example, the pixel including the fourth-first pixel electrode PE41) may include any one of the horizontal portion HP41 and the vertical portion VP41 of the fourth-first gate node GN41. The horizontal portion HP41 and the vertical portion VP41 of the first gate connection electrode GCE1 may be at least partially disposed between the fourth-first pixel electrode PE41 and the fourth-second pixel electrode PE42 not to overlap the fourth-first pixel electrode PE41 and the fourth-second pixel electrode PE42 adjacent in the second direction DR2 in the fourth unit pixel UPX4.

As shown in FIGS. 39, 40, and 43, the first gate connection electrode GCE1 of the fourth-second pixel PX42 (for example, the pixel including the fourth-second pixel electrode PE42) may include any one of the horizontal portion HP42 and the vertical portion VP42 of the fourth-second gate node GN42. The horizontal portion HP42 and the vertical portion VP42 of the first gate connection electrode GCE1 may be at least partially disposed between the fourth-first pixel electrode PE41 and the fourth-second pixel electrode PE42 not to overlap the fourth-first pixel electrode PE41 and the fourth-second pixel electrode PE42 adjacent in the second direction DR2 in the fourth unit pixel UPX4.

As shown in FIGS. 39, 40, and 45, the first gate connection electrode GCE1 of the fourth-third pixel PX43 (for example, the pixel including the fourth-third pixel electrode PE43) may include any one of the horizontal portion HP43 and the vertical portion VP43 of the fourth-third gate node GN43. The horizontal portion HP43 and the vertical portion VP43 of the first gate connection electrode GCE1 may be overlapped by the fourth-third pixel electrode PE43. For example, the entire horizontal portion HP43 and the entire vertical portion VP44 of the first gate connection electrode GCE1 may overlap the fourth-third pixel electrode PE43.

As shown in FIGS. 39, 40, and 42, the first gate connection electrode GCE1 of the fourth-first pixel PX41 (for example, the pixel including the fourth-first pixel electrode PE41) may be connected to the first gate electrode GE1 of the first transistor T411 (for example, the first transistor of the fourth-first pixel PX41) through a third contact hole CT43 formed through the interlayer insulating layer ITL. At this time, the first gate electrode GE1 of the first transistor T411 of the fourth-first pixel PX41 may include the vertical portion VP41 of the fourth-first gate node GN41. Meanwhile, a part of the vertical portion VP41 of the first gate electrode GE1 may overlap the fourth-second pixel electrode PE42.

As shown in FIGS. 39, 40, and 44, the first gate connection electrode GCE1 of the fourth-second pixel PX42 (for example, the pixel including the fourth-second pixel electrode PE42) may be connected to the first gate electrode GE1 of the first transistor T421 (for example, the first transistor of the fourth-second pixel PX42) through a sixth contact hole CT46 formed through the interlayer insulating layer ITL. The first gate electrode GE1 of the first transistor T421 of the fourth-second pixel PX42 may include the vertical portion VP42 of the fourth-second gate node GN42. Meanwhile, the entire vertical portion VP42 of the first gate electrode GE1 may overlap the fourth-second pixel electrode PE42.

As shown in FIGS. 39, 40, and 46, the first gate connection electrode GCE1 of the fourth-third pixel PX43 (for example, the pixel including the fourth-third pixel electrode PE43) may be connected to the first gate electrode GE1 of the first transistor T431 (for example, the first transistor of the fourth-third pixel PX43) through a ninth contact hole CT49 formed through the interlayer insulating layer ITL. The first gate electrode GE1 of the first transistor T431 of the fourth-third pixel PX43 may include the vertical portion VP43 of the fourth-third gate node GN43. Meanwhile, the entire vertical portion VP43 of the first gate electrode GE1 may overlap the fourth-third pixel electrode PE43.

As shown in FIGS. 41 to 46, the second upper capacitor electrode C2$b$ may be disposed on the interlayer insulating layer ITL to overlap the first semiconductor layer ACT1. The second capacitor C2 may be disposed in the region where the first semiconductor layer ACT1 (for example, the second lower capacitor electrode C2$a$ of the first semiconductor layer ACT1) and the second upper capacitor electrode C2$b$ overlap. A part of the first semiconductor layer ACT1 (for example, the second lower capacitor electrode C2$a$) may correspond to the first electrode of the second capacitor C2, and the second upper capacitor electrode C2$b$ may correspond to the second electrode of the second capacitor C2. The second upper capacitor electrode C2$b$ may be connected to the first lower driving voltage line VDLa. To this end, the first upper driving voltage line VDLb integrally formed with the second upper capacitor electrode C2$b$ may be connected to the first lower driving voltage line VDLa through the contact hole (for example, CT50 of FIG. 39) formed through the interlayer insulating layer ITL and the buffer layer BF.

Meanwhile, as shown in FIGS. 38, 39, 40, 41, 43, and 45, the horizontal portion (for example, HP41) of the gate node may be disposed between the pixel electrodes (for example, PE23 and PE43) adjacent in the second direction DR2. In other words, the horizontal portion (for example, HP42) of the gate node may be disposed to be spaced apart from the pixel electrodes not to overlap the pixel electrodes.

As shown in FIGS. 40 to 46, each gate node may have a structure in which a plurality of conductive layers disposed on different layers are connected. In particular, in FIG. 40, the fourth-first gate node GN41, the fourth-second gate node GN42, and the fourth-third gate node GN43 are highlighted and displayed with thick lines to be more clearly seen.

For example, the fourth-first gate node GN41 may include the second conductive layer (for example, the second semiconductor layer ACT2 corresponding to the second electrode E22 of the second transistor and the second electrode E32 of the third transistor T413), the third conductive layer (for example, the first gate connection electrode GCE1) connected to the second conductive layer through the first contact hole CT41, and the second conductive layer (for example, the first gate electrode GE1) connected to the third conductive layer through the third contact hole CT43. Here, the portion of the first gate connection electrode GCE1 that extends along the first direction DR1 (for example, the direction intersecting the extension direction of the first data line DL1 or the extension direction of the first scan line GWL) may correspond to the horizontal portion HP41 of the fourth-first gate node GN41, and each of the portion of the first gate connection electrode GCE1 that extends in the second direction DR2 (for example, the extension direction of the first data line DL1 or the direction intersecting the extension direction of the first scan line GWL) and the first gate electrode GE1 may correspond to the vertical portion VP41 of the fourth-first gate node GN41.

Other gate nodes (for example, GN42 and GN43) may also have the same structure as that of the fourth-first gate node GN41.

Figure 47:
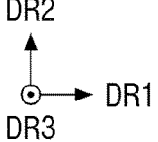
FIG. 47 is a diagram schematically illustrating four adjacent unit pixels of a display device according to one embodiment of the present disclosure.

FIG. 47 is a diagram schematically illustrating four adjacent unit pixels of a display device according to one embodiment of the present disclosure.

The embodiment shown in FIG. 47 is different from the above-described embodiment of FIG. 4 in that all vertical portions of each gate node are arranged not to overlap adjacent pixel electrodes, and other components of the embodiment of FIG. 47 are the same as the components of the above-described embodiment of FIG. 4. Hereinafter, the differences between the embodiment of FIG. 47 and the embodiment of FIG. 4 will be mainly described.

In FIG. 47, the upper vertical portion of the third-first gate node GN31 does not overlap the first-second pixel electrode PE12 of another unit pixel (for example, the first unit pixel UPX1) adjacent thereto in the second direction DR2. To this end, the second pixel electrode of each unit pixel may have the smallest size among the pixel electrodes of the corresponding unit pixel. For example, the first-second pixel electrode PE12 of the first unit pixel UPX1 may have the smallest area among the pixel electrodes of the first unit pixel UPX1, the second-second pixel electrode PE22 of the second unit pixel UPX2 may have the smallest area among the pixel electrodes of the second unit pixel UPX2, the third-second pixel electrode PE32 of the third unit pixel UPX3 may have the smallest area among the pixel electrodes of the third unit pixel UPX3, and the fourth-second pixel electrode PE42 of the fourth unit pixel UPX4 may have the smallest area among the pixel electrodes of the fourth unit pixel UPX4.

Figure 48:
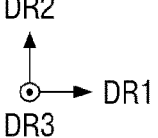
FIG. 48 is a diagram schematically illustrating four adjacent unit pixels of a display device according to one embodiment of the present disclosure.

FIG. 48 is a diagram schematically illustrating four adjacent unit pixels of a display device according to one embodiment of the present disclosure.

Since the display device of FIG. 48 is different from the display device of FIG. 4 in the wavelength of light emitted from the pixels and other components are the same as those of FIG. 4, the differences will be mainly described in the description of the display device of FIG. 48.

As shown in FIG. 48, the first pixels PX11, PX21, PX31, and PX41 of the unit pixels UPX1 to UPX4 may provide light of a green wavelength, the second pixels PX12, PX22, PX32, and PX42 of the unit pixel UPX1 to UPX4 may provide light of a blue wavelength, and the third pixels PX13, PX23, PX33, and PX43 of the unit pixels UPX1 to UPX4 may provide light of a red wavelength.

Figure 49:
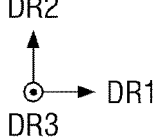
FIG. 49 is a diagram schematically illustrating four adjacent unit pixels of a display device according to one embodiment of the present disclosure.

FIG. 49 is a diagram schematically illustrating four adjacent unit pixels of a display device according to one embodiment of the present disclosure.

Since the display device of FIG. 49 is different from the display device of FIG. 28 in the wavelength of light emitted from the pixels and other components are the same as those of the display device of FIG. 28, the differences will be mainly described in the description of the display device of FIG. 49.

As shown in FIG. 49, the first pixels PX11, PX21, PX31, and PX41 of the unit pixels UPX1 to UPX4 may provide light of a green wavelength, the second pixels PX12, PX22, PX32, and PX42 of the unit pixel UPX1 to UPX4 may provide light of a blue wavelength, and the third pixels PX13, PX23, PX33, and PX43 of the unit pixels UPX1 to UPX4 may provide light of a red wavelength.

Meanwhile, even in the embodiment of FIG. 47, the first pixels PX11, PX21, PX31, and PX41 of the unit pixels UPX1 to UPX4 may provide light of a green wavelength, the second pixels PX12, PX22, PX32, and PX42 of the unit pixel UPX1 to UPX4 may provide light of a blue wavelength, and the third pixels PX13, PX23, PX33, and PX43 of the unit pixels UPX1 to UPX4 may provide light of a red wavelength.

FIG. 50 is a diagram illustrating the effect of the present disclosure.

First, when the first pixel, the second pixel, and the third pixel included in one unit pixel emits red light, green light, and blue light of a specific grayscale (for example, 11-level grayscales), respectively, and white light (for example, mixed light of red light, green light, and blue light) is outputted from the one unit pixel, the luminance of the white light may be set as a reference luminance. In other words, the luminance of the white light generated when the first pixel, the second pixel, and the third pixel of one unit pixel emit lights may be set to 100%.

In accordance with a comparative object invention, when only the first pixel among the first to third pixels is driven in one unit pixel to emit red light, the luminance of the red light is about 50% of the reference luminance, when only the second pixel among the first to third pixels is driven in the one unit pixel to emit green light, the luminance of the green light is about 47% of the reference luminance, and when only the third pixel among the first to third pixels is driven in the one unit pixel to emit blue light, the luminance of the blue light is about 83% of the reference luminance.

On the other hand, in accordance with the first embodiment (for example, the embodiment of FIG. 4) of the present disclosure, when only the first pixel among the first to third pixels is driven in one unit pixel to emit red light, the luminance of the red light is about 70% of the reference luminance, when only the second pixel among the first to third pixels is driven in the one unit pixel to emit green light, the luminance of the green light is about 53% of the reference luminance, and when only the third pixel among the first to third pixels is driven in the one unit pixel to emit blue light, the luminance of the blue light is about 88% of the reference luminance.

Further, in accordance with the second embodiment (for example, the embodiment of FIG. 28) of the present disclosure, when only the first pixel among the first to third pixels is driven in one unit pixel to emit red light, the luminance of the red light is about 70% of the reference luminance, when only the second pixel among the first to third pixels is driven in the one unit pixel to emit green light, the luminance of the green light is about 71% of the reference luminance, and when only the third pixel among the first to third pixels is driven in the one unit pixel to emit blue light, the luminance of the blue light is about 88% of the reference luminance.

As described above, in accordance with the present disclosure, the gate node (for example, the horizontal portion of the gate node) in a certain unit pixel does not overlap pixel electrodes of another unit pixel, or the overlapping area is minimized, so that the influence of a parasitic capacitance between the pixel electrode and the gate node of adjacent unit pixels may be reduced. Accordingly, the decrease in the luminance of monochromatic light, which occurs when only one pixel in a unit pixel is driven, may be minimized and, thus, gray crushing and panel stains may be prevented.

What is claimed is:

1. A display device comprising:
first and second data lines extending along a first direction;
a first gate connected to the first data line and comprising a first vertical portion extending along the first direction and comprising a first gate electrode of a first driving transistor and a first horizontal portion extending along a second direction crossing the first direction and connected to the first vertical portion;
a first pixel electrode connected to the first driving transistor;
a second pixel electrode disposed adjacent to the first pixel electrode in the first direction; and
a second gate connected to the second data line and comprising a second vertical portion extending along the first direction and comprising a second gate electrode of a second driving transistor and a second horizontal portion extending along the second direction and connected to the second vertical portion,
wherein
at least a part of the first horizontal portion and at least a part of the second horizontal portion are disposed between the first pixel electrode and the second pixel electrode not to overlap the first pixel electrode and the second pixel electrode in a plan view.

2. The display device of claim 1, wherein the first horizontal portion and the second horizontal portion are disposed to be spaced apart from the first pixel electrode and the second pixel electrode.

3. The display device of claim 1, wherein a first light emitting element comprising the first pixel electrode and a second light emitting element comprising the second pixel electrode provide lights of the same wavelength.

4. The display device of claim 1, wherein a first pixel comprising the first pixel electrode and a second pixel comprising the second pixel electrode are connected to the first data line.

5. The display device of claim 1, further comprising:
a third data line extending in the first direction;
a third gate node connected to the third data line and comprising a third vertical portion comprising a third gate electrode of a third driving transistor and a third horizontal portion connected to the third vertical portion;
a third pixel electrode connected to the third driving transistor; and
a fourth pixel electrode disposed adjacent to the third pixel electrode in the first direction,
wherein the third horizontal portion extends in the second direction.

6. The display device of claim 5, wherein at least a part of the third horizontal portion is disposed between the third pixel electrode and the fourth pixel electrode not to overlap the third pixel electrode and the fourth pixel electrode.

7. The display device of claim 6, wherein the third horizontal portion is disposed to be spaced apart from the third pixel electrode and the fourth pixel electrode.

8. The display device of claim 5, wherein at least a part of the second vertical portion is disposed between the first pixel electrode and the third pixel electrode.

9. The display device of claim 8, wherein the first pixel electrode disposed adjacent to the second vertical portion has a recessed portion having a width along the second direction less than that of another potion which is not recessed.

10. The display device of claim 9, wherein the second vertical portion is disposed between the third pixel electrode and the first pixel electrode in an area corresponding to the recessed portion.

11. The display device of claim 10, wherein the recessed portion has a round corner.

12. The display device of claim 5, wherein the first pixel electrode and the third pixel electrode are included in a first unit pixel and the second pixel electrode and the fourth pixel electrode are included in a second unit pixel.

13. The display device of claim 1, wherein a distance between a first pixel electrode and a second pixel electrode in a first column is different from a distance between a first pixel electrode and a second pixel electrode in a second column.

14. The display device of claim 13, wherein an overlapping area between the first pixel electrode and the second pixel electrode in the first column and the first gate in the first column is different from an overlapping area between the first pixel electrode and the second pixel electrode in the second column and the first gate in the second column.

15. The display device of claim 1, wherein a distance between a first pixel electrode and a second pixel electrode in a first column is equal to a distance between the first pixel electrode and the second pixel electrode in a second column.

16. The display device of claim 15, wherein an overlapping area between the first pixel electrode and the second pixel electrode in the first column and the first gate in the first column is equal to an overlapping area between the first pixel electrode and the second pixel electrode in the second column and the first gate in the second column.

17. The display device of claim 15, wherein an overlapping area between the second pixel electrode and the second gate in the first column is equal to an overlapping area between the second pixel electrode and the second gate in the second column.

18. The display device of claim 1, further comprising a bank having a first emission area exposing at least a part of the first pixel electrode and a second emission area exposing at least a part of the first pixel electrode.

19. The display device of claim 18, wherein the first emission area and the second emission area are separated from each other.

20. The display device of claim 19, wherein the first pixel electrode comprises a slit disposed between the first emission area and the second emission area.

21. The display device of claim 1, further comprising a first transistor connected between the first gate and the first data line.

22. The display device of claim 21, wherein the first horizontal portion of the first gate comprises a second electrode positioned opposite to a first electrode of the first transistor connected to the first data line.

23. The display device of claim 22, wherein the first gate further comprises a third vertical portion extending upward in the first direction from the first horizontal portion.

24. The display device of claim 23, wherein the third vertical portion of the first gate comprises a fourth electrode positioned opposite to a third electrode of a second transistor connected to a reference voltage line.

25. The display device of claim 22, wherein a first vertical portion of the first gate further comprises a first gate connection electrode connecting the first gate electrode to a second electrode of the first transistor.

26. The display device of claim 25, wherein one side of the first gate connection electrode is connected to the first horizontal portion through a first contact hole of an insulating layer, and the other side of the first gate connection electrode is connected to the first gate electrode through a second contact hole of the insulating layer.

27. The display device of claim 26, wherein the first horizontal portion is formed of a semiconductor layer.

28. A display device comprising:
first and second data lines extending along a first direction;
a first gate connected to the first data line, and comprising a first vertical portion extending along the first direction and comprising a first gate electrode of a first driving transistor and a first horizontal portion extending from the first vertical portion along a second direction crossing the first direction;
a first pixel electrode connected to the first driving transistor;
a second gate connected to the second data line, and comprising a second vertical portion extending along the first direction and comprising a second gate electrode of a second driving transistor and a second horizontal portion extending from the second vertical portion along the second direction; and
a second pixel electrode connected to the second driving transistor and disposed adjacent to the first pixel electrode in the first direction,
wherein at least a part of the first horizontal portion and at least a part of the second horizontal portion are disposed between the first pixel electrode and the second pixel electrode not to overlap the first pixel electrode and the second pixel electrode in a plan view.

29. The display device of claim 28, wherein the first horizontal portion and the second horizontal portion are disposed to be spaced apart from the first pixel electrode and the second pixel electrode.

30. The display device of claim 29, wherein a first light emitting element comprising the first pixel electrode and a second light emitting element comprising the second pixel electrode provide lights of different wavelengths.

31. The display device of claim 28, further comprising:
a third data line extending in the first direction;
a third gate node connected to the third data line, and comprising a third vertical portion comprising a third gate electrode of the third driving transistor and a third horizontal portion extending from the third vertical portion; and
a third pixel electrode connected to the third driving transistor,
wherein the third horizontal portion extends in the second direction.

32. The display device of claim 31, wherein the entire third gate node overlaps the third pixel electrode.

33. The display device of claim 31, wherein at least a part of a first vertical portion of the first gate is disposed between the second pixel electrode and a third pixel electrode of another unit pixel adjacent to the second pixel electrode in the second direction.

34. The display device of claim 33, wherein a first side of the first pixel electrode and a first side of the second pixel electrode face each other, and
wherein each of the first side of the first pixel electrode and the first side of the second pixel electrode have a plurality of stepped sides.

35. The display device of claim 34, wherein a plurality of stepped sides in the first pixel electrode have widths along the first direction gradually decreasing as approaching the third pixel electrode, and
wherein a plurality of stepped sides in the second pixel electrode have width along the first direction gradually increasing as approaching the third pixel electrode.

36. The display device of claim 35, wherein at least a part of the first horizontal portion and at least a part of the second horizontal portion are disposed between the stepped sides of the first pixel electrode and the stepped sides of the second pixel electrode.

37. The display device of claim 31, further comprising:
a fourth pixel electrode disposed adjacent to the third pixel electrode in the first direction; and
a bank having a first emission area exposing at least a part of the third pixel electrode and a second emission area exposing at least a part of the fourth pixel electrode,
wherein a distance between a first emission area and a second emission area in a first column is different from a distance between a first emission area and a second emission area in a second column.

38. The display device of claim 28, further comprising a first transistor connected between the first gate and the first data line.

39. The display device of claim 38, wherein the first gate further comprises:
a second electrode positioned opposite to the first electrode of the first transistor connected to the first data line; and
a first gate connection electrode connecting the second electrode to the first gate electrode.

40. The display device of claim 39, wherein the first gate connection electrode of the first gate comprises a part of the first vertical portion and the first horizontal portion.

41. The display device of claim 40, wherein one side of the first gate connection electrode is connected to the second electrode through a first contact hole formed through an insulating layer, and
wherein the other side of the first gate connection electrode is connected to the first gate electrode through a second contact hole of the insulating layer.

42. A display device comprising:
a first gate connected to a first driving transistor and including a first horizontal portion extending along a first direction;
a second gate connected to a second driving transistor and including a second horizontal portion extending along the first direction;
a data line extending along a second direction crossing the first direction; and
a first pixel electrode and a second pixel electrode disposed adjacent to each other in the second direction,
wherein the first horizontal portion of the first gate and the second horizontal portion of the second gate are disposed between the first pixel electrode and the second pixel electrode in a plan view.

* * * * *